United States Patent
Morise et al.

(10) Patent No.: US 9,184,212 B2
(45) Date of Patent: Nov. 10, 2015

(54) SHIFT-REGISTER LIKE MAGNETIC STORAGE MEMORY AND METHOD FOR DRIVING THE SAME

(71) Applicant: KABUSHIKI KAISHA TOSHIBA, Minato-ku (JP)

(72) Inventors: Hirofumi Morise, Yokohama (JP); Yoshiaki Fukuzumi, Yokkaichi (JP); Shiho Nakamura, Fujisawa (JP); Tsuyoshi Kondo, Kawasaki (JP); Hideaki Aochi, Yokkaichi (JP); Takuya Shimada, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/341,059

(22) Filed: Jul. 25, 2014

(65) Prior Publication Data
US 2015/0036422 A1    Feb. 5, 2015

(30) Foreign Application Priority Data
Jul. 30, 2013    (JP) .................. 2013-158277

(51) Int. Cl.
*G11C 19/08* (2006.01)
*H01L 27/22* (2006.01)
*G11C 11/16* (2006.01)
*H01L 43/08* (2006.01)

(52) U.S. Cl.
CPC .......... *H01L 27/222* (2013.01); *G11C 11/1675* (2013.01); *H01L 43/08* (2013.01)

(58) Field of Classification Search
CPC .. G11C 19/0841; G11C 19/0808; G11C 5/08; G11C 11/15; G11C 11/14
USPC ........... 365/173, 171, 130, 51, 66, 225.5, 81, 365/87, 80
See application file for complete search history.

(56) References Cited

U.S. PATENT DOCUMENTS

| | | | |
|---|---|---|---|
| 6,834,005 B1 * | 12/2004 | Parkin | 365/80 |
| 7,626,844 B1 | 12/2009 | Moriya et al. | |
| 8,279,653 B2 * | 10/2012 | Tsai et al. | 365/80 |
| 8,634,237 B2 | 1/2014 | Kondo et al. | |
| 2007/0201264 A1 | 8/2007 | Shin et al. | |
| 2008/0137405 A1 | 6/2008 | Ohno et al. | |
| 2008/0239784 A1 | 10/2008 | Gaidis et al. | |
| 2008/0253161 A1 | 10/2008 | Parkin et al. | |
| 2014/0119111 A1 | 5/2014 | Nakamura et al. | |

FOREIGN PATENT DOCUMENTS

| | | |
|---|---|---|
| JP | 2013-73980 A | 4/2013 |
| JP | 2014-86640 A | 5/2014 |

* cited by examiner

*Primary Examiner* — Andrew Q Tran
(74) *Attorney, Agent, or Firm* — Oblon, McClelland, Maier & Neustadt, L.L.P.

(57) ABSTRACT

A magnetic storage element according to an embodiment includes: a magnetic nanowire having a cross-sectional area varying in a first direction, the magnetic nanowire having at least two positions where the cross-sectional area is minimal; first and second electrode groups having the magnetic nanowire interposed in between, the magnetic nanowire including at least one of a first region where the first electrodes overlap the second electrodes with the magnetic nanowire interposed in between and a second region where neither the first electrodes nor the second electrodes exist with the magnetic nanowire interposed in between, the magnetic nanowire including at least one of a third region where the first electrodes exist and the second electrodes do not exist with the magnetic nanowire interposed in between and a fourth region where the first electrodes do not exist and the second electrodes exist with the magnetic nanowire interposed in between.

15 Claims, 39 Drawing Sheets

(a)

(b)

SHIFT-REGISTER LIKE MAGNETIC STORAGE MEMORY AND METHOD FOR DRIVING THE SAME

CROSS-REFERENCE TO RELATED APPLICATION

This application is based upon and claims the benefit of priority from prior Japanese Patent Application No. 2013-158277 filed on Jul. 30, 2013 in Japan, the entire contents of which are incorporated herein by reference.

FIELD

Embodiments described herein relate generally to a magnetic storage element, a magnetic storage device, a magnetic memory, and a method of driving a magnetic storage element.

BACKGROUND

In a conventional semiconductor memory, a storage element, a select element, and an information extracting wiring are formed in each memory cell. In recent years, a memory of a shift register type has been suggested to realize a memory having a larger capacity. Such a memory is based on a concept that only storage elements are arranged at a high density, and implements a method of transferring stored information to the position of a sensor and a wiring formed in a predetermined site. With the concept and method, there is a possibility that the memory capacity can be dramatically increased. In a shift register for a memory, it is not preferable to add a function for transfer to each bit (each digit) when stored information is to be transferred. Therefore, a shift operation involving a desired number of digits needs to be performed by collectively adding a function to the entire bit string. However, it is not easy to accurately shift the information in all the digits.

DETAILED DESCRIPTION

A magnetic storage element according to an embodiment includes: a magnetic nanowire extending in a first direction, a cross-sectional area of the magnetic nanowire varying in the first direction, the cross-sectional area being perpendicular to the first direction, the magnetic nanowire having at least two positions where the cross-sectional area is minimal; first and second electrode groups having the magnetic nanowire interposed in between, the first electrode group including a plurality of first electrodes arranged at intervals in the first direction, the second electrode group including a plurality of second electrodes arranged at intervals in the first direction, the magnetic nanowire including at least one of a first region where the first electrodes overlap the second electrodes with the magnetic nanowire interposed in between and a second region where neither the first electrodes nor the second electrodes exist with the magnetic nanowire interposed in between, the magnetic nanowire including at least one of a third region where the first electrodes exist and the second electrodes do not exist with the magnetic nanowire interposed in between and a fourth region where the first electrodes do not exist and the second electrodes exist with the magnetic nanowire interposed in between;

a first insulating film located between the first electrodes and the magnetic nanowire; and a second insulating film located between the second electrodes and the magnetic nanowire.

The following is a description of embodiments of the present invention, with reference to the accompanying drawings.

First Embodiment

Figure 1:
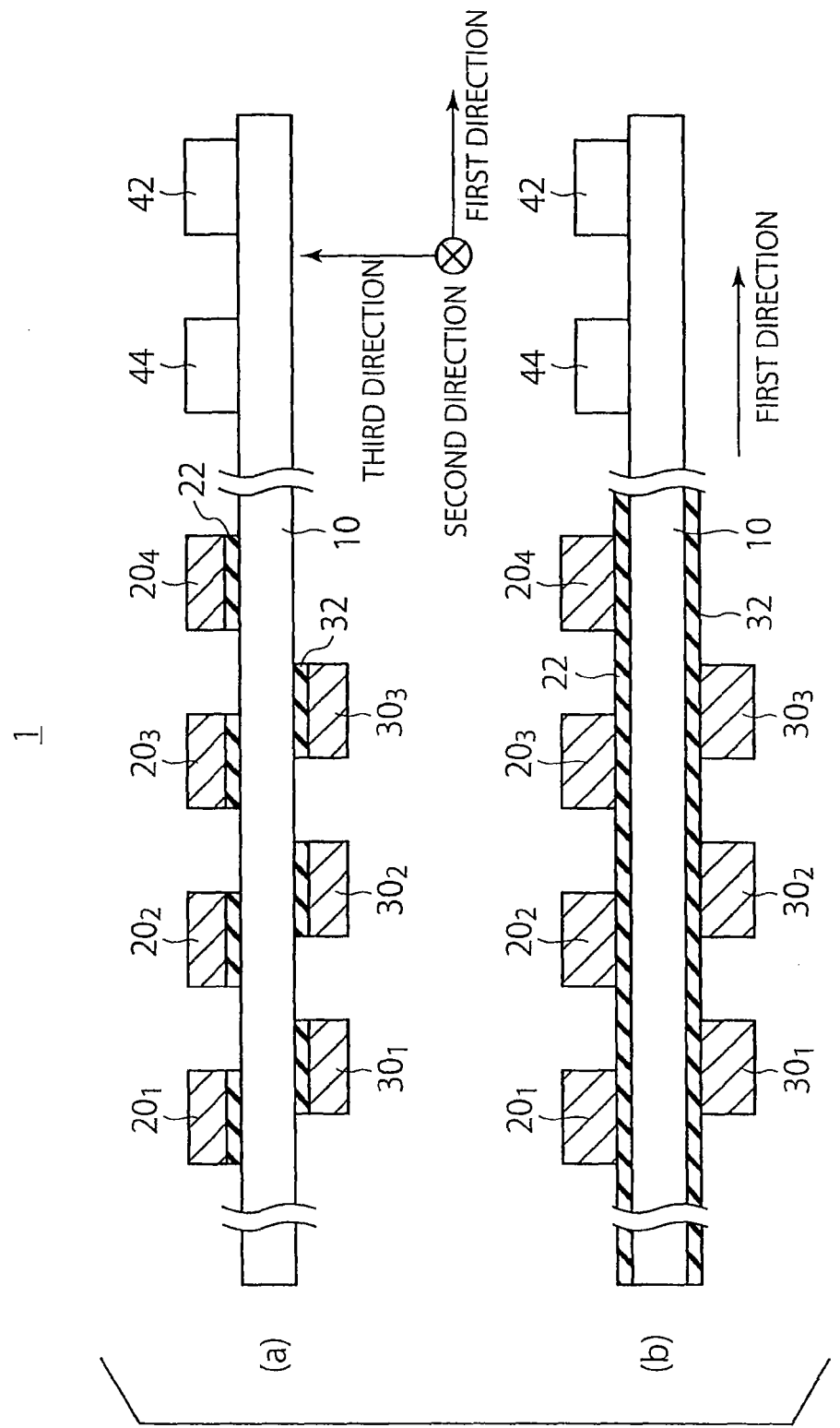
FIGS. 1(*a*) and 1(*b*) are cross-sectional views of magnetic storage elements according to a first embodiment and a modification of the first embodiment.

FIG. 1(a) shows a magnetic storage element according to a first embodiment. The magnetic storage element 1 according to the first embodiment includes a magnetic nanowire 10, first electrodes $20_i$ (i=1, . . . ), second electrodes $30_i$ (i=1, . . . ), a read unit 44, and a write unit 42.

In this specification, the magnetic nanowire 10 means a magnetic film in which the size (length) in the extending direction (a first direction) is ten or more times larger than the size (width) in a second direction perpendicular to the first direction and the size (thickness) in a third direction perpendicular to the first and second directions.

FIG. 1(a) is a cross-sectional view of the magnetic storage element 1 according to the first embodiment, taken along a plane extending in the first direction. A cross-section of the magnetic nanowire 10 taken along a plane perpendicular to the first direction has a rectangular shape, for example. The size (the width and the thickness) of the cross-section is preferably within the range of 2 nm to 100 nm, so as not to cause a distribution in the magnetization direction in the cross-section. The first electrodes $20_i$ (i=1, . . . ) and the second electrodes $30_i$ (i=1, . . . ) are arranged in the first direction of the magnetic nanowire 10. The first electrodes $20_i$ (i=1, . . . ) and the second electrodes $30_i$ (i=1, . . . ) are arranged so that the magnetic nanowire 10 is interposed in between in the third direction. An insulating film 22 is provided between each of the first electrodes $20_i$ (i=1, . . . ) and the magnetic nanowire 10, and an insulating film 32 is provided between each of the second electrodes $30_i$ (i=1, . . . ) and the magnetic nanowire 10. As in a magnetic storage element shown in FIG. 1(b) as a modification of the first embodiment, an insulating film 22 may also be provided between each two adjacent first electrodes $20_i$ and $20_{i+1}$ on the magnetic nanowire 10 on the side having the first electrodes $20_i$ (i=1, . . . ) provided thereon. Likewise, an insulating film 32 may also be provided between each two adjacent second electrodes $30_i$ and $30_{i+1}$ on the magnetic nanowire 10 on the side having the second electrodes $30_i$ (i=1, . . . ) provided thereon.

Figure 2:
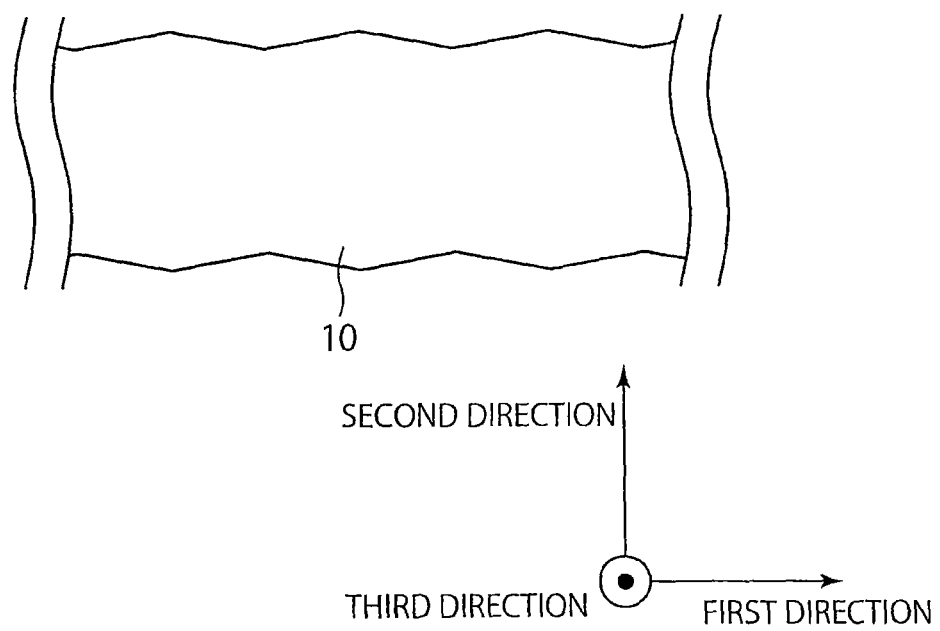
FIG. 2 is a top view for explaining the shape of the magnetic nanowire according to the first embodiment.
Figure 3:
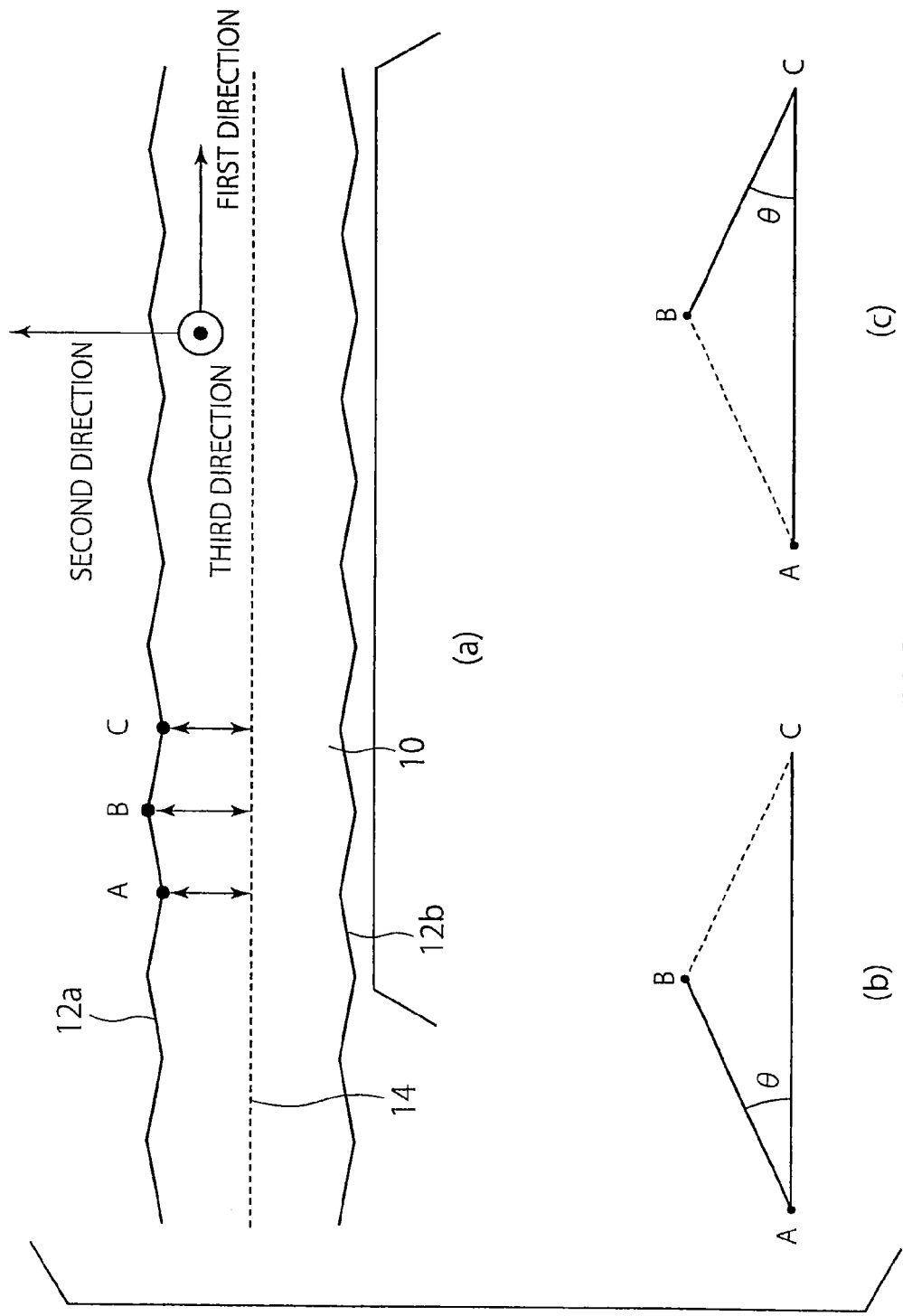
FIGS. 3(*a*) through 3(*c*) are diagrams for explaining the shape of the magnetic nanowire.

The magnetic nanowire 10 is grounded, or is connected to an electrode (not shown). FIG. 2 shows part of a cross-section of the magnetic nanowire 10, taken along a plane perpendicular to the third direction. As can be seen from FIG. 2, the width of the magnetic nanowire 10, or the length in the second direction, varies with positions in the first direction.

Referring now to FIGS. 3(a) through 4(c), the shape of the magnetic nanowire 10 is described in greater detail.

FIG. 3(a) is a cross-sectional view of the magnetic nanowire 10 taken along a plane perpendicular to the third direction, showing a cross-section of the portion having the first and second electrodes formed thereon or a cross-section in the width direction. As can be seen from FIG. 3(a), the lines indicating the width of the magnetic nanowire 10, or visible outlines 12a and 12b, vary in the first direction (the extending direction).

To describe the shapes of those visible outlines 12a and 12b in detail, a straight line 14 that is located in the magnetic nanowire 10 and is parallel to the first direction is virtually set. The visible outline that is located on one side (the upper side in the drawing) of the straight line 14 is the visible outline 12a, and the visible outline located on the other side (the lower side in the drawing) is the visible outline 12b.

The minimal points that are relative to distances from the straight line 14 to the visible outline 12a and are adjacent to each other on the visible outline 12a are set as minimal points A and C. The point that is between the minimal points A and C, is on the visible outline 12a, and is at the longest distance from the straight line 14 is selected as a minimal point B. In that case, the visible outline 12a has such a shape that one angle θ of an angle BAC and an angle BCA is not smaller than four degrees and not larger than 30 degrees, as shown in FIG. 3(b) or 3(c). The points A, B, and C serve as the reference points for determining the shape of the visible outline 12a.

Likewise, as shown in FIG. 4(a), the minimal points that are relative to distances from the straight line 14 to the visible outline 12b and are adjacent to each other on the visible outline 12b are set as minimal points A' and C'. The point that is between the minimal points A' and C', is on the visible outline 12b, and is at the longest distance from the straight line 14 is selected as a minimal point B'. In that case, the visible outline 12b has such a shape that one angle θ of an angle B'A'C' and an angle B'C'A' is not smaller than four degrees and not larger than 30 degrees, as shown in FIG. 4(b) or 4(c). The points A', B', and C' serve as the reference points for determining the shape of the visible outline 12b.

The reason that there is a lower limit on the angle BAC, the angle BCA, the angle B'A'C', and the angle B'C'A' is described below. According to a later described domain wall moving method, a domain wall position can be moved by applying a voltage signal to the first electrodes and the second electrodes, but the position of the domain wall immediately after the supply of the voltage signal is cut off might vary. However, where the angle BAC, the angle BCA, the angle B'A'C', and the angle B'C'A' are not smaller than four degrees, a sufficient spatial gradient is caused in the potential energy of the domain wall, and the domain wall position is automatically adjusted to the minimal point A of the nanowire width, for example.

Figure 36:
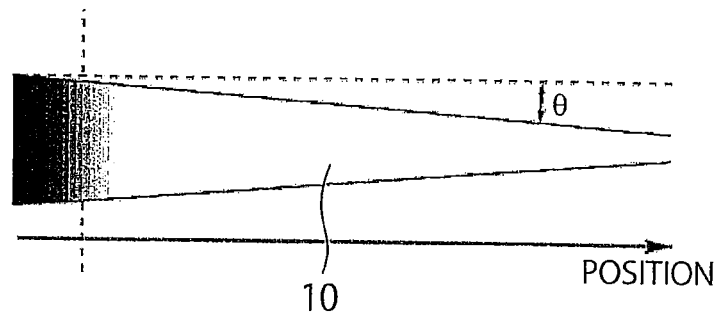
FIG. 36 is a diagram showing the shape of the magnetic nanowire used in a simulation.
Figure 37:
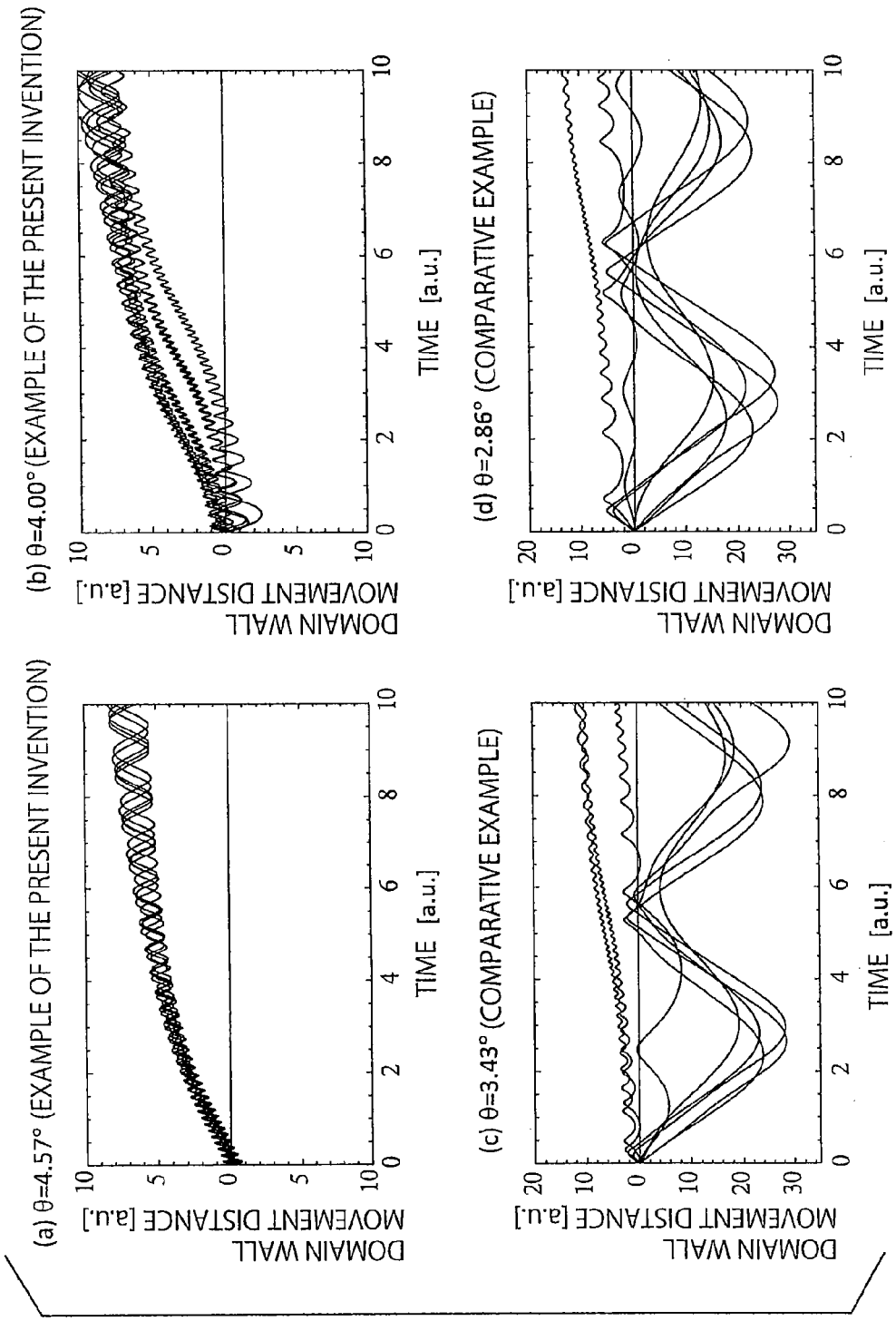
FIGS. 37(*a*) through 37(*d*) are diagrams showing simulation results.

Referring now to FIGS. 36 through 37(d), the results of a simulation about the above fact are described. This simulation was performed with micromagnetics to determine how the position of a domain wall located in the middle of a gradient in the magnetic nanowire 10 having the gradient in its nanowire width shown in FIG. 36 changes in a situation that is not affected by any external factor. As can be seen from the results of the simulation, when the gradient angle θ is not smaller than four degrees, the domain wall position moves in one direction, regardless of the initial conditions, as shown in FIGS. 37(*a*) through 37(*d*). This is the reason that the lower limit angle is four degrees.

Figure 40:
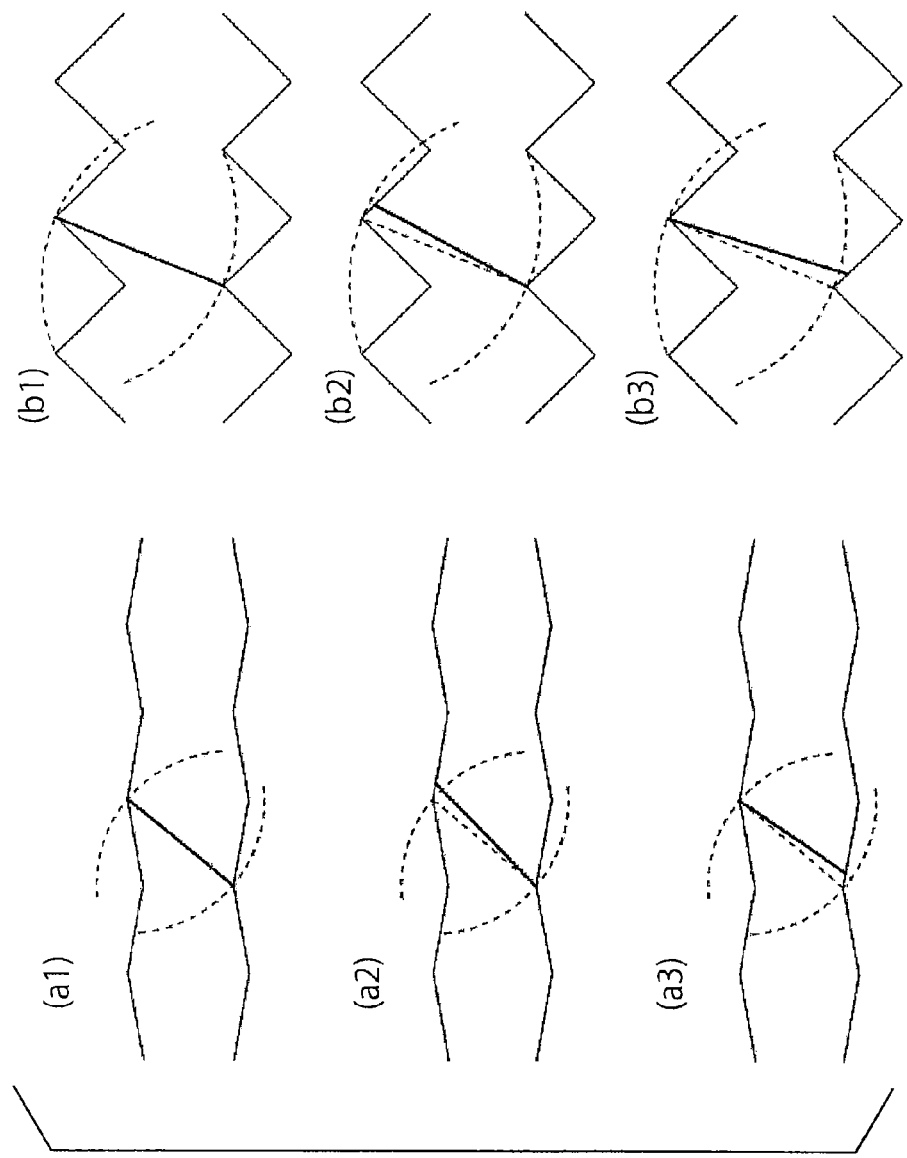
FIGS. 40(*a*1) through 40(*b*3) are diagrams for explaining the shapes of the visible outlines of magnetic nanowires.

Meanwhile, there is also an upper limit on the angle BAC, the angle BCA, the angle B'A'C', and the angle B'C'A'. FIGS. 40(*a*1) through 40(*b*3) show three types of magnetic nanowires with different angles. FIGS. 40(*a*1), 40(*a*2), and 40(*a*3) show cases where the angle is not larger than 30 degrees, and FIGS. 40(*b*1), 40(*b*2), and 40(*b*3) show cases where the angle is larger than 30 degrees. The heavy lines indicate the positions of the domain walls, and the dashed and curved lines indicate the circular arcs each having a radius indicated by the heavy line shown in FIG. 40(*a*1) or 40(*b*1). In a case where a domain wall is moved by the later described method, the position of the domain wall is located in the position indicated by the heavy line shown in FIG. 40(*a*1) in the nanowire having an angle not larger than 30 at a certain time, for example. If the domain wall is moved rightward after that, the position of the domain wall might be as shown in FIG. 40(*a*2) or 40(*a*3). In FIG. 40(*a*2), however, one end of the domain wall is outside the circular arc indicated by the dashed line, and the area of the domain wall surface increases accordingly. Therefore, there is a low possibility that the domain wall is located in the position shown in FIG. 40(*a*2). That is, the domain wall is located in the position shown in FIG. 40(*a*3). This implies that there is a high possibility that, even if the domain wall in the nanowire shown in FIG. 40(*a*1) deviates from a direction perpendicular to the first direction, the angle is corrected during movement. That is, as long as the angle of the visible outlines of the magnetic nanowire is not larger than 30 degrees, the domain wall hardly has an angle variation in the nanowire, and stable movement can be performed in a desirable manner.

In another case where a domain wall is moved, the position of the domain wall is located in the position indicated by the heavy line shown in FIG. 40(*b*1) in the nanowire having a larger angle than 30 degrees at a certain time, for example. When the domain wall is moved rightward after that, the position of the domain wall might be located in the position shown in FIG. 40(*b*2) or 40(*b*3). However, the area of the domain wall surface in FIG. 40(*b*3) increases, and therefore, there is a low possibility that the domain wall is located in the position shown in FIG. 40(*b*3). That is, the position of the domain wall is located in the position shown in FIG. 40(*b*2). This implies that there is a high possibility in the nanowire shown in FIG. 40(*b*1) that, even if the domain wall deviates from a direction perpendicular to the first direction, the angle is not corrected during movement, and the gradient becomes even larger. That is, in a case where the angle of the visible outlines of the magnetic nanowire exceeds 30 degrees, the domain wall easily has an angle variation in the nanowire, and the movement is likely to be unstable.

The magnetic nanowire 10 has more than one magnetic domain with respect to the bit data stored in the magnetic storage element 1. The easy axis of magnetization of the magnetic nanowire 10 is a direction perpendicular to the first direction, which is the second direction or the third direction. In each of the magnetic domains, the direction in which magnetization is stabilized is the positive direction or the negative direction of the easy axis of magnetization. In the vicinity of the boundary of two adjacent magnetic domains, the magnetization direction continuously changes in the first direction. The region in which the magnetization direction changes is called a domain wall.

The domain wall has a finite length (a length in the first direction) $L_{dw}$ that is determined by the anisotropy energy Ku and the exchange stiffness A of the magnetic material. The length $L_{dw}$ of the domain wall (also referred to as the domain wall width) is theoretically determined according to the following equation: $L_{dw}=2(A/Ku)^{1/2}$. For example, where A=1 μerg/cm, and Ku=$10^7$ erg/cm$^3$, $L_{dw}$=6 nm.

In the magnetic storage element 1 of the first embodiment, bit data is stored as magnetization directions that appear in the first direction in the magnetic nanowire 10. Typically, the length $L_b$ of one bit in the first direction (hereinafter referred to as the bit length) is 6 nm to 200 nm. This bit length $L_b$ is preferably two or more times greater than the length $L_{dw}$ of a domain wall. More preferably, the bit length $L_b$ is set at a length that is not smaller than 15 nm and not greater than 100 nm. With this arrangement, thermal instability of magnetic domains between adjacent domain walls due to an interaction between the adjacent domain walls can be reduced. Also, each domain wall is located in a position where the width of the magnetic nanowire 10 is minimal. With this arrangement, the domain wall is pinned in the position where the nanowire width is minimal, and unintended movement of the domain wall can be prevented when no current is applied. For example, 1-bit data can be stored in the region extending from a position $x_1$ in which the width of the magnetic nanowire 10 is minimal to an adjacent position $x_2$ in which the width of the magnetic nanowire 10 is minimal. In this case, the distance from $x_1$ to $x_2$ is represented by $L_p$.

More than one minimal point of the width of the magnetic nanowire 10 may be included in the region of 1-bit length.

Figure 4:
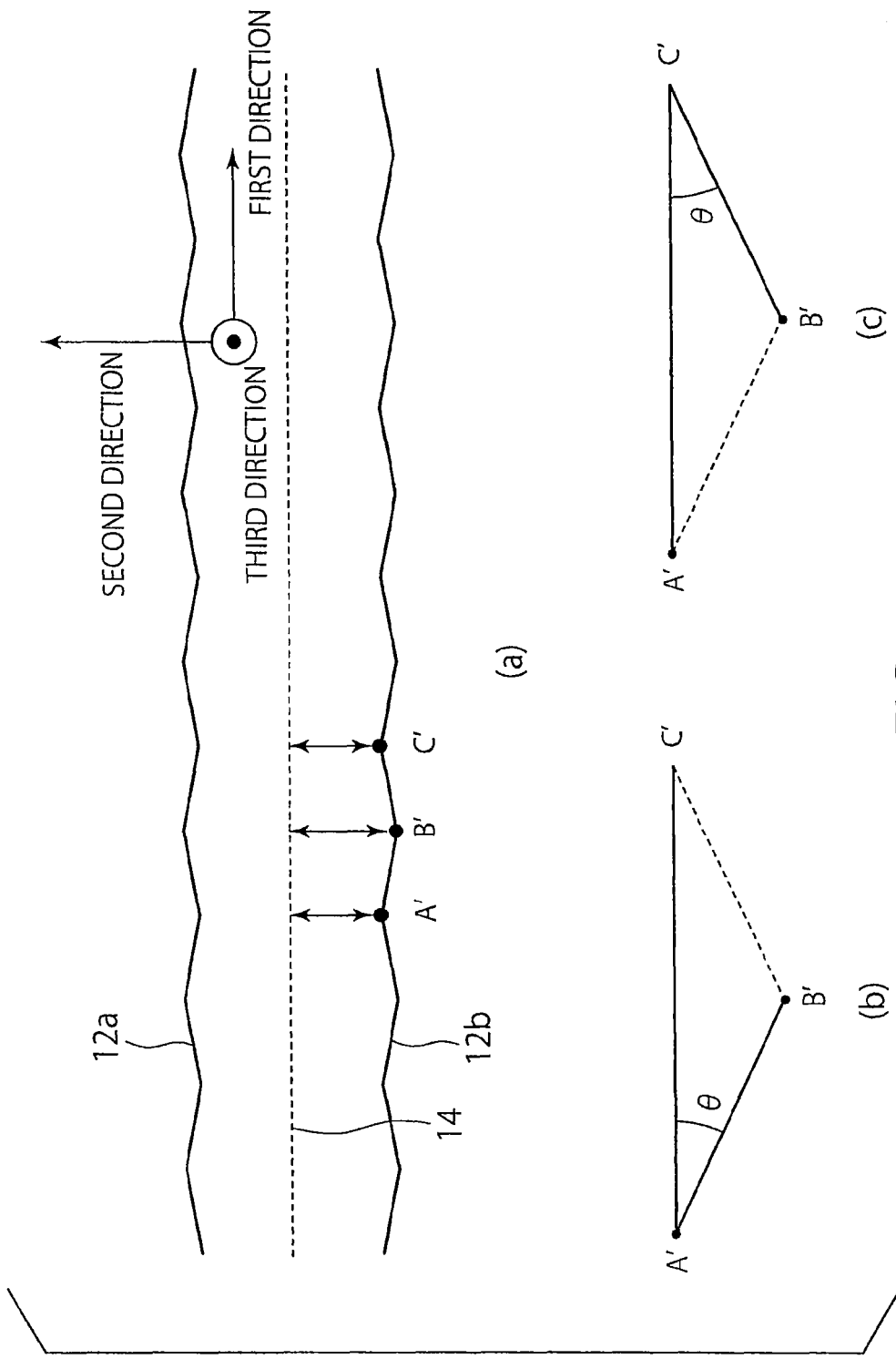
FIGS. 4(*a*) through 4(*c*) are diagrams for explaining the shape of the magnetic nanowire.

FIGS. 1 through 4(*a*) and the drawings after FIG. 4(*a*) show only a few changes in the width of the magnetic nanowire. In reality, however, the width of the magnetic nanowire 10 varies over a much longer region so that data of 100 to several thousands of bits can be stored. As the total length of the magnetic nanowire 10 is made longer, data of a larger number of bits can be stored. However, if the total length of the magnetic nanowire 10 is extremely long, the electrical resistance of the entire magnetic nanowire 10 becomes high. Therefore, the total length of the magnetic nanowire 10 is preferably in the typical range of 100 nm to 10 μm.

Figure 5:
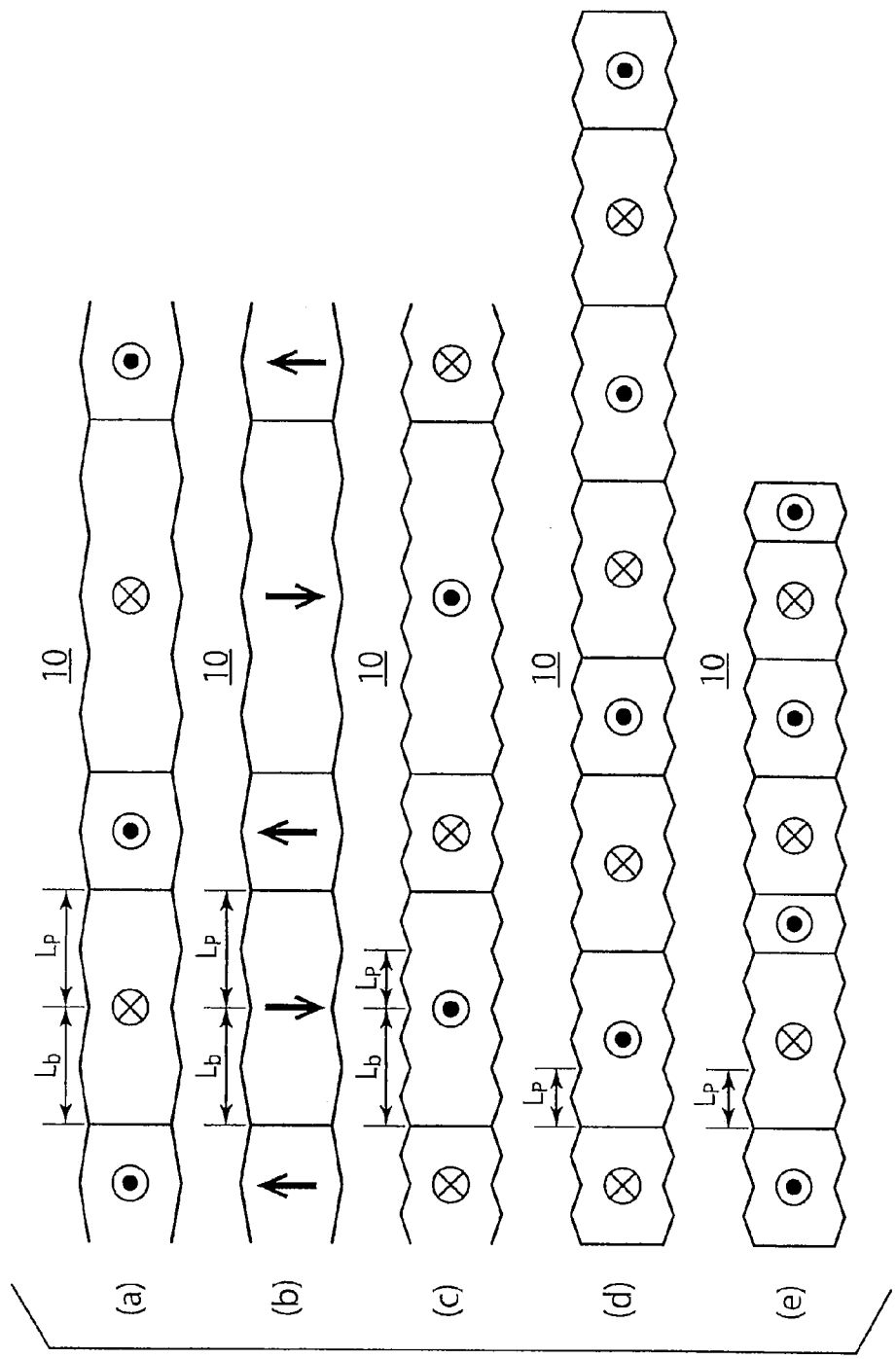
FIGS. 5(*a*) through 5(*e*) are diagrams for explaining the shape of the magnetic nanowire.

FIGS. 5(*a*) through 5(*c*) show examples of storage of the 8-bit data "01101110". As shown in FIG. 5(*a*), the 8-bit data can be stored as magnetization directions of magnetic domains in the magnetic nanowire 10 in which the easy axis of magnetization is the third direction. As shown in FIG. 5(*b*), the easy axis of magnetization may be the second direction. In the examples shown in FIGS. 5(*a*) and 5(*b*), the minimal value of $L_b$ is equal to $L_p$. However, $L_b$ may be larger than $L_p$, as shown in FIG. 5(*c*). In this case, a position in which the width of the magnetic nanowire 10 is minimal is included in a 1-bit magnetic domain (not including a boundary).

The bit length of one bit is not necessarily the same as the bit lengths of the other bits. For example, bits in which $L_b=2L_p$ and bits in which $L_b=3L_p$ coexist in the example shown in FIG. 5(*d*). If data is stored so that $L_b$ becomes equal to or larger than $2L_p$ as in the example shown in FIG. 5(*d*), the total length can be shortened while the distance between two adjacent domain walls is prevented from becoming shorter. Accordingly, a higher density can be easily achieved in a desirable manner. Also, in a case where $L_b$ becomes equal to or larger than $2L_p$ only with respect to the bits stored as magnetic domains having a specific magnetization direction with respect to the easy axis of magnetization in at least part of the magnetic nanowire 10 as shown in FIG. 5(*e*), a higher density is easily achieved in a desirable manner.

Figure 6:
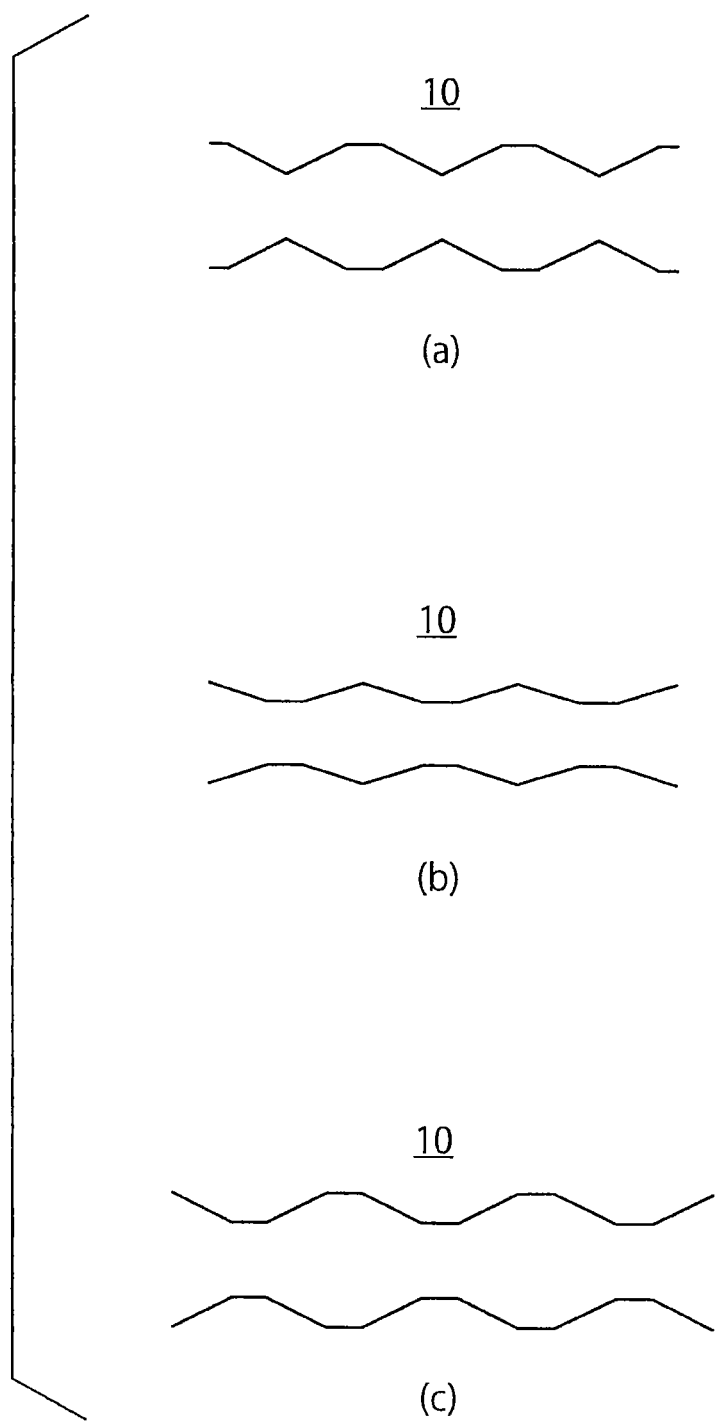
FIGS. 6(*a*) through 6(*c*) are diagrams for explaining the shape of the magnetic nanowire.

As shown in FIGS. 6(*a*) through 6(*c*), the shape of the magnetic nanowire 10 may include (flat) regions that have a constant nanowire width in the vicinities of the maximal points and/or the minimal points relative to the width of the magnetic nanowire 10. In the following, each region that has a constant nanowire width in the vicinity of a maximal point or a minimal point will be referred to as a maximal region or a minimal region.

Figure 7:
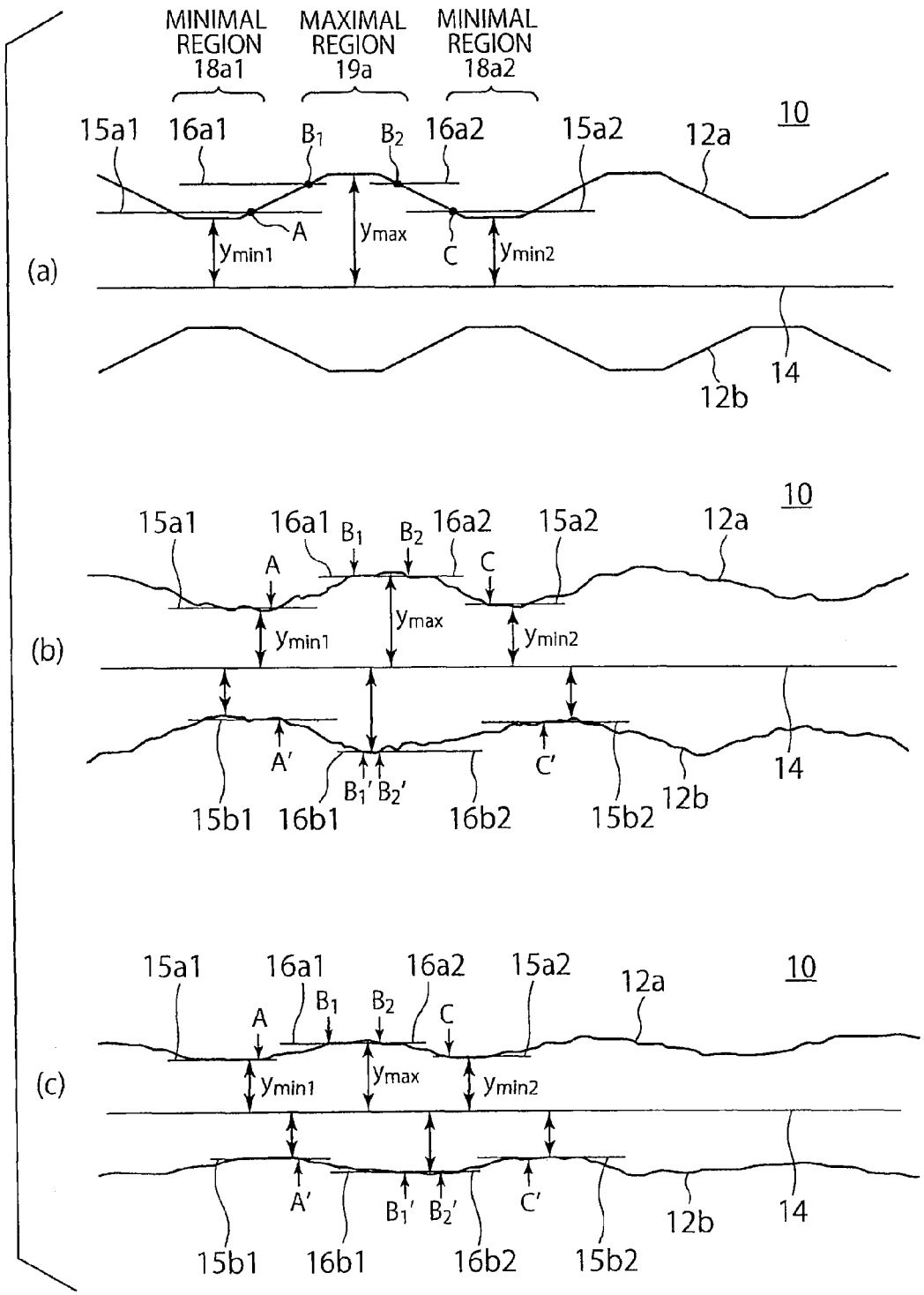
FIGS. 7(*a*) through 7(*c*) are diagrams for explaining the setting of reference points on the visible outlines of the magnetic nanowire.

Referring now to FIGS. 7(a) through 7(c), setting of the points A, B, and C on a visible outline in a case where maximal regions or minimal regions exist is described. As shown in FIG. 7(a), in a range that includes two minimal regions 18a1 and 18a2 and a maximal region 19a interposed between the two minimal regions 18a1 and 18a2, a minimal value, a maximal value, and another minimal value of the distance from the visible outline 12a to the straight line 14 are represented by $y_{min1}$, $y_{max}$, and $y_{min2}$, respectively. Of the intersection points between the visible outline 12a and a straight line 15a1 located at a distance of "$0.9y_{min1}+0.1y_{max}$" from the straight line 14, the point closest to the maximal region 19a is set as A. Of the intersection points between the visible outline 12a and a straight line 15a2 located at a distance of "$0.9y_{min2}+0.1y_{max}$" from the straight line 14, the point closest to the maximal region 19a is set as C. Of the intersection points between the visible outline 12a and a straight line 16a1 located at a distance of "$0.1y_{min1}+0.9y_{max}$" from the straight line 14, the point closest to the point A is set as $B_1$. Of the intersection points between the visible outline 12a and a straight line 16a2 located at a distance of "$0.1y_{min2}+0.9y_{max}$" from the straight line 14, the point closest to the point C is set as $B_2$. In this case, the magnetic nanowire 10 has such a shape that at least one of the angle $B_1AC$ and the angle $B_2CA$ is not smaller than four degrees and not larger than 30 degrees.

As shown in FIG. 7(b), the points A', $B_1$', $B_2$', and C' on the visible outline 12b are defined in the same manner as above. As shown in FIG. 7(c), the point A and the point A' may not exist in the same position in the first direction. The same applies to the point $B_1$ and the point $B_1$', the point $B_2$ and the point $B_2$', and the point C and the point C'. Also, as shown in FIGS. 7(b) and 7(c), yet another minimal point or maximal point may exist between the minimal point A and the maximal point $B_1$ and between the minimal point C and the maximal point $B_2$ on the visible outline 12a. The same applies to the visible outline 12b.

Figure 8:
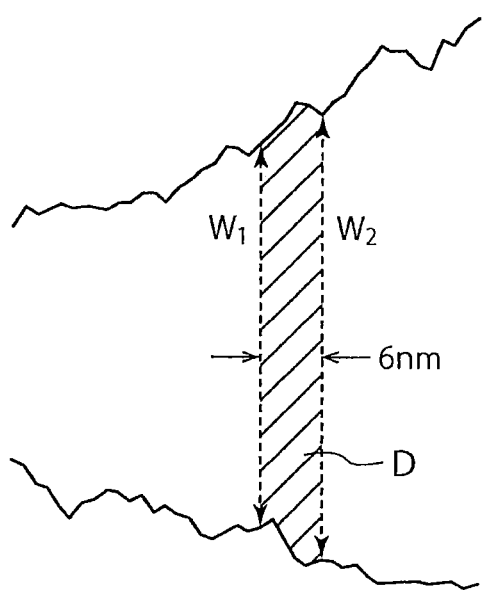
FIG. 8 is a diagram for explaining a nanowire width change rate.

As described above, the visible outlines of the magnetic nanowire 10 have an angle not smaller than four degrees and not larger than 30 degrees as the mean value of the values obtained by connecting end points between the minimal regions and the maximal regions. However, the visible outlines may locally have an angle outside this range. Specifically, since the length $L_{dw}$ of a typical domain wall is 6 nm, an unintended domain wall pinning site is not formed even when the nanowire width of the magnetic nanowire 10 varies in a region having a length of 6 nm in the first direction between a minimal region and a maximal region. With such a change in shape, a cause of unintended domain wall pinning that might occur in a specific position can be eliminated, and accordingly, collective movement of the domain walls can be facilitated in a desirable manner. Example causes of unintended domain wall pinning include discontinuous change in magnetic physical properties such as anisotropy energy in the magnetic grain boundaries in the magnetic nanowire 10. When there is a portion having a nanowire width change rate of 10% or higher in a region that exists between a minimal region and a maximal region and has a length of 6 nm in the first direction in the magnetic nanowire 10, unintended domain wall pinning due to a 10% change in anisotropy energy can be avoided. Here, the nanowire width change rate in a region D is the ratio "$2|W_1-W_2|/(W_1+W_2)$" of the difference $|W_1-W_2|$ between a value $W_1$ of the nanowire width at one end of the region D and a value $W_2$ at the other end to the mean value "$(W_1+W_2)/2$". For example, in the example shown in FIG. 8, the nanowire width at one end of the region D having the length of 6 nm is 32.8 nm, the nanowire width at the other end is 37.9 nm, and the nanowire width change rate is 14%. However, if the amount of change $|W_1-W_2|$ in the nanowire width in the region D is too large, pinning is caused. Therefore, the amount of change $|W_1-W_2|$ is preferably not larger than 10 nm.

Figure 9:
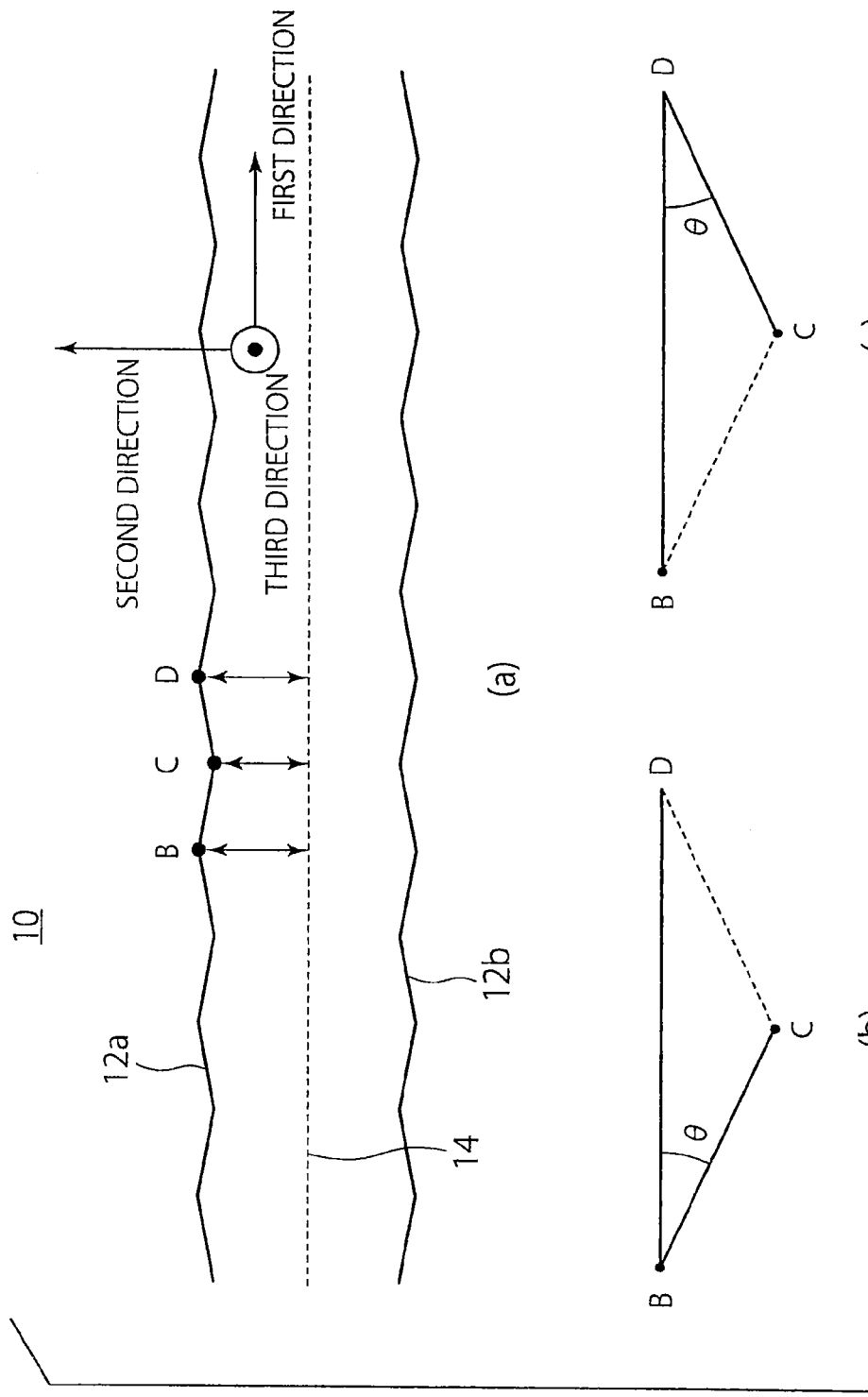
FIGS. 9(*a*) through 9(*c*) are diagrams for explaining the shape of the magnetic nanowire.

Instead of the reference points A, B, and C on the visible outline 12a shown in FIG. 3(a), reference points B, C, and D may be set as shown in FIG. 9(a). In this example, maximal points that are relative to the distance from the straight line 14 to the visible outline 12a and are adjacent to each other on the visible outline 12a are set as the maximal points B and D. The point that is between the maximal points B and D, is on the visible outline 12a, and is at the shortest distance from the straight line 14 is selected as the minimal point C. In this case, the visible outline 12a has such a shape that one of the angle CBD and the angle CDB is not smaller than four degrees and not larger than 30 degrees, as shown in FIG. 9(b) or 9(c). The points B, C, and D serve as the reference points for determining the shape of the visible outline 12a.

Figure 10:
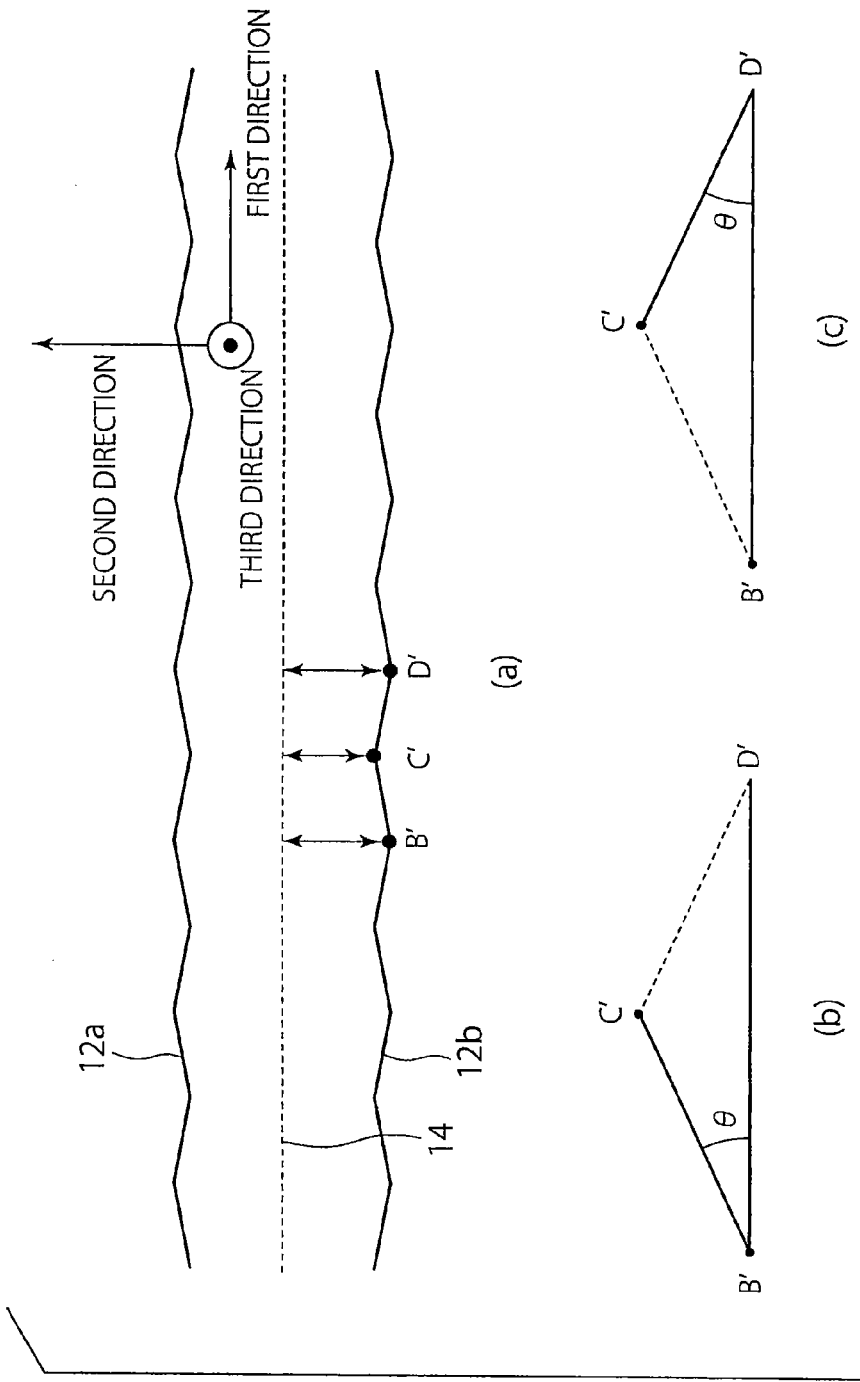
FIGS. 10(*a*) through 10(*c*) are diagrams for explaining the shape of the magnetic nanowire.

Likewise, instead of the reference points A', B', and C' on the visible outline 12b shown in FIG. 4(a), reference points B', C', and D' may be set as shown in FIG. 10(a). In this example, maximal points that are relative to the distance from the straight line 14 to the visible outline 12b and are adjacent to each other on the visible outline 12b are set as the maximal points B' and D'. The point that is between the maximal points B' and D', is on the visible outline 12b, and is at the shortest distance from the straight line 14 is selected as the minimal point C'. In this case, the visible outline 12b has such a shape that one of the angle C'B'D' and the angle C'D'B' is not smaller than four degrees and not larger than 30 degrees, as shown in FIG. 10(b) or 10(c). The points B', C', and D' serve as the reference points for determining the shape of the visible outline 12b.

Figure 11:
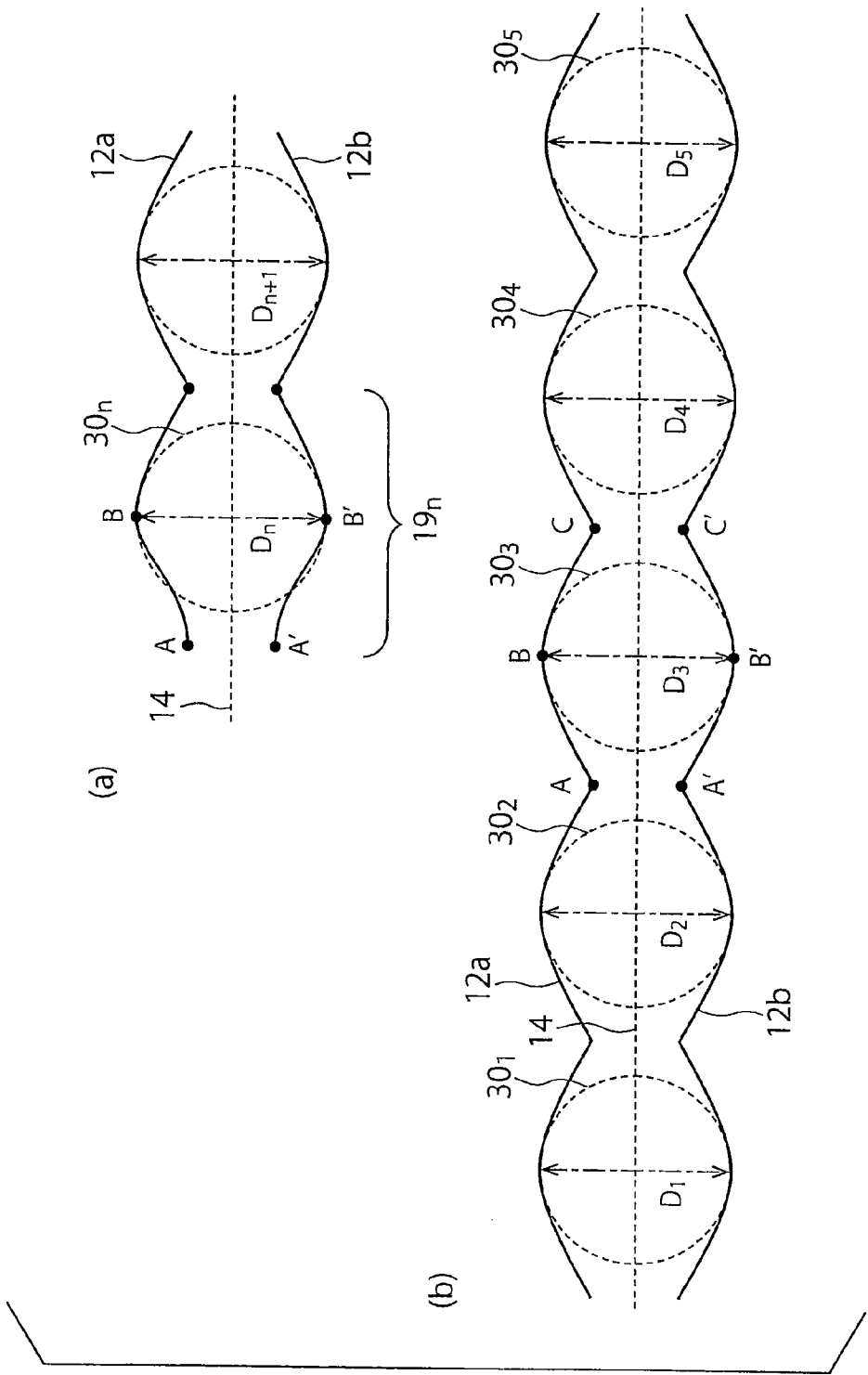
FIGS. 11(*a*) and 11(*b*) are diagrams for explaining the shapes of more preferable magnetic nanowires.

As described so far, in each of the visible outlines 12a and 12b of the magnetic nanowire 10, the angle between the straight line connecting a minimal point to another minimal point and the straight line connecting the minimal point to the corresponding maximal point is not smaller than four degrees and not larger than 30 degrees. Furthermore, at least one of the outlines 12a and 12b preferably includes a point that is located on or outside the circumference of a circle having a diameter that is the line segment connecting a first maximal point and a second maximal point existing in the second direction from the first maximal point. In FIG. 11(a), the angles between the maximal points and the minimal points on the two outlines 12a and 12b are not smaller than four degrees and not larger than 30 degrees. Furthermore, in the region $19_n$ surrounded by a first minimal point A, a first maximal point B, a second minimal point A', and a second maximal point B', the first visible outline and the second visible outline include points that are located on or outside the circumference (indicated by a dashed line) of a circle $30_n$ having a diameter $D_n$ that is the line segment connecting the first maximal point B and the second maximal point B'. Part of the visible outlines 12a and 12b may be located inside the circle $30_n$. In that case, however, points that are located on the visible outlines 12a and 12b and are symmetrical about the center of the circle $30_n$ are preferably located outside the circle $30_n$. With this arrangement, domain walls can be easily moved while being maintained perpendicularly to the first direction, and accurate shifts are effectively performed. FIG. 11(b) shows a magnetic nanowire having five pairs of maximal points. Each of the visible outlines 12a and 12b is located on or outside the outer circumference of circles $30_i$ (i=1, ...) formed with the respective maximal points. This arrangement is more preferable in performing shifts. The diameters $D_n$ of the circles $30_i$ (i=1, ...) may differ from one region to another.

Figure 12:
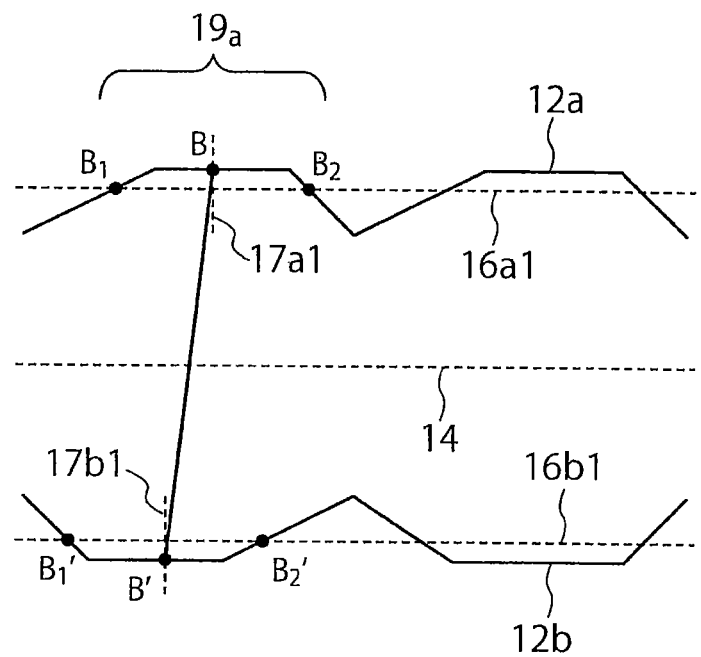
FIG. 12 is a diagram for explaining the setting of maximal points in the magnetic nanowire.

Referring to FIG. 12, setting of the first maximal point B and the second maximal point B' in a case where there is a (flat) maximal region 19a having a substantially constant nanowire width in the magnetic nanowire is described. First, a point $B_1$ and a point $B_2$ are determined in the same manner as in FIGS. 7(a) through 7(c). A straight line 17a1 that passes through the midpoint between the point $B_1$ and the point $B_2$ and is almost perpendicular to the straight line 14 is drawn, and the intersection point between the straight line 17a1 and the visible outline 12a is set as the first maximal point B. The second maximal point B' is set in the same manner. Specifically, a straight line 17b1 that passes through the midpoint between the point $B_1'$ and the point $B_2'$ and is almost perpendicular to the straight line 14 is drawn, and the intersection point between the straight line 17b1 and the visible outline 12b is set as the second maximal point B'.

(Writing and Reading)

Figure 13:
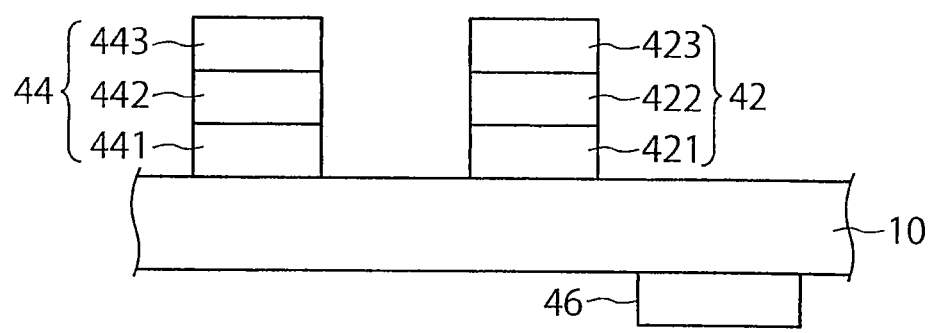
FIG. 13 is a cross-sectional view of the write unit and the read unit.

As shown in FIG. 13, the write unit 42 includes a nonmagnetic layer 421, a ferromagnetic layer 422, and an electrode 423, and is connected to the magnetic nanowire 10. A signal source (not shown) is connected to the electrode 423. At the time of writing, a potential is applied from the signal source to the electrode 423. As a result, a flow of spin-polarized electrons in the magnetization direction of the ferromagnetic layer 422 flows when electrons flow from the electrode 423 toward the magnetic nanowire 10. This flow of spin-polarized electrons changes the magnetization direction of the magnetic nanowire 10.

The read unit 44 includes a nonmagnetic layer 441, a ferromagnetic layer 442, and an electrode 443, and is connected to the magnetic nanowire 10. In a case where the magnetization direction of the magnetic domain in contact with the read unit 44 of the magnetic nanowire 10 is the same as (parallel to) the magnetization direction of the ferromagnetic layer 442, the state between the electrode 443 and an electrode 46 is a high-resistance state. In a case where the magnetization direction of the magnetic domain in contact with the read unit 44 of the magnetic nanowire 10 is the reverse of (antiparallel to) the magnetization direction of the ferromagnetic layer 442, the state between the electrode 443 and the electrode 46 is a low-resistance state. Accordingly, recorded information can be read by sensing the change in resistance.

In the magnetic storage element 1, domain walls can be moved by the later described domain wall moving method, without a change in the sequence of bit data stored in the magnetic nanowire 10. Accordingly, prior to writing or reading, domain wall positions are moved beforehand over a necessary distance. In this manner, writing and reading can be performed on a desired bit data position.

The domain wall moving method by which domain walls in the magnetic nanowire 10 of the magnetic storage element 1 having the above described structure are moved over an intended distance in the first direction is now described.

Figure 14:
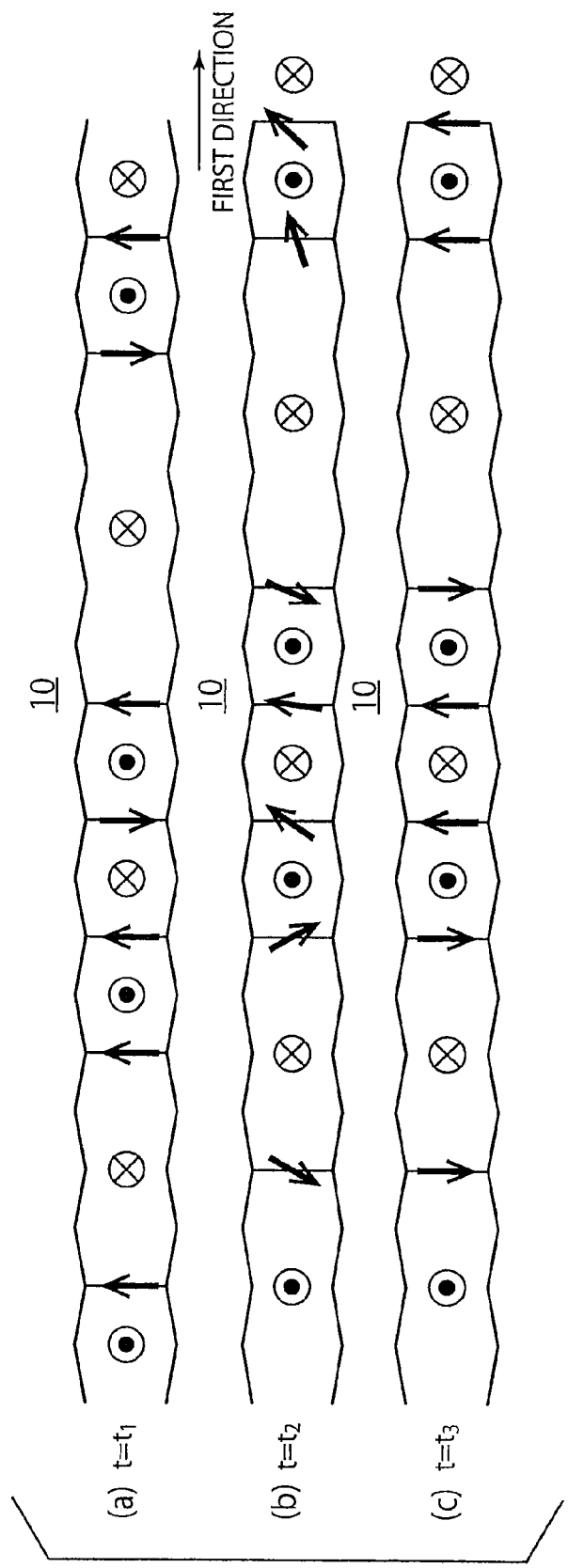
FIGS. 14(*a*) through 14(*c*) are diagrams showing changes in magnetization in domain walls when the domain walls are moving.

This domain wall moving method includes step 1 of applying a common voltage $V_1$ to the first electrodes $20_i$ (i=1, ...), and step 2 of applying a common voltage $V_2$ to the second electrodes $30_i$ (i=1, ...). FIGS. 14(a) through 14(c) schematically show changes in the magnetization distribution that is caused in the magnetic nanowire 10 by this method.

FIG. 14(a) shows the magnetization direction distribution in some regions in the magnetic nanowire 10 when any voltage is not applied (time $t=t_1$) prior to implementation of the domain wall moving method. In this example, the easy axis of magnetization is a direction perpendicular to the sheet of the drawing, and the magnetization direction in each magnetic domain is the direction that is perpendicular to the sheet and extends to the front side, or the direction that extends to the back side. At this point, the domain walls are located near the positions in which the nanowire width is minimal. This is because most of the energy of the domain walls in the magnetic nanowire 10 made of a perpendicular magnetization material originates from magnetic anisotropy, and therefore, energy stabilization is achieved when the domain walls have small volumes. The magnetization direction at the center of each domain wall is perpendicular to the easy axis of magnetization, and is one of the directions in the sheet of the drawing in this example. In the example shown in FIG. 14(a), Bloch domain walls magnetized in directions perpendicular to the first direction are stabilized.

FIG. 14(b) shows the magnetization distribution at a time when domain walls are being moved (time $t=t_2$). The magnetization directions at the centers of the respective domain walls at this point are random directions. FIG. 14(c) shows the magnetization distribution after the domain wall moving method is implemented (time $t=t_3$). The domain walls are again located near the positions in which the nanowire width is minimal. The magnetization directions at the centers of the domain walls return to those of Bloch domain walls.

(Example of the Stabilized State of Neel Domain Walls)

Figure 15:
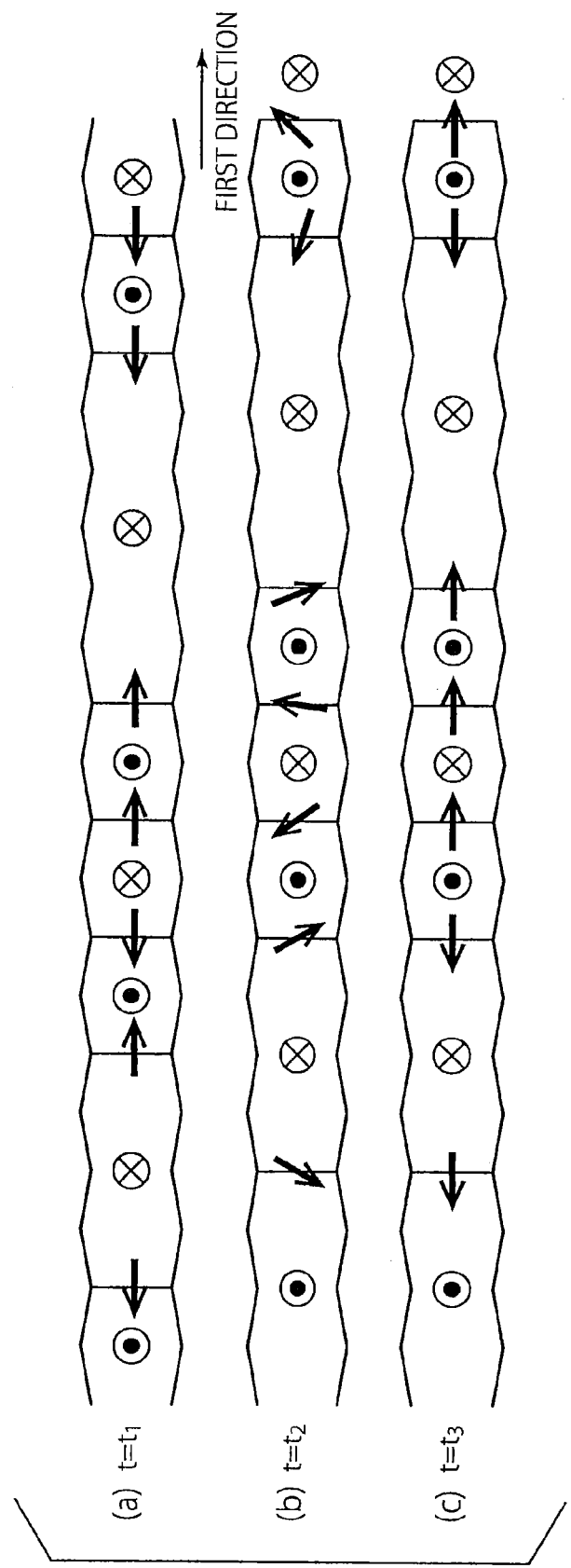
FIGS. 15(*a*) through 15(*c*) are diagrams showing changes in magnetization in domain walls when the domain walls are moving.

Referring now to FIGS. 15(a) through 15(c), an example case where the domain walls in the magnetic nanowire are so-called Neel domain walls is described. In the Neel domain walls, the magnetization in the center positions is in the first direction. In this case, the magnetization directions at the centers of the domain walls rotate when domain wall movement is started, and those domain walls again become Neel domain walls when current application is cut off, as in the case of Bloch domain walls. FIG. 15(a) shows the magnetization direction distribution in some region in the magnetic nanowire 10 when any voltage is not applied (time $t=t_1$) prior to implementation of the domain wall moving method. FIG. 15(b) shows the magnetic distribution at a time during the domain wall movement (time $t=t_2$). FIG. 15(c) shows the magnetization direction after the domain wall moving method is implemented (time $t=t_3$).

Whether the stabilized state of magnetization of domain walls is of Neel domain walls or is of Bloch domain walls depends on the cross-sectional shape of the magnetic nanowire 10.

(Movement Principles of Domain Walls)

Next, the principles on which domain wall movement is based are described. The magnetic material that forms the magnetic nanowire 10 has sufficiently high magnetic anisotropy energy, and is stabilized when the magnetization direction in the magnetic nanowire 10 is perpendicular to the first direction. Since magnetic anisotropy energy is dominant in the magnetic energy, the potential energy $E_{DW}$ of a domain wall can be expressed as a function of the center position $x_0$ of the domain wall as shown in the equation (1).

$$E_{DW}(x_0) = \int_\Omega K_u \operatorname{sech}^2\left(\frac{x-x_0}{\lambda}\right) dV \qquad (1)$$

Here, $K_u$ represents the magnetic anisotropy energy per unit volume, $\lambda$ represents ½ of the value of the domain wall width $L_{dw}$, $x_0$ represents the position of the domain wall center (hereinafter also referred to as the domain wall position), and $\Omega$ represents the volume region occupied by the magnetic nanowire 10. That is, where the cross-sectional area of the magnetic nanowire 10 at the domain wall position $x_0$ is $S(x_0)$, and the magnetic anisotropy energy is $K_u(x_0)$, the potential energy of the domain wall is expressed as:

$$E_{DW}(x_0) = 2K_u(x_0)\lambda S(x_0) \qquad (2)$$

When no voltage is applied, the magnetic anisotropy energy $K_u$ in the magnetic nanowire 10 can be regarded as substantially constant. Therefore, the domain wall stays in a position where the cross-sectional area is small.

When the voltage $V_1$ is applied to the first electrodes 20$_i$ (i=1, . . . ) (step 1), an electric field is generated in a region located near an interface in the magnetic nanowire 10 connected to the first electrodes 20$_i$ (i=1, . . . ) via the insulating film 22. Here, the voltage $V_1$ is based on the potential of the magnetic nanowire 10 or the first electrodes 20$_i$ (i=1, . . . ) connected to the magnetic nanowire 10. Hereinafter, this region will be referred to as a first field generation region. Since the electronic structure in the magnetic nanowire 10 is modulated by the electric fields in the first field generation regions, magnetic properties such as the magnetic anisotropy energy vary. As the first field generation regions are restricted to regions near the first electrodes 20$_i$ (i=1, . . . ), the potential energy distribution of domain walls in the first direction also changes. Therefore, when a voltage is applied to the first electrodes 20$_i$ (i=1, . . . ), the domain walls move to the positions in which the magnetic energy is minimal, or to the center position $x_1$ of the first electrodes in this case.

There is an upper limit on the first-direction size of each first electrode (hereinafter referred to as the first electrode size) suitable for domain wall movement. If the change in the nanowire cross-sectional area near a domain wall is small enough, 90% of the potential energy of the domain wall concentrates on a region that has the domain wall center as its center and has a length of $3\lambda$ according to the equation (1). If the first electrode size exceeds $3\lambda$, the energy to be obtained becomes smaller even when the domain wall moves in a region adjacent to a first electrode. Therefore, performing stable domain wall movement becomes difficult. In view of this, the first electrode size is preferably not larger than $3\lambda$. Since $\lambda$ is ½ of the domain wall width $L_{dw}$, the first electrode size is preferably not larger than $1.5 L_{dw}$. A typical domain wall width is 6 nm, but domain walls have widths that vary with materials. For example, if the material does not have a large magnetic anisotropy value but has perpendicular magnetic anisotropy, the domain wall width is 14 nm when the magnetic anisotropy is $2 \times 10^6$ erg/cm$^3$. Therefore, the first electrode side is preferably 1.5 or less times larger than the domain wall width, or is preferably 21 nm or smaller.

In a case where the ratio of $S(x_1)$ to $S(x_0)$ is high, a very large change in magnetic anisotropy energy is required for domain wall movement. Therefore, such a case is not preferable. In a case where the ratio between the maximal value and the minimal value of the cross-sectional area S or the nanowire width exceeds two, there is a need to locally eliminate anisotropy so as to move domain walls, for example. Such a case is not preferable either. Therefore, the ratio between the maximal value and the minimal value of the cross-sectional area S or the nanowire width is preferably two or lower.

When the voltage $V_2$ is applied to the second electrodes 30$_i$ (i=1, . . . ) (step 2), an electric field is generated in a region located near an interface in the magnetic nanowire 10 connected to the second electrodes 30$_i$ (i=1, . . . ) via the insulating film 32, as in step 1. Hereinafter, this region will be referred to as a second field generation region. As the second field generation regions are restricted to regions near the second electrodes 30$_i$ (i=1, . . . ), the potential energy distribution of domain walls in the first direction also changes. Therefore, when a voltage is applied to the second electrodes 30$_i$ (i=1, . . . ), the domain walls move to the positions in which the magnetic energy is minimal. The size of each of the second electrodes 30$_i$ (i=1, . . . ) is preferably 1.5 or less times larger than the domain wall width $L_{dw}$, like the first electrode size in the first direction. Specifically, the second electrode size is preferably 21 nm or smaller. Step 1 and step 2 may or may not temporally overlap each other. After a series of steps including step 1 and step 2 at least one time each are carried out, the voltages applied to the first electrodes 20$_i$ (i=1, . . . ) and the second electrodes 30$_i$ (i=1, . . . ) are reset to 0 V. The domain walls then move to the nearest positions where the cross-sectional area is minimal.

Example 1

Referring now to FIGS. 16(a) through 16(c), a magnetic storage element according to Example 1 of the first embodiment is described. FIG. 16(a) is a plan view of the arrangement of the first and second electrodes of Example 1. FIG. 16(b) is a timing chart of the voltages to be applied to the first and second electrodes. FIG. 16(c) is a graph showing the distribution of the potential energy $E_{DW}$ of the domain wall in the position $x_0$ of the magnetic nanowire 10.

As shown in FIG. 16(a), in the magnetic storage element of Example 1, the magnetic nanowire 10 is divided into regions I in which the first electrodes 20$_i$ (i=1, . . . ) and the second electrodes 30$_i$ (i=1, . . . ) do not exist, regions II in which only the first electrodes 20$_i$ (i=1, . . . ) exist, regions III in which both the first electrodes 20$_i$ (i=1, . . . ) and the second electrodes 30$_i$ (i=1, . . . ) exist, and regions IV in which only the second electrodes 30$_i$ (i=1, . . . ) exist. In at least part of the magnetic nanowire 10, a region I, a region II, a region III, and a region IV cyclically appear in this order in the first direction. Of those regions, the near-surface regions of the regions II and III correspond to first field generation regions, and the near-surface regions of the regions III and IV correspond to second field generation regions. In Example 1, the cycles in which the nanowire cross-sectional area of the magnetic nanowire 10 varies correspond to the cycles in which the first and second electrodes are arranged. Therefore, explanation of the behavior of the domain walls in a region equivalent to one cycle also applies to the behavior of the domain walls in the other regions.

First, while no voltage is applied (period $T_1$ shown in FIGS. 16(b) and 16(c)), the magnetic energy is minimal in a position (point A in FIG. 16(a), for example) where the cross-sectional area of the magnetic nanowire 10 is small, and therefore, a domain wall stays therein (first step).

When a voltage is applied to the first electrodes 20$_i$ (i=1, . . . ) in this situation (period $T_2$ shown in FIGS. 16(b) and 16(c)), the magnetic anisotropy energy in the first field generation region becomes lower, and the minimal energy position moves to the point B shown in FIG. 16(a) accordingly. As a result, the domain wall moves to the point B (second step). Although the timing chart shows application of a voltage with a positive sign, a voltage with a negative sign might be applied in some cases, since the relationship between the sign of the voltage to be applied and the sign of the change in the energy in a field generation region normally depends on materials.

Figure 16:
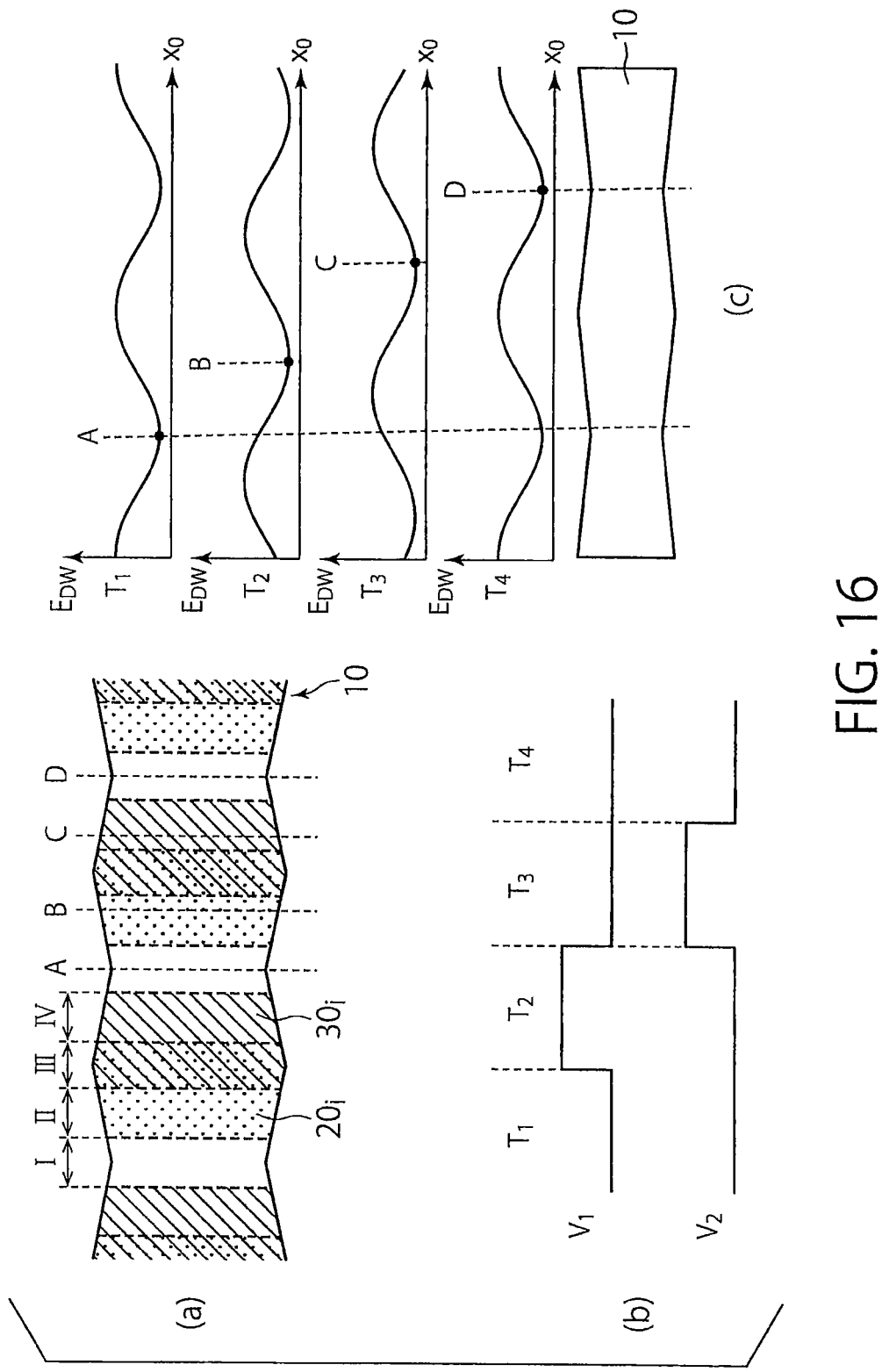
FIGS. 16(*a*) through 16(*c*) are diagrams for explaining a magnetic storage element according to Example 1.

After that, when a voltage is applied to the second electrodes $30_i$ (i=1, . . . ) (period $T_3$ shown in FIGS. 16(*b*) and 16(*c*)), the magnetic anisotropy energy in the second field generation region becomes lower, and the minimal energy position moves to the point C accordingly. As a result, the domain wall moves to the point C (third step). Lastly, when the supply of the voltage applied to the first electrodes $20_i$ (i=1, . . . ) and the second electrodes $30_i$ (i=1, . . . ) is stopped (period $T_4$ shown in FIGS. 16(*b*) and 16(*c*)), the spatial distribution of the domain wall energy returns to the initial state, and the domain wall moves to the nearest position in which the energy is minimal (point D in FIG. 16(*a*)) (fourth step).

This series of steps are repeated, to move domain walls over a desired distance.

In each of the steps in this method, the domain walls need to be moved to positions in which the energy is minimal. Therefore, a sufficient standby time should be taken while the voltage of the first electrodes $20_i$ (i=1, . . . ) or the second electrodes $30_i$ (i=1, . . . ) is equal to or higher than a certain voltage. Therefore, the standby time is preferably longer than the time required for energy relaxation. The time required for energy relaxation can be expressed approximately as $1/(\alpha\gamma Hk)$, where $\alpha$ represents damping constant, $\gamma$ represents gyromagnetic ratio, and Hk represents anisotropy field. For example, where the typical damping constant is 0.01, the gyromagnetic ratio is 17.6 MHz/Oe, and the anisotropy field Hk is 10000 Oe, the standby time is preferably 0.5 ns or longer.

Figure 17:
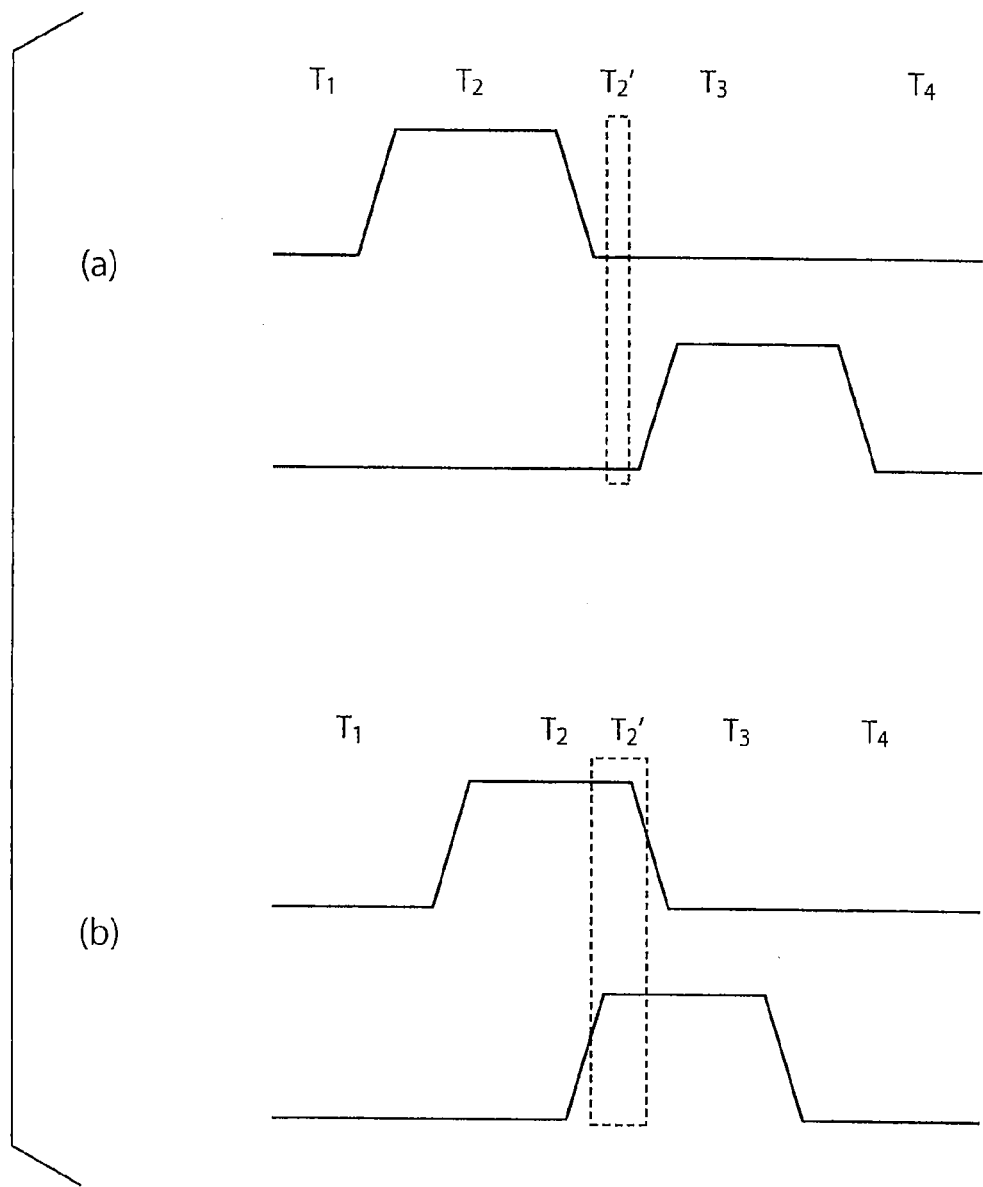
FIGS. 17(*a*) and 17(*b*) are waveform charts showing examples of driving voltages for the magnetic storage element according to Example 1.
Figure 18:
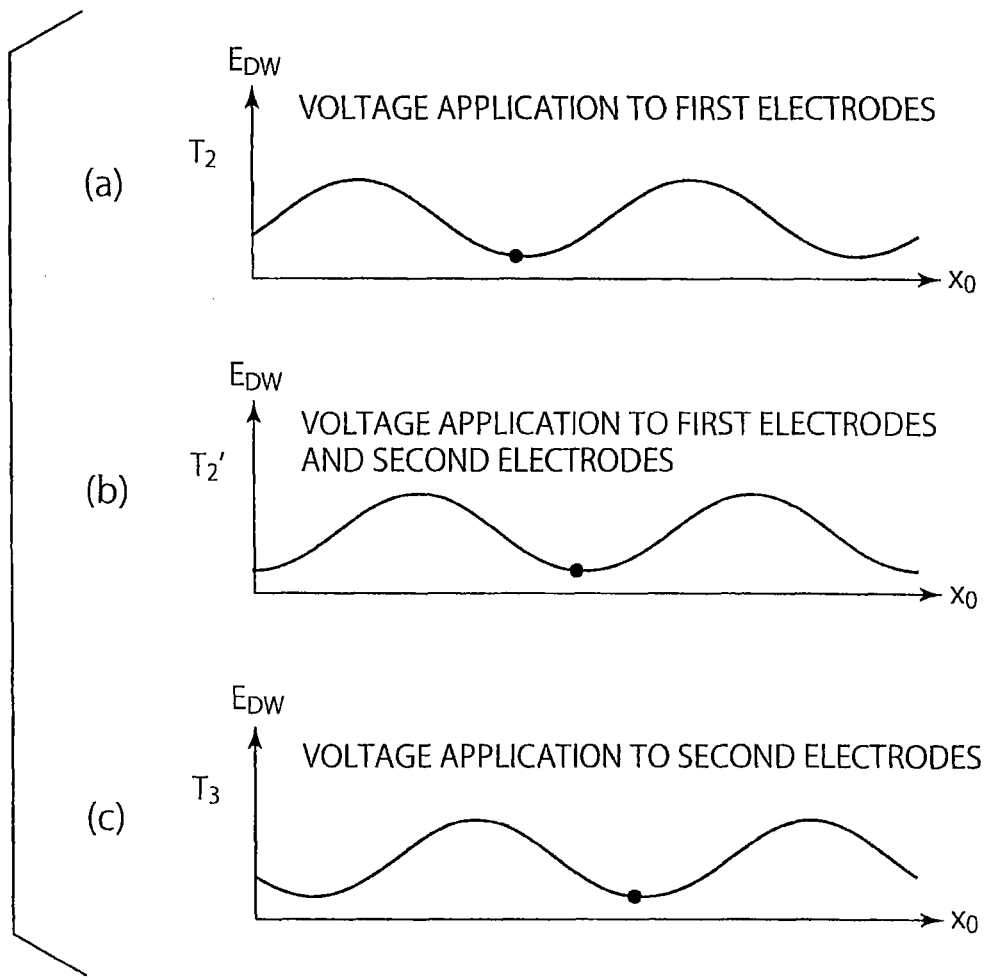
FIGS. 18(*a*) through 18(*c*) are diagrams for explaining an operation for shifting domain walls of the magnetic storage element of Example 1 in one direction.

In the timing chart shown in FIG. 16(*b*), there may be a small difference in the time for switching from the second step to the third step. For example, as shown in FIG. 17(*a*), there may be a temporal gap between the second step and the third step. Alternatively, as shown in FIG. 17(*b*), there may be a period during which the second step and the third step temporally overlap each other. In this case, there are the period $T_2$ during which a voltage is applied to the first electrodes as shown in FIG. 18(*a*), a period $T_2'$ during which a voltage is applied to the second electrodes while a voltage is applied to the first electrodes as shown in FIG. 18(*b*), and the period $T_3$ during which a voltage is applied to the second electrodes as shown in FIG. 18(*c*). In the period $T_2'$ during which the second step and the third step temporally overlap each other, a change in the magnetic anisotropy energy in the first field generation region occurs at the same time as a change in the magnetic anisotropy energy in the second field generation region. Therefore, an energy distribution that differs from those of the second step and the third step is formed. During this period, the minimal energy point is located between the point B and the point C. Therefore, if there is a period during which the second step and the third step overlap each other, the temporal change in the minimal energy position becomes slower, and as a result, the domain wall moves smoothly in a preferable manner. In a case where the nanowire width of the magnetic nanowire 10 is maximal in the regions III where the first electrodes $20_i$ (i=1, . . . ) overlap the second electrodes $30_i$ (i=1, . . . ) with the magnetic nanowire 10 existing in between as in this example, the energy in the positions where the cross-sectional area of the magnetic nanowire 10 is maximal by both the first electrodes and the second electrodes or the positions where the potential energy of the domain walls is maximal is changed in the periods during which the second step and the third step overlap each other. Accordingly, the voltages to be applied to the respective electrodes can be lowered in a preferable manner.

Figure 19:
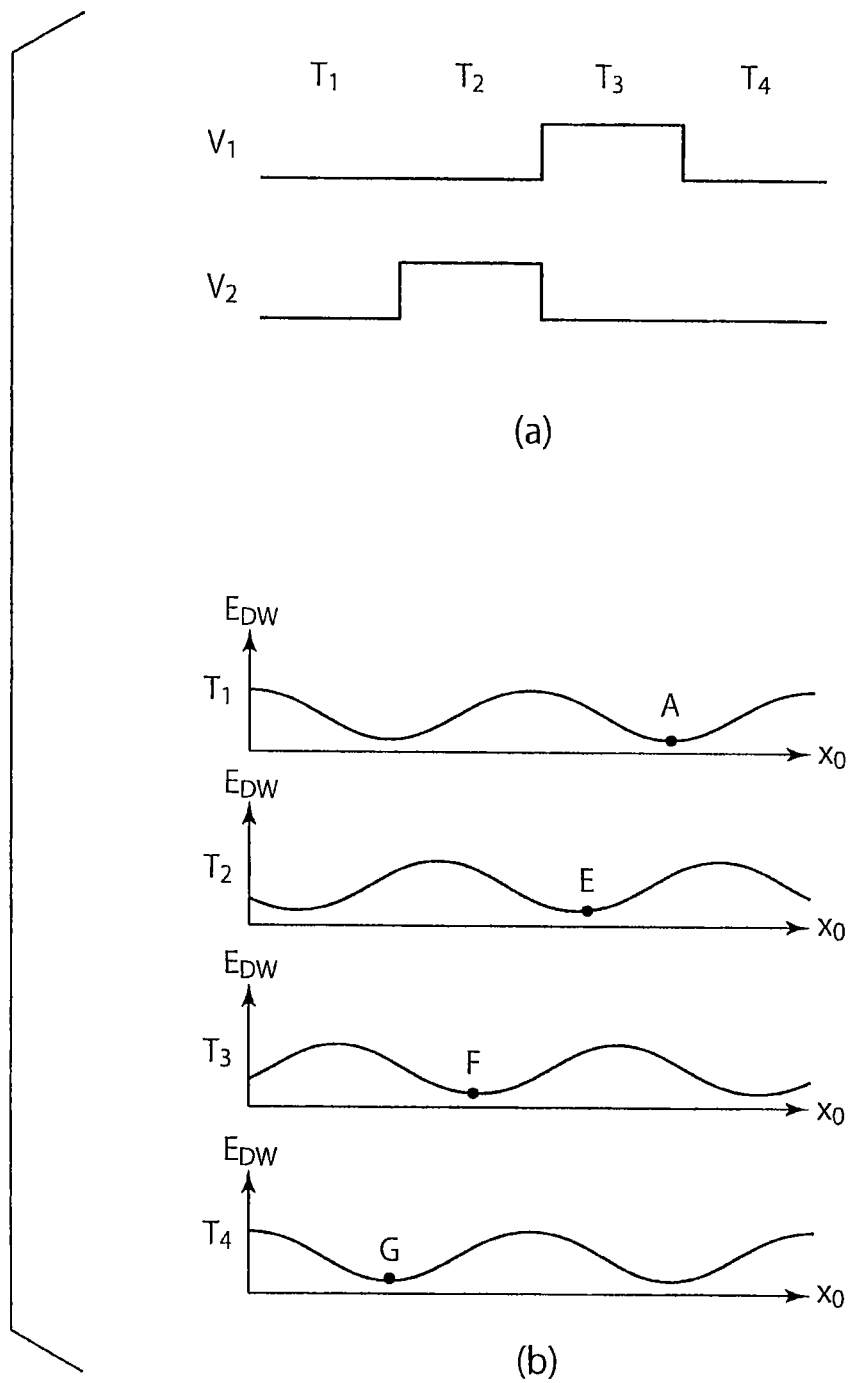
FIGS. 19(*a*) and 19(*b*) are diagrams for explaining an operation for shifting domain walls of the magnetic storage element of Example 1 in the reverse direction.

To move the domain walls in the reverse direction, the second step and the third step are reversed in order. For example, as shown in FIG. 19(*a*), there are a period $T_1$ during which the voltages $V_1$ and $V_2$ are not applied to the first and second electrodes, a period $T_2$ during which the voltage $V_2$ is applied to the second electrodes, a period $T_3$ during which the voltage $V_1$ is applied to the first electrodes, and a period $T_4$ during which the voltages $V_1$ and $V_2$ are not applied to the first and second electrodes. As a result, a domain wall moves from a point A to a point E to a point F to a point G, as shown in FIG. 19(*b*).

(Specific Examples of Voltage Pulse Waveforms)

Figure 38:
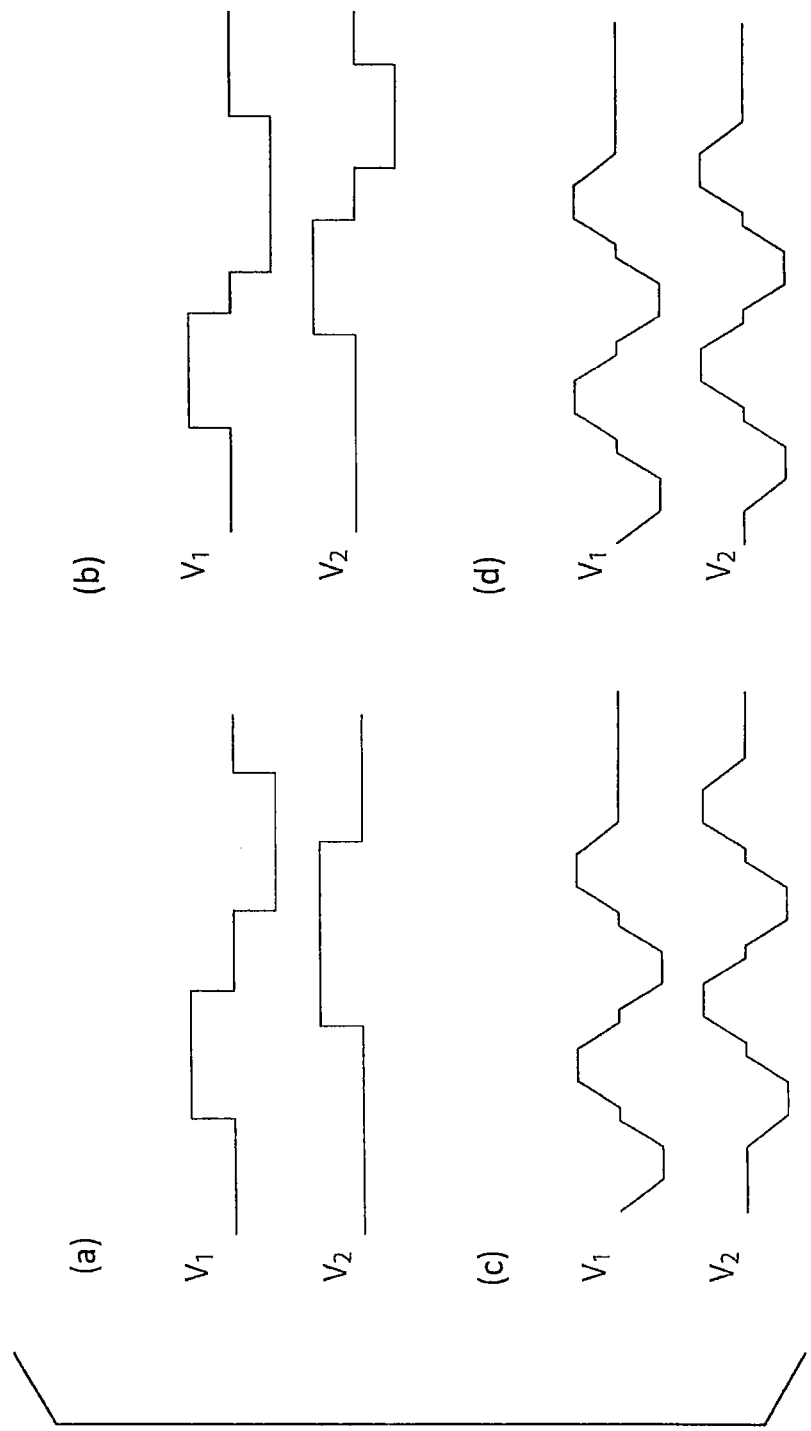
FIGS. 38(*a*) through 38(*d*) are waveform charts showing specific examples of voltage waveforms in Example 1.

Various types of voltage pulse application methods can be used, as long as the domain wall positions can be guided by temporally changing the minimal energy position as in the above described example. For example, the voltage pulse application method may further include the step (a fifth step) of applying a voltage with the opposite sign of the voltage applied during the period $T_2$ to the first electrodes at the time (period $T_3$ or period $T_4$) after the voltage application to the first electrodes is stopped in FIG. 16(*b*). In this case, there is a lower possibility that the domain wall wrongly returns to the point B when the domain wall is supposed to be moving to the point C. Accordingly, domain walls can be moved in a desired direction in a stable manner. FIG. 38(*a*) shows an example timing chart of a voltage pulse for achieving such an effect. FIG. 38(*b*) shows an example that further includes the step (a sixth step) of applying a voltage with the opposite sign to the second electrodes after the voltage with the opposite sign is applied to the first electrodes. As such a step is also carried out, the possibility that the domain wall wrongly returns to the point C when the domain wall is supposed to be moving to the point D can be lowered. Accordingly, domain walls can be moved in a desired direction in a stable manner. The examples shown in FIGS. 38(*a*) and 38(*b*) correspond to cases where the magnetic anisotropy energy of the magnetic nanowire 10 becomes lower when a voltage with a positive sign is applied. In a case where the magnetic anisotropy energy of the magnetic nanowire 10 becomes lower when a voltage with a negative sign is applied, the sign of the voltage to be applied should be reversed at each time in FIGS. 38(*a*) and 38(*b*).

This series of steps are repeated twice or more, to move each domain wall over the distance equivalent to two or more cycles of the nanowire width. FIGS. 38(*c*) and 38(*d*) show timing charts of example voltage pulse application methods for moving domain walls over the distance equivalent to two cycles by repeating the series of steps twice. The examples shown in FIGS. 38(*c*) and 38(*d*) correspond to cases where the magnetic anisotropy energy becomes lower when a voltage with a negative sign is applied. In a case where the magnetic anisotropy energy of the magnetic nanowire 10 becomes lower when a voltage with a positive sign is applied, the sign of the voltage to be applied should be reversed at each time in FIGS. 38(*c*) and 38(*d*).

As can be seen from those examples, domain walls can be moved in the direction from the centers of gravity of the first electrodes toward the centers of gravity of the second electrode by carrying out the step (the third step) of applying a voltage with a first sign to the second electrodes after carrying out the step (the second step) of applying a voltage with the first sign to the first electrodes. By this method, domain walls can be moved in a desired direction in a stable manner in a case where one cycle of nanowire cross-sectional area changes having a minimal cross-sectional area position of the magnetic nanowire 10 at either end includes a region I including a minimal cross-sectional area region, a region II, a region III, and a region IV. The method may further include at least one of the step (the fifth step) of applying a voltage with a second sign that is the opposite of the first sign to the first electrodes after the third step, and the step (the sixth step) of applying a voltage with the second sign that is the opposite of the first sign to the second electrodes after the third step. In a case where the method includes both the fifth step and the sixth step, the sixth step is carried out after the fifth step. As the method further includes the fifth step and the sixth step, the stability of domain wall movement is further increased.

Example 2

Figure 39:
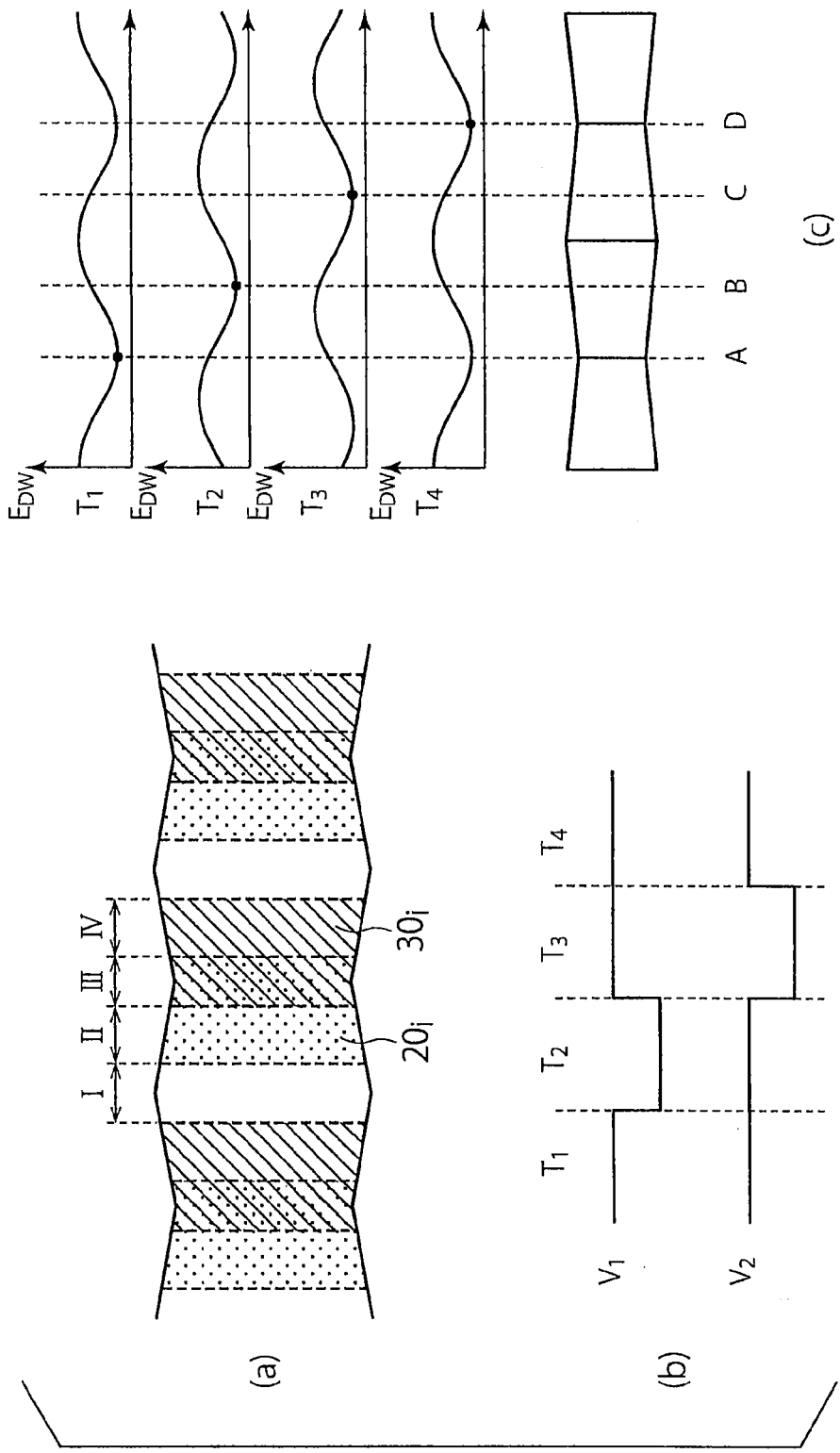
FIGS. 39(*a*) through 39(*c*) are diagrams for explaining a magnetic storage element according to Example 2.

Referring now to FIGS. 39(a) and 39(c), a magnetic storage element according to Example 2 of the first embodiment is described. FIG. 39(a) is a plane view of the arrangement of the first and second electrodes of Example 2. FIG. 39(b) is a timing chart of the voltages to be applied to the first and second electrodes. FIG. 39(c) is a graph showing the distribution of the potential energy $E_{DW}$ of the domain wall in the position $x_0$ of the magnetic nanowire 10.

In the magnetic storage element of Example 2, the magnetic nanowire 10 is divided into regions I in which the first electrodes $20_i$ (i=1, . . . ) and the second electrodes $30_i$ (i=1, . . . ) do not exist, regions II in which only the first electrodes $20_i$ (i=1, . . . ) exist, regions III in which both the first electrodes $20_i$ (i=1, . . . ) and the second electrodes $30_i$ (i=1, . . . ) exist, and regions IV in which only the second electrodes $30_i$ (i=1, . . . ) exist, as in the magnetic storage element of Example 1. In at least part of the magnetic nanowire 10, a region I, a region II, a region III, and a region IV cyclically appear in this order in the first direction. Example 2 differs from Example 1 in that the regions III include positions where the cross-sectional area of the magnetic nanowire is minimal. The respective steps for moving domain walls are described below.

First, while no voltage is applied (period $T_1$), the magnetic energy is minimal in a position (point A in FIG. 39(c), for example) where the cross-sectional area of the magnetic nanowire 10 is small, and therefore, a domain wall stays therein (first step).

When a voltage is applied to the first electrodes $20_i$ (i=1, . . . ) in this situation (period $T_2$ shown in FIGS. 39(b) and 39(c)), the magnetic anisotropy energy in the first field generation region becomes larger, and the minimal energy position moves to the point B shown in FIG. 39(c) accordingly. As a result, the domain wall moves to the point B (second step). Although a voltage with a negative sign is applied in FIG. 39(b), a voltage with a positive sign might be applied in some cases, since the relationship between the sign of the voltage to be applied and the sign of the change in the energy in a field generation region normally depends on materials.

After that, when a voltage is applied to the second electrodes $30_i$ (i=1, . . . ) (period $T_3$ shown in FIGS. 39(b) and 39(c)), the magnetic anisotropy energy in the second field generation region becomes larger, and the minimal energy position moves to the point C accordingly. As a result, the domain wall moves to the point C (third step).

Lastly, when the supply of the voltage applied to the first electrodes $20_i$ (i=1, . . . ) and the second electrodes $30_i$ (i=1, . . . ) is stopped (period $T_4$ shown in FIGS. 39(b) and 39(c)), the spatial distribution of the domain wall energy returns to the initial state, and the domain wall moves to the nearest position in which the energy is minimal (point D in FIG. 39(c)) (fourth step).

This series of steps are repeated, to move domain walls over a desired distance.

To move the domain walls in the reverse direction, the second step and the third step are reversed in order.

In each of the steps in this method, the domain walls need to be moved to positions in which the energy is minimal. Therefore, a sufficient standby time should be taken while the voltage of the first electrodes $20_i$ (i=1, . . . ) or the second electrodes $30_i$ (i=1, . . . ) is equal to or higher than a certain voltage.

In the timing chart shown in FIG. 39(b), there may be a small difference in the time for switching from the second step to the third step, as in Example 1. For example, there may be a temporal gap between the second step and the third step. The upper limit of this switching time is the time required for a domain wall to move to a minimal energy position and for an energy relaxed state to be formed. Alternatively, there may be a period during which the second step and the third step temporally overlap each other. In this case, there are the period $T_2$ during which a voltage is applied to the first electrodes, a period $T_2'$ during which a voltage is applied to the second electrodes while a voltage is applied to the first electrodes, and the period $T_3$ during which a voltage is applied to the second electrodes. In the period $T_2'$ during which the second step and the third step temporally overlap each other, a change in the magnetic anisotropy energy in the first field generation region occurs at the same time as a change in the magnetic anisotropy energy in the second field generation region. Therefore, an energy distribution that differs from those of the second step and the third step is formed. During this period, the minimal energy point is located between the point B and the point C. Therefore, if there is a period during which the second step and the third step overlap each other, the temporal change in the minimal energy position becomes slower, and as a result, the domain wall moves smoothly in a preferable manner. In a case where the nanowire width of the magnetic nanowire 10 is minimal in the regions III where the first electrodes $20_i$ (i=1, . . . ) overlap the second electrodes $30_i$ (i=1, . . . ) with the magnetic nanowire 10 existing in between as in this example, the energy in the positions where the cross-sectional area of the magnetic nanowire 10 is minimal by both the first electrodes and the second electrodes or the positions where the potential energy of the domain walls is minimal is changed in the periods during which the second step and the third step overlap each other. Accordingly, the voltages to be applied to the respective electrodes can be lowered in a preferable manner.

As described above, the voltage application method of Example 2 differs from the voltage application method of Example 1 in that the sign of changes in the magnetic anisotropy energy in the first and second field generation regions is reversed. Accordingly, various kinds of voltage pulse application methods can be used, as mentioned in the description of the specific examples of voltage pulse waveforms of Example 1. For example, domain walls can be moved in the direction from the centers of gravity of the first electrodes toward the centers of gravity of the second electrodes by carrying out the step (the third step) of applying a voltage with a first sign to the second electrodes after carrying out the step (the second step) of applying a voltage with the first sign to the first electrodes. By this method, domain walls can be moved in a desired direction in a stable manner in a case where one cycle of nanowire cross-sectional area changes having a minimal cross-sectional area position of the magnetic nanowire 10 at either end includes a region III including a minimal cross-sectional area region, a region I, a region II, and a region IV. The method may further include at least one of the step (the fifth step) of applying a voltage with a second sign that is the opposite of the first sign to the first electrodes after the third step, and the step (the sixth step) of applying a voltage with the second sign that is the opposite of the first sign to the second electrodes after the third step. In a case where the method includes both the fifth step and the sixth step, the sixth step is carried out after the fifth step. As the method further includes the fifth step and the sixth step, the stability of domain wall movement is further increased. Specifically, the examples shown in FIGS. 38(a) and 38(b) are examples in which a magnetic wall can be moved from the point A to the point D in the magnetic nanowire shown in FIG. 39 in a case where the magnetic anisotropy energy of the magnetic nanowire 10 becomes lower when a voltage with a negative sign is applied. The examples shown in FIGS. 38(c) and 38(d) are examples in which a magnetic wall can be moved from the point A to the point D in the magnetic nanowire shown in FIG. 39 in a case where the magnetic anisotropy energy of the magnetic nanowire 10 becomes lower when a voltage with a positive sign is applied.

Example 3

Figure 20:
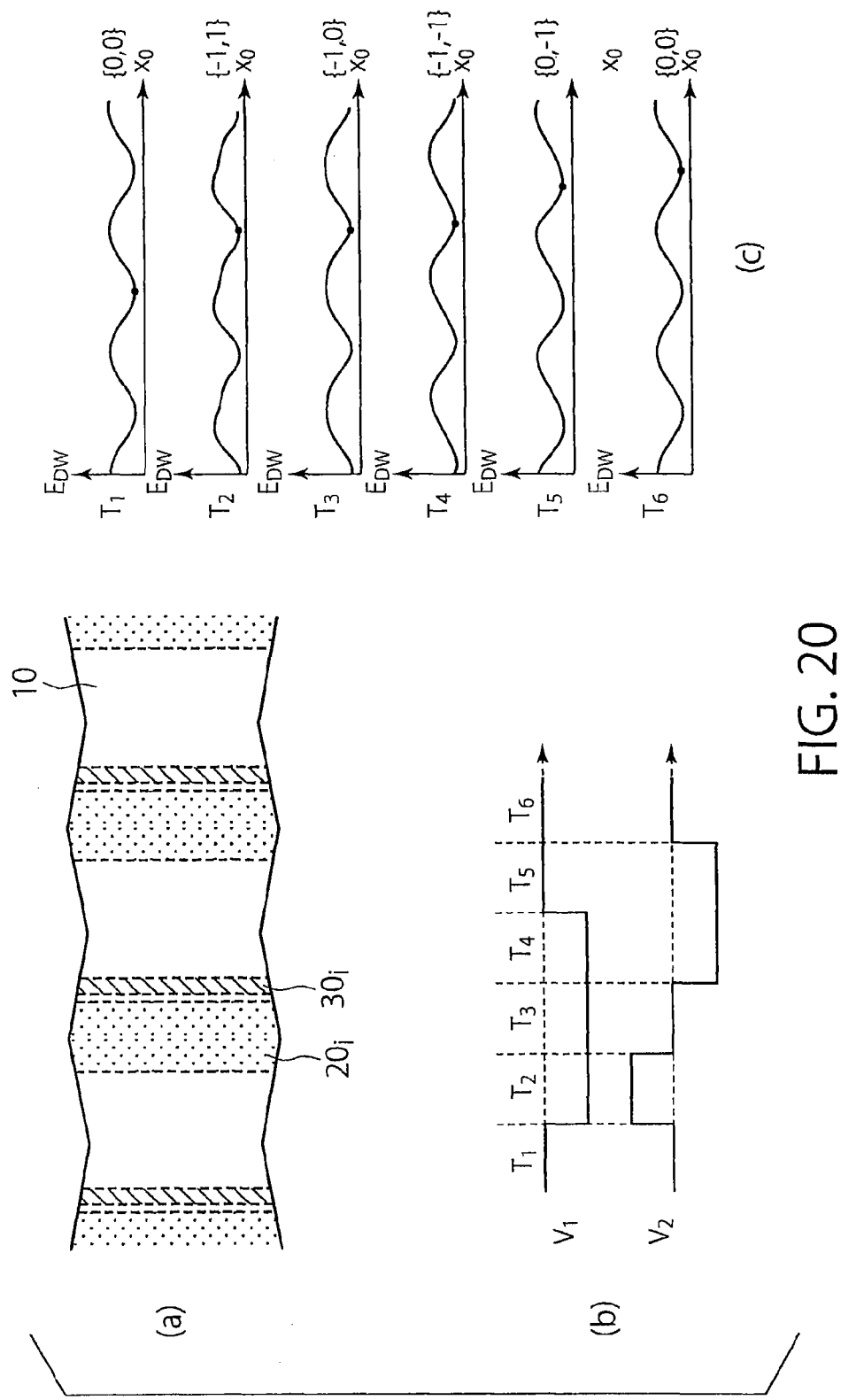
FIGS. 20(*a*) through 20(*c*) are diagrams for explaining a magnetic storage element according to Example 3.

Referring now to FIGS. 20(a) through 20(c), a magnetic storage element according to Example 3 of the first embodiment is described. The magnetic storage element of Example 3 has a structure in which the first electrodes $20_i$ (i=1, ... ) do not overlap the second electrode $30_i$ (i=1, ... ), as shown in FIG. 20(a).

FIG. 20(b) shows examples of the voltages $V_1$ and $V_2$ that are applied to the first and second electrodes when the magnetic storage element according to Example 3 is operated. Each of the voltages $V_1$ and $V_2$ to be applied may have either a positive sign or a negative sign. The sign of the voltages and increases/decreases in the magnetic anisotropy energy depend on materials. First, the voltage $V_1$ to be applied to the first electrodes $20_i$ (i=1, ... ) and the voltage $V_2$ to be applied to the second electrodes $30_i$ (i=1, are set at 0 V (period $T_1$). Here, the combination of the voltages $V_1$ and $V_2$ is expressed as {0, 0}. The voltage $V_1$ with a negative sign is then applied to the first electrodes $20_i$ (i=1, ... ), and the voltage $V_2$ with a positive sign is applied to the second electrodes $30_i$ (i=1, ... ) (period $T_2$). Here, the combination of the voltages $V_1$ and $V_2$ is expressed as {−1, 1}. The voltage $V_2$ to be applied to the second electrodes $30_i$ (i=1, ... ) is then set at 0 V while the application of the negative voltage $V_1$ to the first electrodes $20_i$ (i=1, ... ) is continued (period $T_3$). Here, the combination of the voltages $V_1$ and $V_2$ is expressed as {−1, 0}. The voltage $V_2$ to be applied to the second electrodes $30_i$ (i=1, ... ) is then set at a negative value while the application of the negative voltage $V_1$ to the first electrodes $20_i$ (i=1, ... ) is continued (period $T_4$). Here, the combination of the voltages $V_1$ and $V_2$ is expressed as {−1, −1}. The voltage $V_1$ to be applied to the first electrodes $20_i$ (i=1, ... ) is then set at 0 V, and the voltage $V_2$ to be applied to the second electrodes $30_i$ (i=1, ... ) remains a negative voltage (period $T_5$). Here, the combination of the voltages $V_1$ and $V_2$ is expressed as {0, −1}. The voltage $V_2$ to be applied to the second electrodes $30_i$ (i=1, ... ) is then set at 0 V while the voltage $V_1$ to be applied to the first electrodes $20_i$ (i=1, ... ) remains 0 V (period $T_6$). Here, the combination of the voltages $V_1$ and $V_2$ is expressed as {0, 0}. FIG. 20(c) shows the distribution of the potential energy $E_{DW}$ of domain walls during the above periods $T_1$ through $T_6$.

Figure 21:
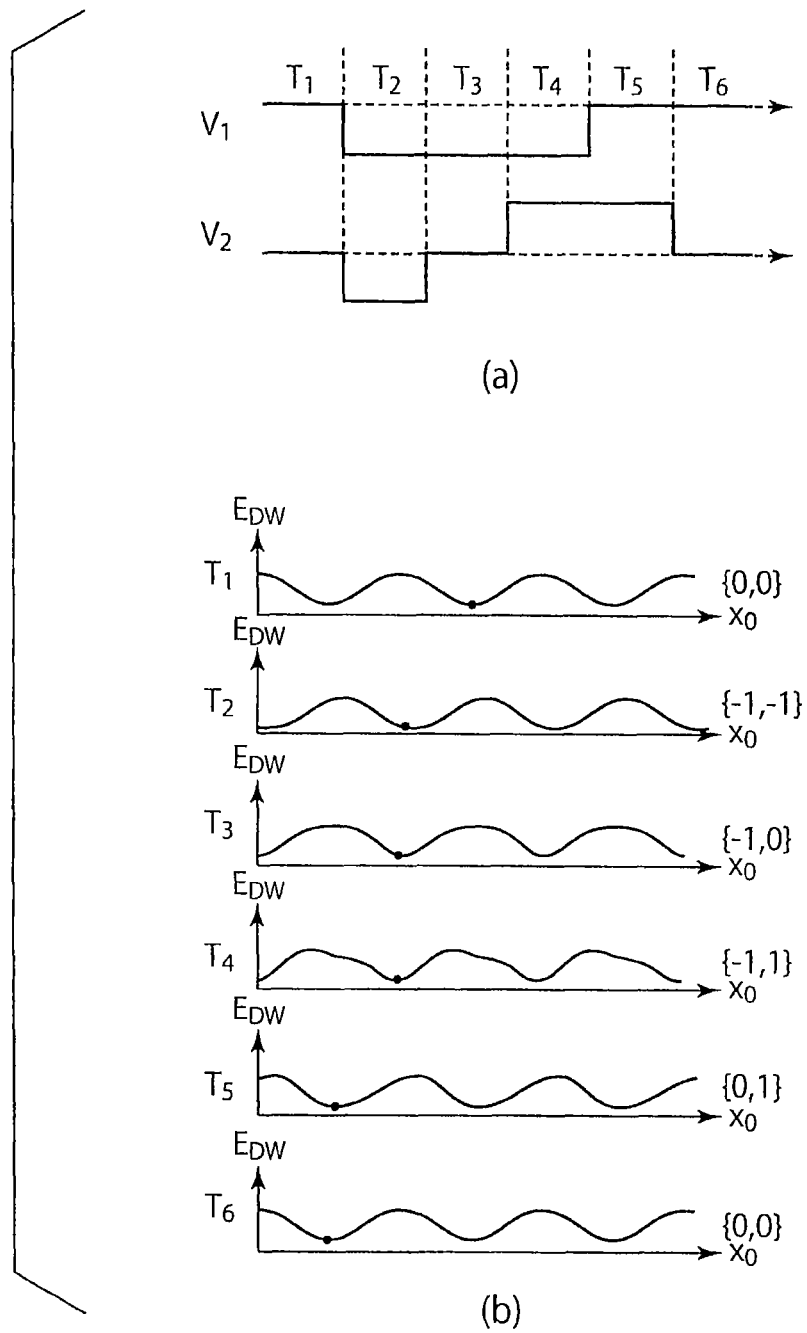
FIGS. 21(*a*) and 21(*b*) are diagrams for explaining an operation for shifting domain walls of the magnetic storage element of Example 3 in the reverse direction.

In Example 3, the domain wall moving direction in the case where the first and second electrodes are driven with the waveforms shown in FIG. 20(b) can be reversed by applying the respective voltages $V_1$ and $V_2$ to the first and second electrodes in the manner shown in FIG. 21(a), for example. FIG. 21(b) shows the temporal changes in the distribution of the potential energy $E_{DW}$ of domain walls in that case.

Example 4

Figure 22:
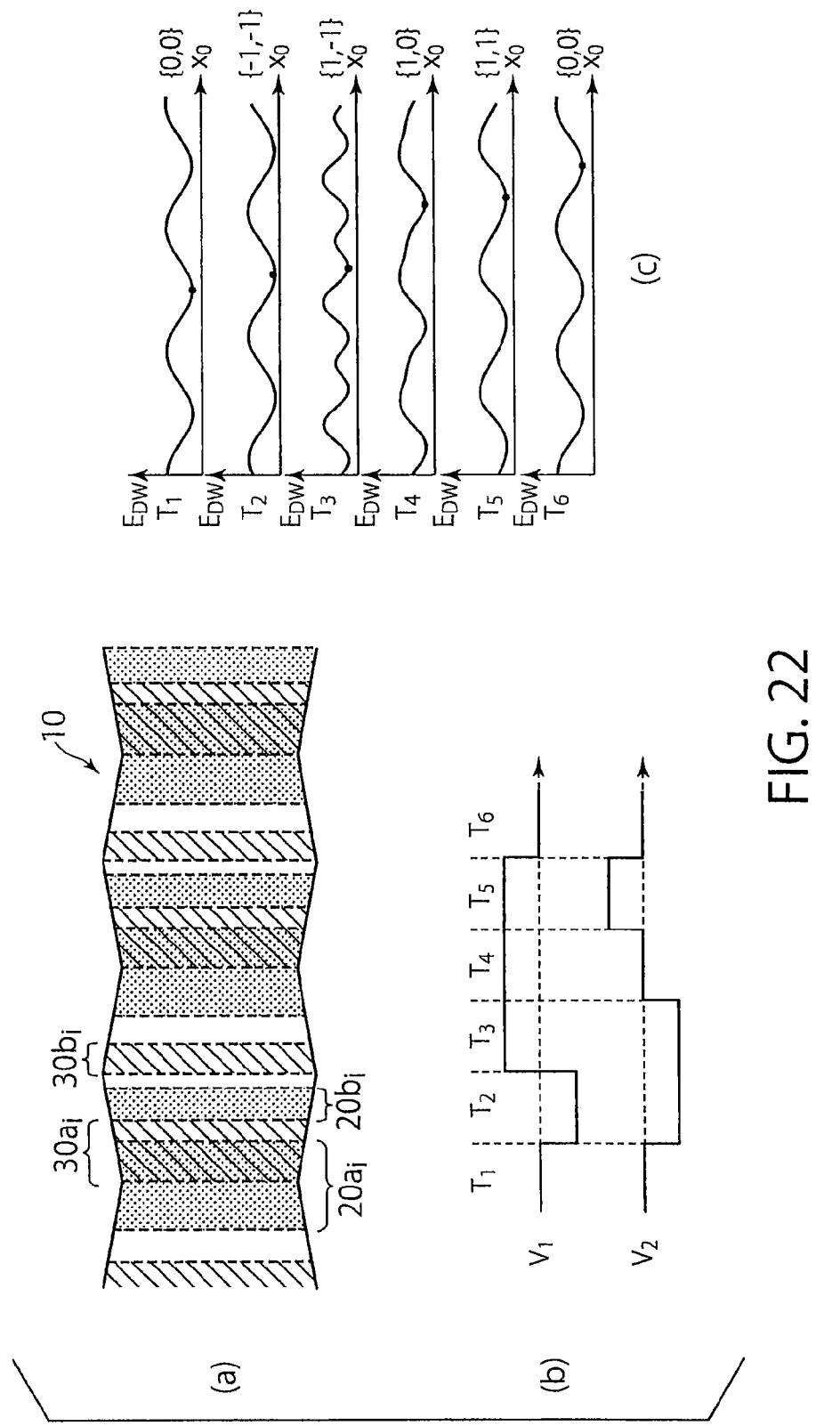
FIGS. 22(*a*) through 22(*c*) are diagrams for explaining a magnetic storage element according to Example 4.

Referring now to FIGS. 22(a) through 22(c), a magnetic storage element according to Example 4 of the first embodiment is described. The magnetic storage element of Example 4 has a structure in which two or more first electrodes and two or more second electrodes are provided in one cycle of changes in the width of the magnetic nanowire 10. For example, as shown in FIG. 22(a), two first electrodes $20a_i$ and $20b_i$ (i=1, ... ) and two second electrodes $30a_i$ and $30b_i$ (i=1, ... ) may be provided in one cycle of changes in the width of the magnetic nanowire 10.

FIG. 22(b) shows examples of the voltages $V_1$ and $V_2$ that are applied to the first and second electrodes when the magnetic storage element according to Example 4 is operated. First, the voltage $V_1$ to be applied to the first electrodes $20a_i$ and $20b_i$ (i=1, ... ) and the voltage $V_2$ to be applied to the second electrodes $30a_i$ and $30b_i$ (i=1, ... ) are set at 0 V (period $T_1$). Here, the combination of the voltages $V_1$ and $V_2$ is expressed as {0, 0}. The voltage $V_1$ with a negative sign is then applied to the first electrodes $20a_i$ and $20b_i$ (i=1, ... ), and the voltage $V_2$ with a negative sign is applied to the second electrodes $30a_i$ and $30b_i$ (i=1, ... ) (period $T_2$). Here, the combination of the voltages $V_1$ and $V_2$ is expressed as {−1, −1}. The voltage $V_1$ to be applied to the first electrodes $20a_i$ and $20b_i$ (i=1, ... ) is switched to a positive voltage, and the voltage $V_2$ to be applied to the second electrodes $30a_i$ and $30b_i$ (i=1, ... ) remains negative (period $T_3$). Here, the combination of the voltages $V_1$ and $V_2$ is expressed as {1, −1}. The voltage $V_1$ to be applied to the first electrodes $20a_i$ and $20b_i$ (i=1, ... ) remains positive, and the voltage $V_2$ to be applied to the second electrodes $30a_i$ and $30b_i$ (i=1, ... ) is set at 0 V (period $T_4$). Here, the combination of the voltages $V_1$ and $V_2$ is expressed as {1, 0}. The voltage $V_1$ to be applied to the first electrodes $20a_i$ and $20b_i$ (i=1, ... ) remains positive, and the voltage $V_2$ to be applied to the second electrodes $30a_i$ and $30b_i$ (i=1, ... ) is switched to a positive voltage (period $T_5$). Here, the combination of the voltages $V_1$ and $V_2$ is expressed as {1, 1}. The voltage $V_2$ to be applied to the second electrodes $30a_i$ and $30b_i$ (i=1, ... ) is then set at 0 V while the voltage $V_1$ to be applied to the first electrodes $20a_i$ and $20b_i$ (i=1, ... ) remains 0 V (period $T_6$). Here, the combination of the voltages $V_1$ and $V_2$ is expressed as {0, 0}. FIG. 22(c) shows the temporal changes in the potential energy $E_{DW}$ of domain walls during the above periods $T_1$ through $T_6$.

Figure 23:
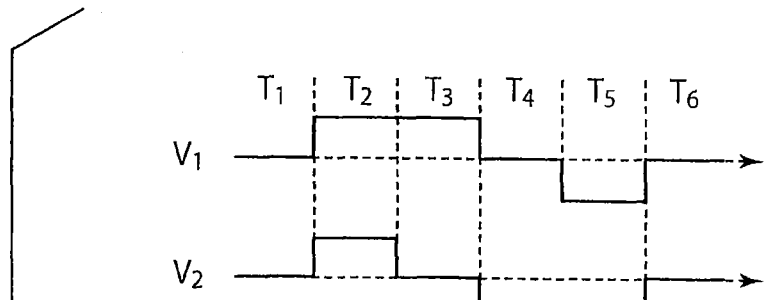
FIGS. 23(*a*) and 23(*b*) are diagrams for explaining an operation for shifting domain walls of the magnetic storage element of Example 4 in the reverse direction.
Figure 23:
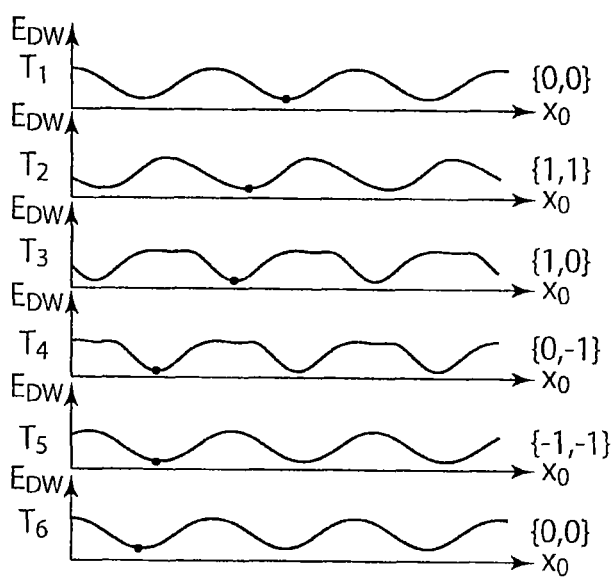

In Example 4, the domain wall moving direction in the case where the first and second electrodes are driven with the waveforms shown in FIG. 22(b) can be reversed by applying the respective voltages $V_1$ and $V_2$ to the first and second electrodes in the manner shown in FIG. 23(a), for example. FIG. 23(b) shows the temporal changes in the potential energy $E_{DW}$ of domain walls in that case.

Example 5

Figure 24:
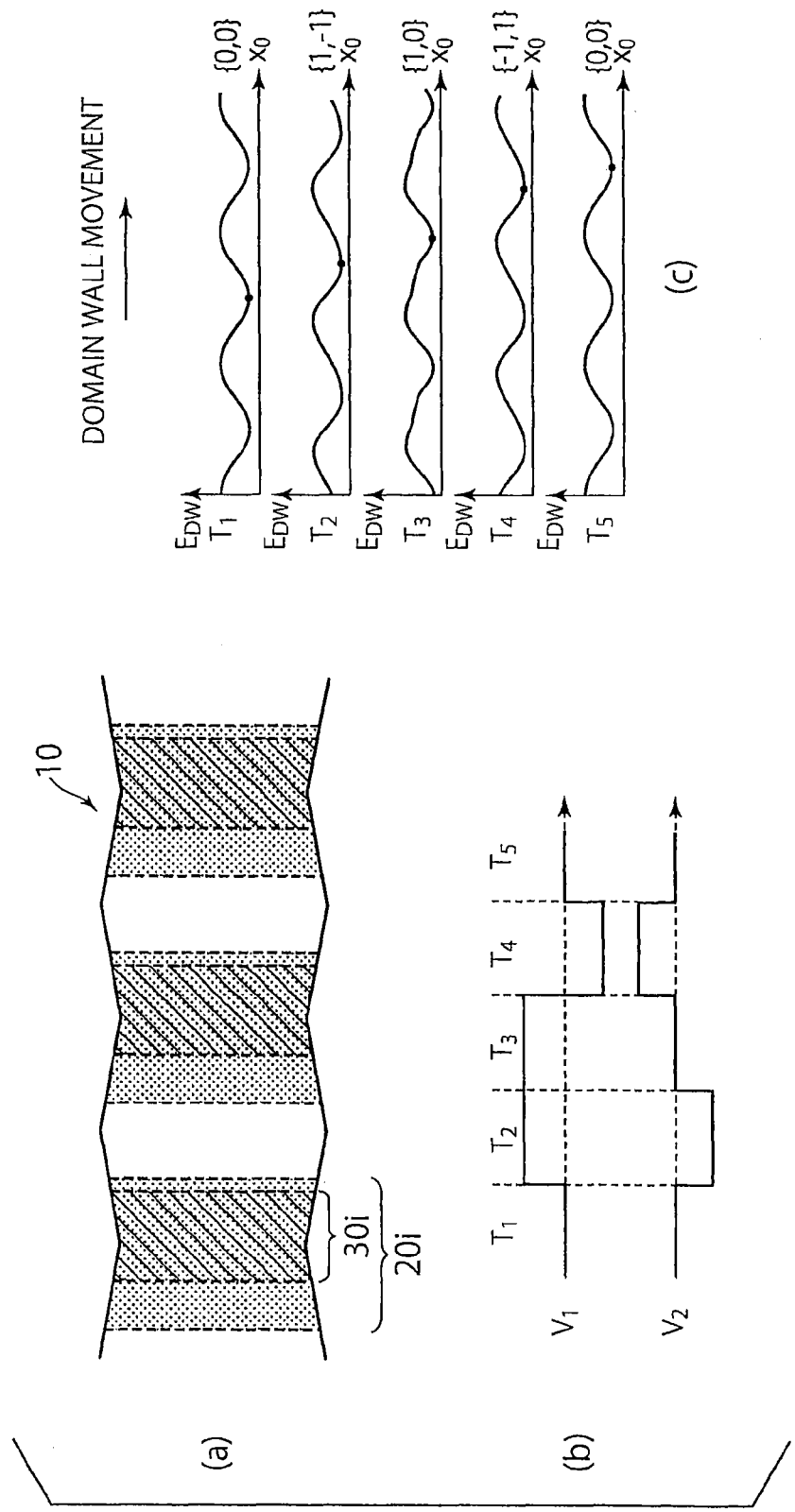
FIGS. 24(*a*) through 24(*c*) are diagrams for explaining a magnetic storage element according to Example 5.

Referring now to FIGS. 24(a) through 24(c), a magnetic storage element according to Example 5 of the first embodiment is described. As shown in FIG. 24(a), the magnetic storage element of Example 5 is designed so that the projections of the second electrodes $30_i$ (i=1, ... ) are included in the projections of the first electrodes $20_i$ (i=1, ... ) when the magnetic nanowire 10 is seen from the third direction.

FIG. 24(b) shows examples of the voltages $V_1$ and $V_2$ that are applied to the first and second electrodes when the magnetic storage element according to Example 5 is operated. First, the voltage $V_1$ to be applied to the first electrodes $20_i$ (i=1, ... ) and the voltage $V_2$ to be applied to the second electrodes $30_i$ (i=1, ... ) are set at 0 V (period $T_1$). Here, the combination of the voltages $V_1$ and $V_2$ is expressed as {0, 0}. The voltage $V_1$ with a positive sign is then applied to the first electrodes $20_i$ (i=1, ... ), and the voltage $V_2$ with a negative sign is applied to the second electrodes $30_i$ (i=1, ...) (period $T_2$). Here, the combination of the voltages $V_1$ and $V_2$ is expressed as {1, −1}. The voltage $V_1$ to be applied to the first electrodes $20_i$ (i=1, ...) remains positive, and the voltage $V_2$ to be applied to the second electrodes $30_i$ (i=1, ...) is set at 0 V (period $T_3$). Here, the combination of the voltages $V_1$ and $V_2$ is expressed as {1, 0}. The voltage $V_1$ to be applied to the first electrodes $20_i$ (i=1, ...) is then switched to a negative voltage, and the voltage $V_2$ to be applied to the second electrodes $30_i$ (i=1, ...) is switched to a positive voltage (period $T_4$). Here, the combination of the voltages $V_1$ and $V_2$ is expressed as {−1, 1}. The voltage $V_1$ to be applied to the first electrodes $20_i$ (i=1, ...) is then set at 0 V, and the voltage $V_2$ to be applied to the second electrodes $30_i$ (i=1, ...) is set at 0 V (period $T_5$). Here, the combination of the voltages $V_1$ and $V_2$ is expressed as {0, 0}. FIG. 24(c) shows the temporal changes in the potential energy $E_{DW}$ of domain walls during the above periods $T_1$ through $T_5$.

Figure 25:
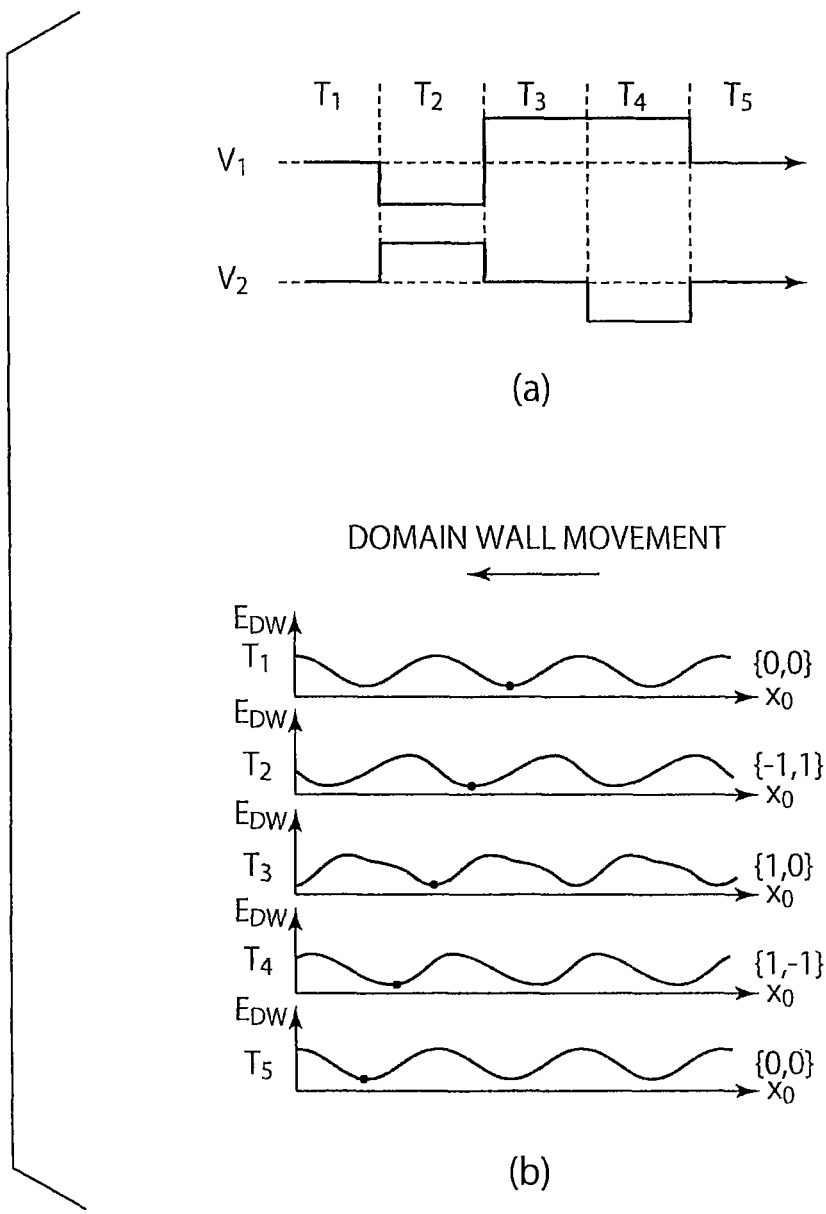
FIGS. 25(*a*) and 25(*b*) are diagrams for explaining an operation for shifting domain walls of the magnetic storage element of Example 5 in the reverse direction.

In Example 5, the domain wall moving direction in the case where the first and second electrodes are driven with the waveforms shown in FIG. 24(b) can be reversed by applying the respective voltages $V_1$ and $V_2$ to the first and second electrodes in the manner shown in FIG. 25(a), for example. FIG. 25(b) shows the temporal changes in the potential energy $E_{DW}$ of domain walls in that case.

Next, cases where domain wall positions cannot be controlled by applying voltages to the first and second electrodes will be described as Comparative Examples 1 through 3.

In these comparative examples, there are minimal positions A and B in which the cross-sectional area of the magnetic nanowire 10 is minimal, and there is a maximal position C located between the minimal positions A and B. In the maximal position C, the cross-sectional area of the magnetic nanowire 10 is maximal. This aspect is the same as the corresponding aspect of the first embodiment and Examples 1 through 5. However, the first electrodes and the second electrodes differ in size and position from those of the first embodiment and Examples 1 through 5, as will be described below. Therefore, the position of the domain wall cannot be controlled between the position A and the position B.

Comparative Example 1

Figure 26:
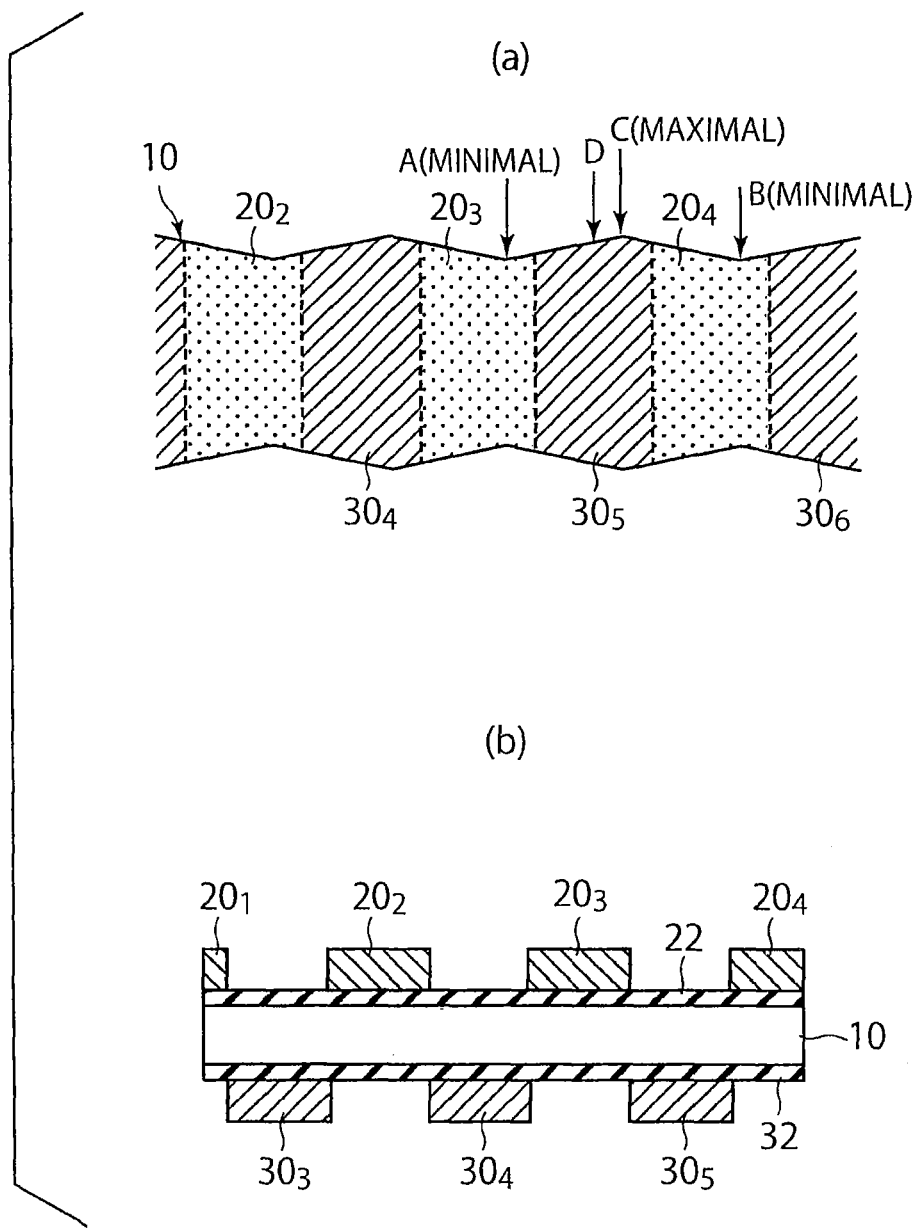
FIGS. 26(*a*) and 26(*b*) are diagrams showing a magnetic storage element of Comparative Example 1.

FIGS. 26(a) and 26(b) show the arrangement of the first and second electrodes of a magnetic storage element according to Comparative Example 1. FIGS. 26(a) and 26(b) are a top view and a cross-sectional view of the magnetic storage element according to Comparative Example 1. In Comparative Example 1, the first electrodes $20_i$ (i=1, ...) and the second electrodes $30_i$ (i=1, ...) are alternately arranged at least in the region from the minimal position A to the minimal position B. As shown in FIG. 26(a), there are substantially no regions where the first electrodes $20_i$ (i=1, ...) overlap the second electrodes $30_i$ (i=1, ...). As shown in FIG. 26(b), the magnetic nanowire 10 is connected to the first electrodes $20_i$ (i=1, ...) and the second electrodes $30_i$ (i=1, ...) via the insulating films 22 and 32. To move a domain wall from the position B to the position A in Comparative Example 1, a voltage is first applied to the second electrodes $30_i$ (i=1, ...) so that the magnetic anisotropy energy of the magnetic nanowire 10 becomes lower in the vicinities of the interfaces between the second electrodes $30_i$ (i=1, ...) and the magnetic nanowire 10. As for the domain wall position at this point, the energy is minimal in a position D that deviates from the maximal position C toward the minimal position A, and the domain wall can move to the minimal energy position D. When the application of the voltage to the second electrodes $30_i$ (i=1, ...) is stopped, the domain wall moves to the minimal position A in which the cross-sectional area of the magnetic nanowire 10 is minimal.

However, the domain wall cannot be moved from the position A to the position B. As described above, even if the magnetic anisotropy energy near the maximal position C is reduced by applying a voltage to the second electrodes $30_i$ (i=1, ...), the domain wall can be moved only to the minimal energy position D. This is because the magnetic anisotropy energy near the position A becomes also smaller even when the magnetic anisotropy energy near the position B is reduced by applying a voltage to the first electrodes $20_i$ (i=1, ...). If the second electrodes $30_i$ (i=1, ...) are arranged symmetrically with respect to the position C in Comparative Example 1, the moving direction can be controlled only in a stochastic manner.

As can be seen from Comparative Example 1, to move domain walls in a desired direction, it is necessary to form regions where the first electrodes $20_i$ (i=1, ...) overlap the second electrodes $30_i$ (i=1, ...) with the magnetic nanowire 10 existing in between, and/or regions where neither the first electrodes $20_i$ (i=1, ...) nor the second electrodes $30_i$ (i=1, ...) exist with the magnetic nanowire 10 existing in between.

Comparative Example 2

Figure 27:
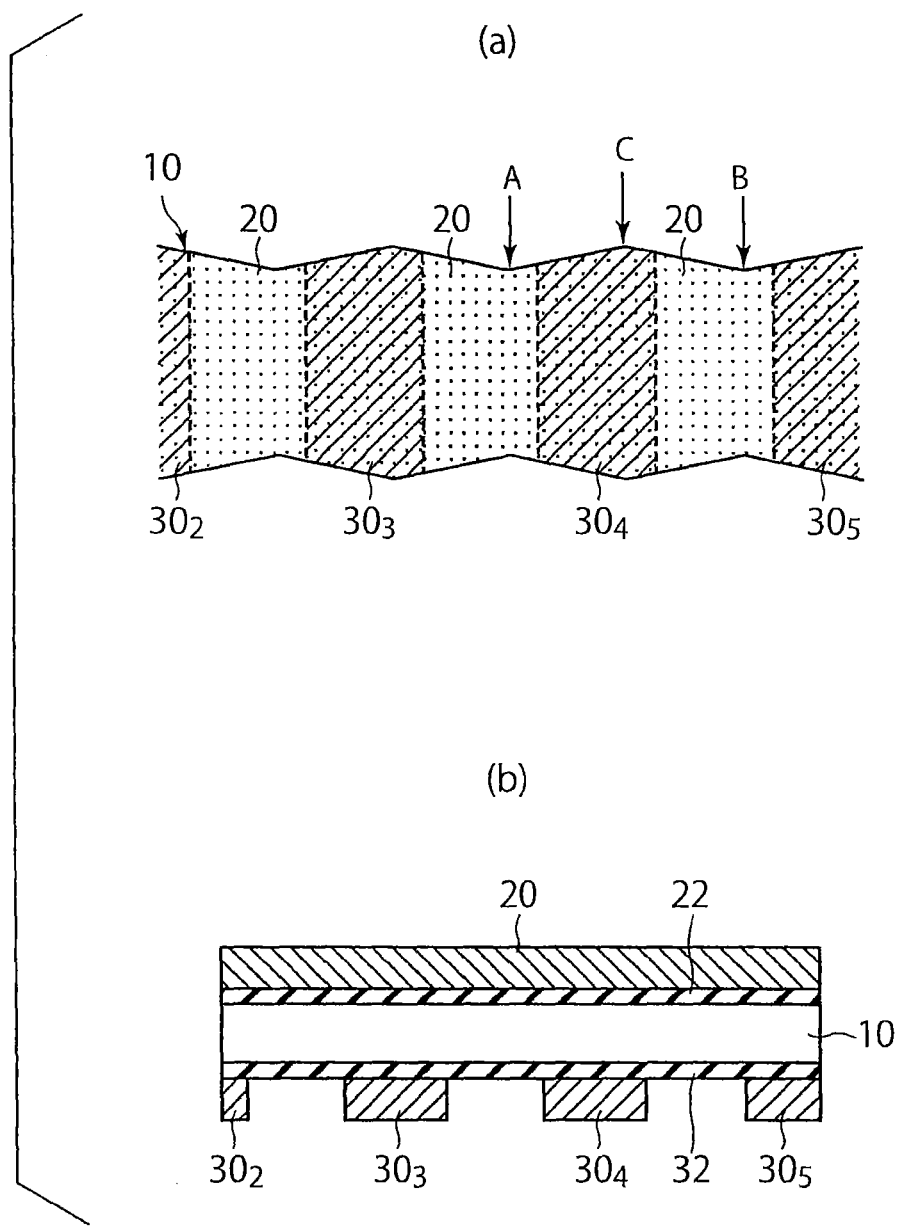
FIGS. 27(*a*) and 27(*b*) are diagrams showing a magnetic storage element of Comparative Example 2.

FIGS. 27(a) and 27(b) show the arrangement of the first and second electrodes of a magnetic storage element according to Comparative Example 2. FIGS. 27(a) and 27(b) are a top view and a cross-sectional view of the magnetic storage element according to Comparative Example 2. In Comparative Example 2, the magnetic nanowire 10 is connected to a single first electrode 20 via the insulating film 22 at least in the region from the minimal position A to the minimal position B. In Comparative Example 2, a domain wall can be moved from the position B to the position A, but cannot be moved from the position A to the position B, as in Comparative Example 1. If the second electrodes $30_i$ (i=1, ...) are arranged symmetrically with respect to the position C in Comparative Example 2, the moving direction can be controlled only in a stochastic manner.

In a case where the magnetic nanowire 10 is connected to a single second electrode 30 via the insulating film 32 at least in the region from the minimal position A to the minimal position B as in Comparative Example 2, domain walls cannot be moved bi-directionally either.

As can be seen from those examples, it is necessary to provide two or more first electrodes that are separated from one another, and two or more second electrodes that are separated from one another.

Comparative Example 3

Figure 28:
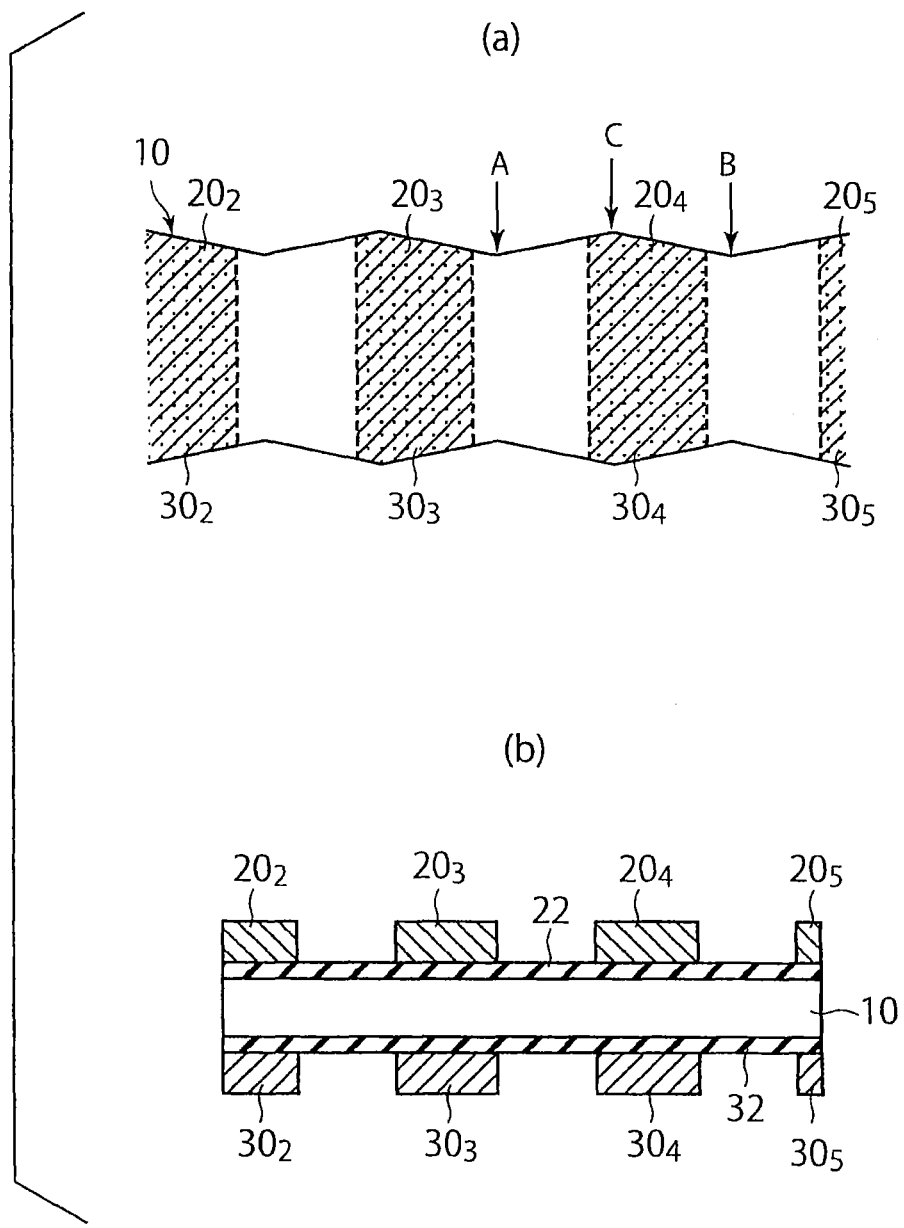
FIGS. 28(*a*) and 28(*b*) are diagrams showing a magnetic storage element of Comparative Example 3.

FIGS. 28(a) and 28(b) show the arrangement of the first and second electrodes of a magnetic storage element according to Comparative Example 3. FIGS. 28(a) and 28(b) are a top view and a cross-sectional view of the magnetic storage element according to Comparative Example 3. In Comparative Example 3, the first electrodes $20_i$ (i=1, ...) and the second electrodes $30_i$ (i=1, ...) have substantially the same size at least in the region from the minimal position A to the minimal position B. When seen from above, the first electrodes $20_i$ (i=1, ...) are located in the same positions as the second electrodes $30_i$ (i=1, ...). In Comparative Example 3, the domain wall moving direction is limited to one direction, as in Comparative Example 1. In Comparative Example 3, a domain wall position can be moved from the position A to the position B, but cannot be moved from the position B to the position A. If the first electrodes $20_i$ (i=1, . . . ) and the second electrodes $30_i$ (i=1, . . . ) are arranged symmetrically with respect to the position C in Comparative Example 3, the moving direction can be controlled only in a stochastic manner.

As can be seen from Comparative Example 3, to move domain walls in a desired direction, it is necessary to form third regions where the first electrodes exist but no second electrodes exist with the magnetic nanowire 10 existing in between, and/or fourth regions where no first electrodes exist but the second electrodes exist with the magnetic nanowire 10 existing in between.

(Materials)

Next, the material of the magnetic nanowire 10 of a magnetic storage element 1 according to the first embodiment or any of Examples 1 through 5 is described. For the magnetic nanowire 10, various kinds of magnetic materials that can have a magnetization direction perpendicular to the stacking direction of the magnetic nanowire 10 can be used.

In a case where magnetization is oriented in a direction (the short axis) perpendicular to the extending direction (the first direction) of the magnetic nanowire 10, the demagnetizing field is normally larger than that in a case where magnetization is oriented in the extending direction of the magnetic nanowire 10. Therefore, to have magnetization oriented in a direction perpendicular to the extending direction of the magnetic nanowire 10, a magnetic anisotropy energy $K_u$ that is large enough to overcome the demagnetizing field is required. Therefore, it is preferable to use a material having a large magnetic anisotropy energy $K_u$.

Examples of materials having a large uniaxial magnetic anisotropy energy $K_u$ include an alloy formed by combining at least one element selected from the group consisting of iron (Fe), cobalt (Co), nickel (Ni), manganese (Mn), and chromium (Cr), with at least one element selected from the group consisting of platinum (Pt), palladium (Pd), iridium (Ir), ruthenium (Ru), and rhodium (Rh). The value of the uniaxial magnetic anisotropy energy can be adjusted by controlling the composition of the magnetic material forming the magnetic film, the crystalline order in a heat treatment, or the like.

It is also possible to use a magnetic material that has an hcp (hexagonal close-packed) structure as a crystalline structure and exhibits a perpendicular magnetic anisotropy energy. A typical example of such a magnetic material is a material that contains a metal having cobalt (Co) as its principal component, but some other metal having an hcp structure can be used instead.

In a case where the first direction of the magnetic nanowire 10 is a direction perpendicular to the film growth direction, the easy axis of the magnetic anisotropy energy needs to exist in the film plane so as to have a magnetization direction perpendicular to the magnetic nanowire 10. Examples of materials that exhibit a large magnetic anisotropy energy and have the easy axis of the magnetic anisotropy energy in the film plane include Co, CoPt, and CoCrPt. CoPt and CoCrPt may be alloys. Those materials are metallic crystals that have the c-axis of the hcp structure in the film plane. Furthermore, an additional element may be added to any of the above mentioned materials.

In a case where the first direction of the magnetic nanowire 10 is a direction parallel to the film growth direction, the easy axis of the magnetic anisotropy energy needs to be in a direction perpendicular to the film plane. Examples of materials that realize these aspects include Co and CoPt, which have the c-axis of the hcp structure in a direction perpendicular to the film plane, FePt, a film stack of Co/Ni, and TbFe. CoPt may be an alloy. In the case of TbFe, TbFe exhibits perpendicular anisotropy if Tb is not less than 20 atomic % and not more than 40 atomic %. Furthermore, an additional element may be added any of the above mentioned materials.

It is also possible to use a material that is an alloy of a rare-earth element and an iron-group transition element, and exhibits magnetic anisotropy perpendicular to the extending direction of the magnetic nanowire 10. Specific examples of such materials include GdFe, GdCo, GdFeCo, TbFe, TbCo, TbFeCo, GdTbFe, GdTbCo, DyFe, DyCo, and DyFeCo.

The magnetic properties of those magnetic materials that can be used as a magnetic film can be adjusted by adding a nonmagnetic element such as Ag, Cu, Au, Al, Mg, Si, Bi, Ta, B, C, O, N, Pd, Pt, Zr, Ir, W, Mo, Nb, or H. Other than that, various kinds of physical properties such as crystalline properties, mechanical properties, and chemical properties can be adjusted.

The same material as the magnetic nanowire 10 can be used as the material of the ferromagnetic layers 422 and 442 of the write unit 42 and the read unit 44.

The material of the nonmagnetic layers 421 and 441 of the write unit 42 and the read unit 44 may be a nonmagnetic metal or an insulating thin film. The nonmagnetic metal may be Au, Cu, Cr, Zn, Ga, Nb, Mo, Ru, Pd, Ag, Hf, Ta, W, Pt, or Bi. Alternatively, the nonmagnetic metal may be an alloy containing one or more of those elements. The thickness of each of the nonmagnetic layers 421 and 441 should be such that the magnetostatic coupling between the magnetic nanowire 10 and the ferromagnetic layers 422 and 442 is reasonably weak, and be smaller than the spin diffusion length of each of the nonmagnetic layers 421 and 441. Specifically, the thickness of each of the nonmagnetic layers 421 and 441 is preferably in the range of 0.2 nm to 20 nm.

To efficiently achieve a large magnetoresistive effect by virtue of an insulating material that can be used as the nonmagnetic layers 421 and 441, the nonmagnetic layers 421 and 441 made of an insulating material should be made to function as tunnel barrier layers. In this case, examples of materials that can be used as the material of the nonmagnetic layers 421 and 441 include $Al_2O_3$, $SiO_2$, MgO, AlN, $Bi_2O_3$, $MgF_2$, $CaF_2$, $SrTiO_3$, $AlLaO_3$, Al—N—O, Si—N—O, nonmagnetic semiconductors (ZnO, InMn, GaN, GaAs, $TiO_2$, Zn, Te, or those materials doped with a transition metal), and the like. Those compounds do not need to be completely accurate compositions in terms of stoichiometry, and there may be a defect, an excess, or a deficiency in oxygen, nitrogen, fluorine, or the like. The thickness of each of the nonmagnetic layers 421 and 441 made of such an insulating material is preferably in the range of 0.2 nm to 5 nm. In a case where the nonmagnetic layers 421 and 441 are insulating layers, pinholes may exist therein.

(Manufacturing Method)

Figure 29:
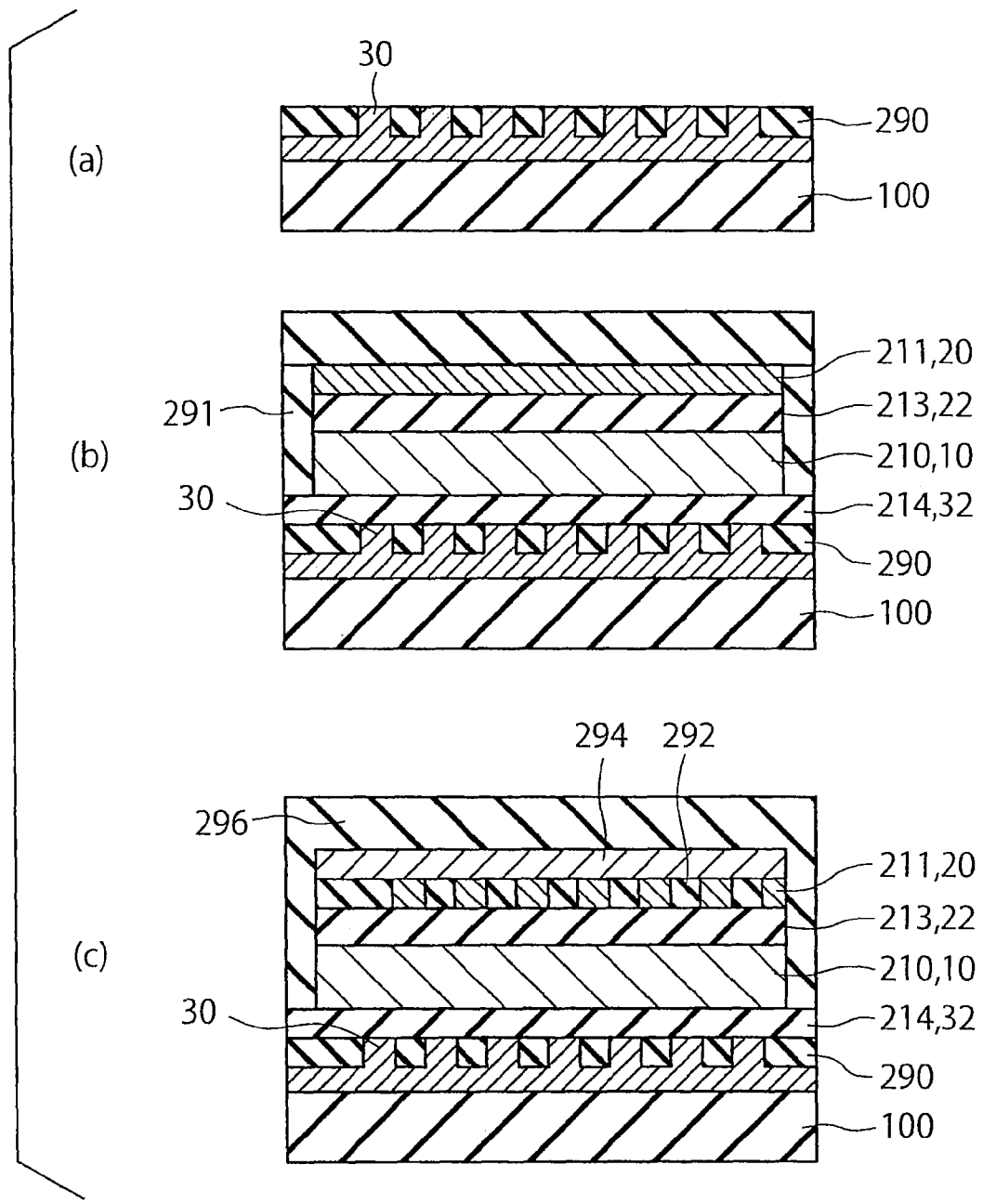
FIGS. 29(*a*) through 29(*c*) are cross-sectional views illustrating a method of manufacturing the magnetic storage element of the first embodiment.

Referring now to FIGS. 29(a) through 29(c), a method of manufacturing the magnetic storage element 1 according to the first embodiment is described. The magnetic storage element 1 is manufactured by a film forming technique and a fine processing technique. A specific example of the process of manufacturing the magnetic storage element 1 is as follows. For ease of explanation, the read unit and the write unit will not be described.

First, as shown in FIG. 29(a), a wafer (not shown) having an insulating film 100 formed on the upper surface thereof is prepared. An electrode film is formed on the insulating film 100, and patterning is performed to shape the electrode film into the planar forms of the second electrodes 30 by a lithography technique and RIE (Reactive Ion Etching). As a result, the second electrodes 30 arranged at predetermined intervals are formed. At this point, the etching does not reach the bottom, so that the second electrodes 30 are short-circuited at the bottom. After an interlayer insulating film 290 is deposited, the interlayer insulating film 290 is planarized by CMP (Chemical Mechanical Polishing), to expose the upper surfaces of the second electrodes 30 (FIG. 29(a)).

An insulating film 214, a magnetic film 210, an insulating film 213, and an electrode film 211 are then formed in this order. The magnetic film 210 is to turn into the magnetic nanowire 10. The material of the insulating film 213 and the insulating film 214 is MgO, for example, and are to turn into the insulating film 22 and the insulating film 32, respectively. The electrode film 211 is made of Ta, for example, and is to turn into the first electrodes 20. The wafer having those films stacked thereon is put into a vacuum furnace in a magnetic field, and is annealed in the magnetic field at 270° C. for 10 hours. As a result, the magnetic film 10 gains unidirectional anisotropy. After that, patterning is performed to shape the electrode film 211, the insulating film 213, and the magnetic film 210 into the planar form of the magnetic nanowire 10 by a lithography technique and RIE. An interlayer insulating film 291 is then deposited (FIG. 29(b)).

The interlayer insulating film 291 is then planarized, to expose the upper surface of the electrode film 211. Patterning is then performed to shape the electrode film 211 into the planar forms of the first electrodes 20 by a lithography technique and RIE. As a result, the first electrodes 20 arranged at predetermined intervals are formed. After an interlayer insulating film 292 is deposited, the interlayer insulating film 292 is planarized, to expose the upper surfaces of the first electrodes 20. A metal film is then formed to cover the exposed upper surfaces of the first electrodes 20, and patterning is performed on the metal film, to form an wiring layer 294. With this wiring layer 294, the first electrodes 20 are short-circuited at the top portion. Lastly, an insulating film 296 is deposited, to complete the magnetic storage element 1 (FIG. 29(c)).

As described above, the first embodiment can provide a magnetic storage element that is capable of moving the domain walls in the magnetic nanowire in a stable manner by applying voltages to the first and second electrodes that are arranged so as to interpose the magnetic nanowire in between.

Second Embodiment

Figure 30:
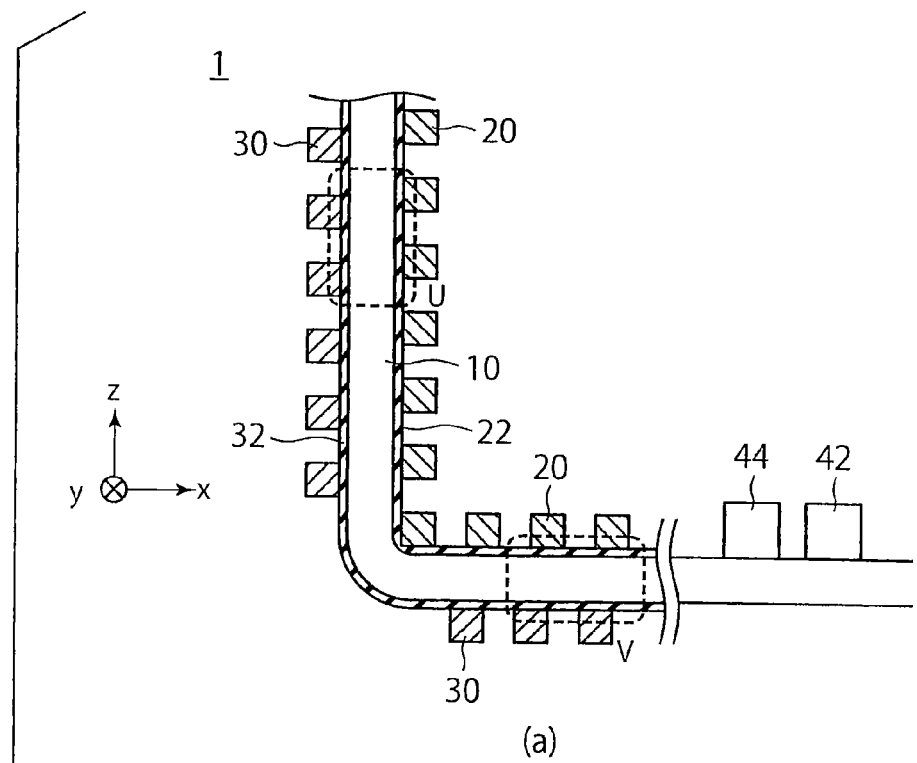
FIGS. 30(*a*) through 30(*c*) are diagrams showing a magnetic storage element of a second embodiment.
Figure 30:
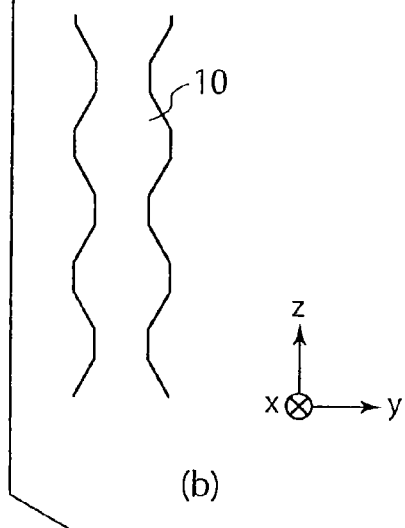
Figure 30:
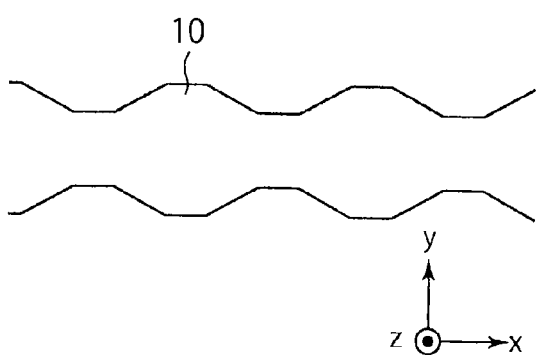

Referring now to FIGS. 30(a) through 30(c), a magnetic storage element 1 according to a second embodiment is described. FIG. 30(a) is a cross-sectional view of the magnetic storage element 1 of the second embodiment, taken along a plane perpendicular of the substrate thereof. FIGS. 30(b) and 30(c) are a side view of a portion U surrounded by a dashed line in FIG. 30(a), and a top view of a portion V surrounded by a dashed line in FIG. 30(a).

In the magnetic storage element 1 of the second embodiment, a first direction that extends over the entire region of a magnetic nanowire 10 is not parallel to a straight line, but there is a spot where the first direction bends. For example, the magnetic storage element 1 includes a portion in which the first direction is perpendicular to the substrate surface, and a portion in which the first direction is parallel to the substrate surface. A cross-section of the portion in which the first direction is perpendicular to the substrate surface is shown in FIG. 30(a). This cross-section is parallel to the width direction. A cross-section of the portion in which the first direction is parallel to the substrate surface is shown in FIG. 30(a). This cross-section is parallel to the thickness direction. FIG. 30(b) shows a surface parallel to the width direction of the portion in which the first direction is parallel to the substrate surface.

The shape of the magnetic nanowire 10 in the magnetic storage element 1 of the second embodiment is the same as the shape described in the first embodiment.

In the magnetic storage element 1 of the second embodiment, the equilibrium positions of the domain walls are determined by the cross-sectional shape and the minimal points in the energy distribution depending on the cross-sectional shape. Therefore, the portion in which the first direction is perpendicular to the substrate surface does not need to have the same cross-sectional shape and the same size as the portion in which the first direction is parallel to the substrate surface. Also, in the portion in which the first direction is perpendicular to the substrate surface, first electrodes 20 and second electrodes 30 do not need to be arranged at the same intervals as those in the portion in which the first direction is parallel to the substrate surface. An insulating film 22 is provided between the first electrodes 20 and the magnetic nanowire 10, and an insulating film 32 is provided between the second electrodes 30 and the magnetic nanowire 10.

Like the first embodiment, the second embodiment can provide a magnetic storage element that is capable of moving the domain walls in the magnetic nanowire in a stable manner.

Third Embodiment

Figure 31:
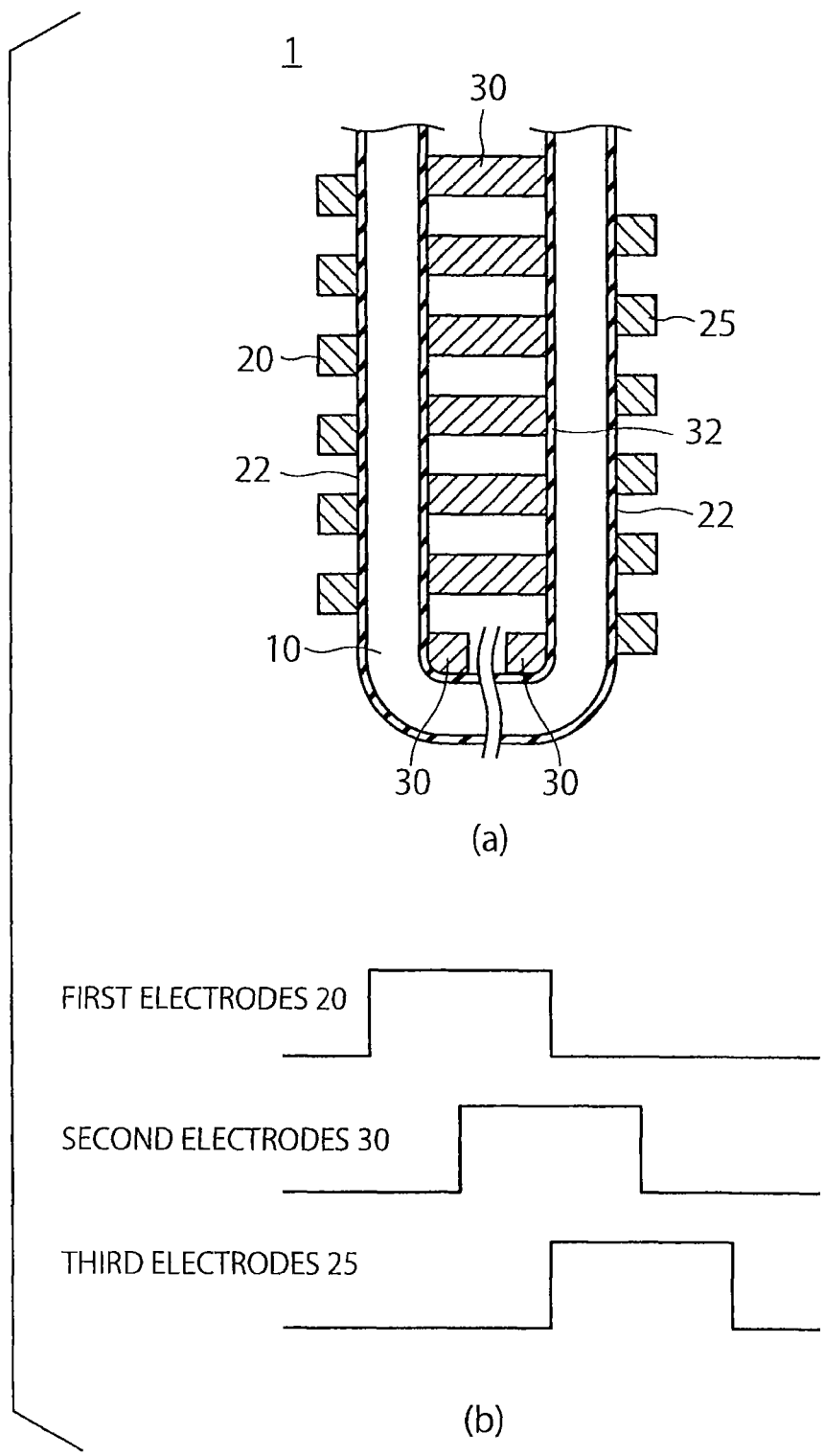
FIGS. 31(*a*) and 31(*b*) are diagrams showing a magnetic storage element of a third embodiment.

Referring now to FIGS. 31(a) and 31(b), a magnetic storage element 1 according to a third embodiment is described. FIG. 31(a) is a cross-sectional view of the magnetic storage element 1 of the third embodiment, taken along a plane perpendicular to the substrate thereof. FIG. 31(b) is a timing chart of the driving voltages for driving the magnetic storage element 1 of the third embodiment.

The magnetic storage element 1 of the third embodiment has a structure in which the respective magnetic nanowires 10 of two magnetic storage elements 1 of the second embodiments are connected at the bottom portion, and the two magnetic storage elements 1 share second electrodes 30. The first electrodes 20 of one of the two magnetic storage elements 1 remain the first elements 20, but the first electrodes of the other one of the two magnetic storage elements 1 serve as third electrodes 25. The first electrodes 20 are located in the same positions as the third electrodes 25 in a direction perpendicular to the substrate.

As the two magnetic storage elements 1 share the second electrodes, integration becomes easier. To move the domain walls in the magnetic nanowires 10 in one direction, the voltage signal sequence to be applied to the first electrodes 20 and the third electrodes 25 are temporally shifted.

Modification

Figure 32:
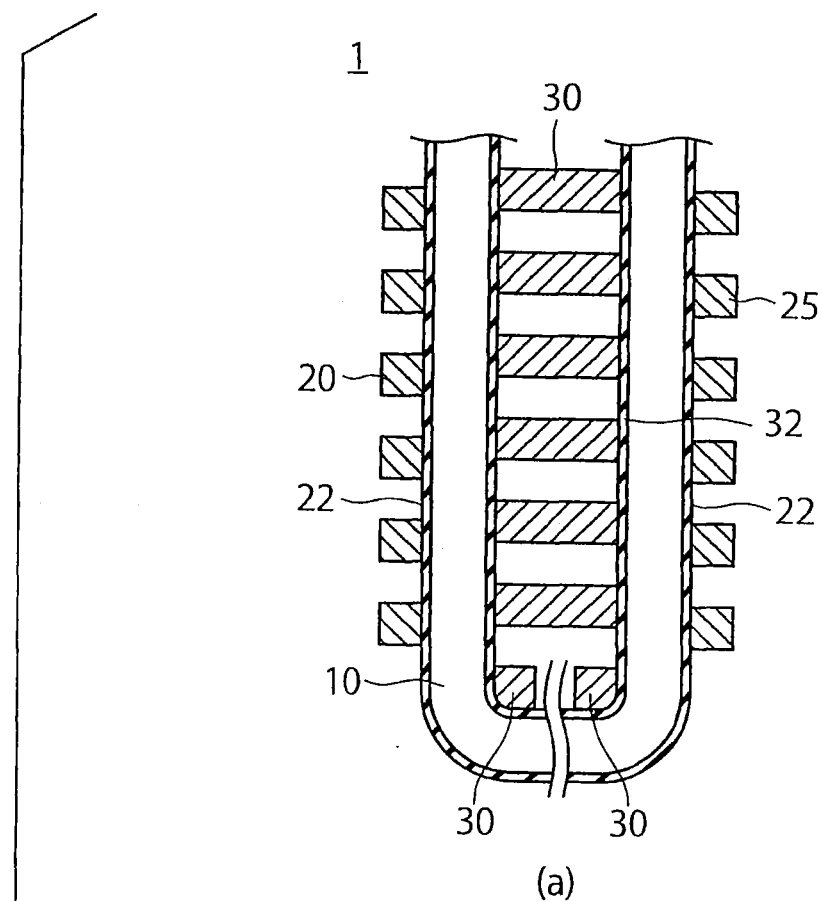
FIGS. 32(*a*) and 32(*b*) are diagrams showing a magnetic storage element according to a modification of the third embodiment.
Figure 32:
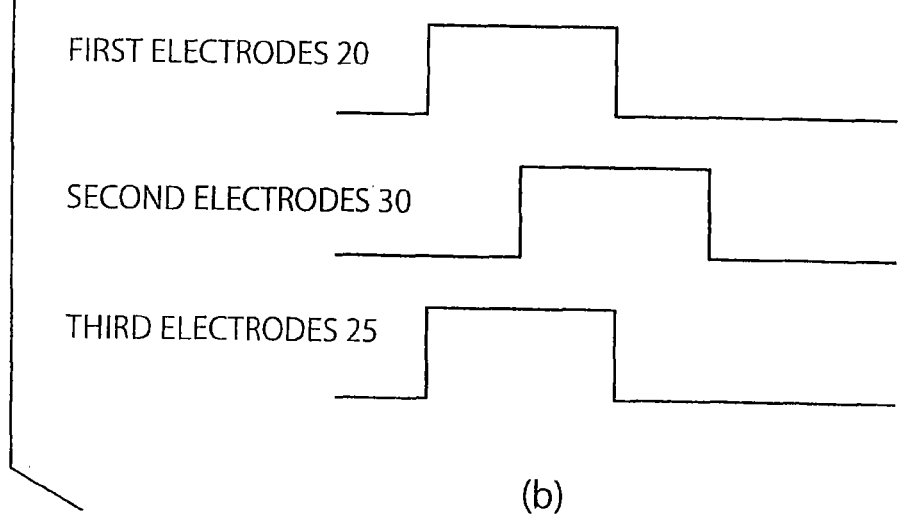

Referring now to FIGS. 32(a) and 32(b), a magnetic storage element 1 according to a modification of the third embodiment is described. FIG. 32(a) is a cross-sectional view of the magnetic storage element 1 according to the modification of the third embodiment, taken along a plane perpendicular to the substrate thereof. FIG. 32(b) is a timing chart of the driving voltages for driving the magnetic storage element 1 according to the modification of the third embodiment.

In the magnetic storage element 1 of this modification, the first electrodes 20 are located in different positions from the third electrodes 25 in a direction perpendicular to the substrate. That is, the positions of the first electrodes 20 differ from the positions of the third electrodes 25 in the first direction. In this case, the domain walls can be moved in one direction of the magnetic nanowire 10, even if the same voltage signal is applied to the first electrodes 20 and the third electrodes 25.

Fourth Embodiment

Figure 33:
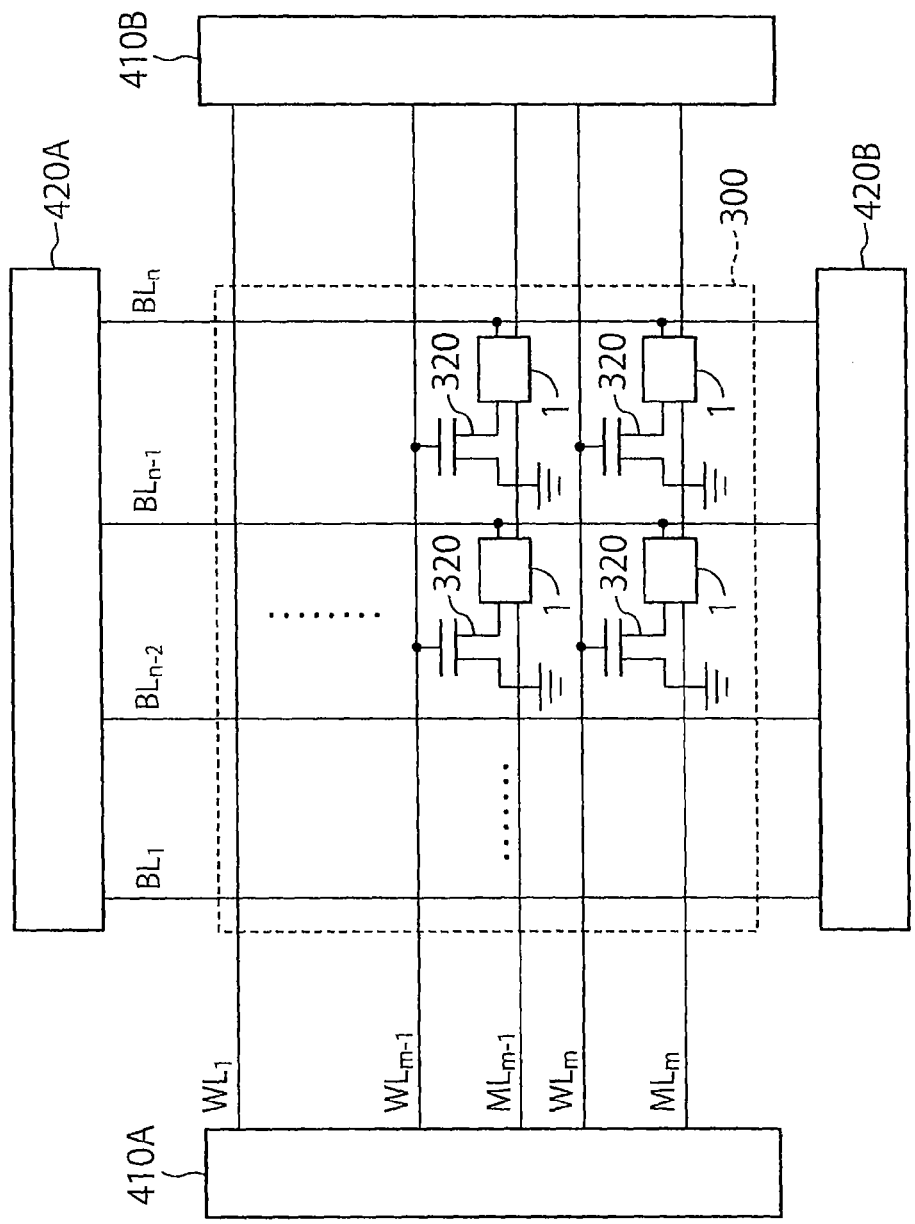
FIG. 33 is a circuit diagram showing a magnetic storage device according to a fourth embodiment.
Figure 34:
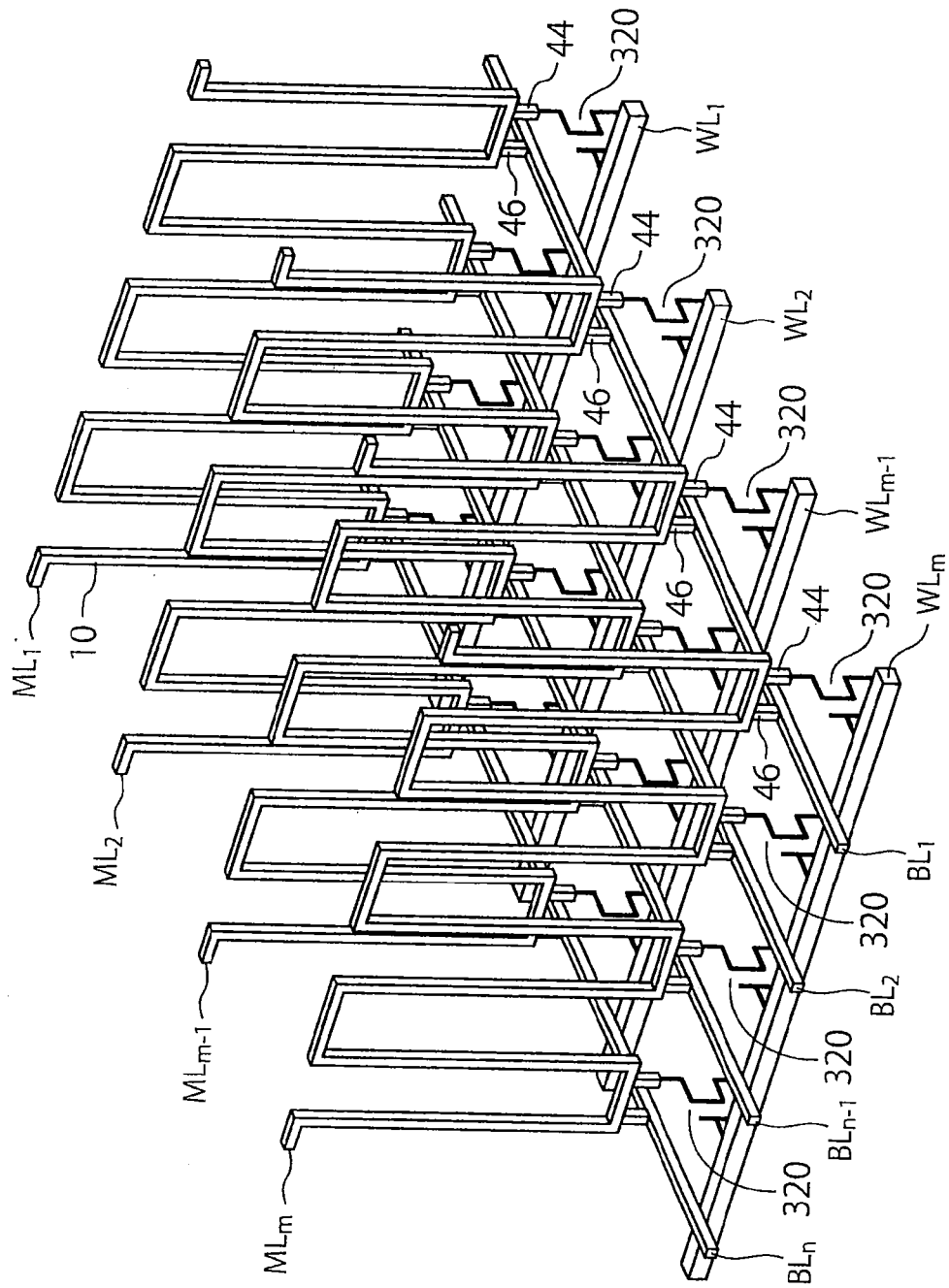
FIG. 34 is a perspective view of the memory cell array of the magnetic storage device according to the fourth embodiment.

Referring now to FIGS. 33 and 34, a magnetic storage device according to a fourth embodiment is described. FIG. 33 is a circuit diagram showing the magnetic storage device of the fourth embodiment, and FIG. 34 is a perspective view of the magnetic storage device. However, first electrodes and second electrodes are not shown in these drawings.

The magnetic storage device 500 of the fourth embodiment has a memory cell array 300. The memory cell array 300 includes memory cells that are arranged in a matrix fashion. Each of the memory cells includes a magnetic storage element 1 of one of the first through third embodiments and a switching element 320 formed with a transistor. The memory cell array 300 also includes word lines $WL_1$ through $WL_m$ provided for respective rows, and information reading bit lines $BL_1$ through $BL_n$ provided for respective columns.

The magnetic nanowires 10 of the magnetic storage elements 1 of the n memory cells in the i-th row ($1 \leq i \leq m$) are connected to one another, and form a magnetic nanowire $ML_i$. The magnetic nanowires 10 of the respective magnetic storage elements 1 may not be connected directly to one another. The switching elements 320 of the respective memory cells are connected to the word line $WL_i$ ($1 \leq i \leq m$) to which the gates correspond. One end of the switching element 320 of each of the memory cells is connected to one end of the read unit 44 of the magnetic storage element 1 in the same memory cell, and the other end of the switching element 320 is grounded. The other end of the read unit 44 of the magnetic storage element 1 in the memory cell is connected to the bit line $BL_j$ ($1 \leq j \leq n$) corresponding to the memory cell.

The word lines $WL_1$ through $WL_m$ and the magnetic nanowires $ML_1$ through $ML_m$ are connected to drive circuits 410A and 410B including a decoder that selects each wiring, a write circuit, and the like. The bit lines $BL_1$ through $BL_n$ are connected to drive circuits 420A and 420B including a decoder that selects each wiring, a read circuit, and the like. In FIGS. 33 and 34, the write units of the magnetic storage elements 1 are not shown. One end of each write unit is connected to a write select switching element (not shown), and the other end is connected to a current source (not shown). The write switching element may also serve as a read switching element. One read unit and one write unit may be provided for more than one memory cell. In such a case, a higher degree of integration can be achieved. In a case where one read unit 44 and one write unit are provided in each memory cell as shown in FIGS. 33 and 34, a higher data transfer rate can be achieved. Also, electrodes for voltage application extend in the column direction. These electrodes are collectively referred to as voltage application electrodes. Different voltage signals are supplied between the electrodes in the odd-numbered columns and the electrodes in the even-numbered columns. Specifically, three kinds of voltage sequences can be used as described in the third embodiment. Alternatively, four or more kinds of voltage sequences can be used.

Next, domain wall movement in the memory cell array 300 according to the fourth embodiment is described. Voltages are applied to the voltage application electrodes by drive circuits 410A, 410B, 420A, and 420B in accordance with a predetermined sequence, and the domain walls in the magnetic nanowire are moved by the above described procedures (data shift movement).

By a method of moving domain walls in the memory array in the above manner, data storage positions concurrently move in the magnetic storage elements 1 belonging to the same column in the memory cell array 300. As one voltage application electrode is shared with other magnetic storage elements, data movement can be collectively performed with a common voltage source, and a higher degree of integration is readily achieved.

Writing in a memory cell is performed after the data stored in the magnetic nanowire is moved by a necessary amount by the above described method.

To read data stored in a memory cell, data shift movement is performed by the above described method so that the bit to be read among the bit strings stored as magnetization directions in the memory cells comes to the position of the read unit. After that, the corresponding word line WL is selected, and the switching element 320 is turned on. A current is then applied to the bit line BL, and reading is performed. The read current may be positive or negative, but has a smaller absolute value than the absolute value of the write current. This is to prevent the stored data from being reversed by the reading.

In the fourth embodiment, magnetic storage elements according to one of the first through third embodiments are used. Accordingly, a magnetic storage device that is capable of moving the domain walls in a magnetic material in a stable manner can be provided.

Fifth Embodiment

Figure 35:
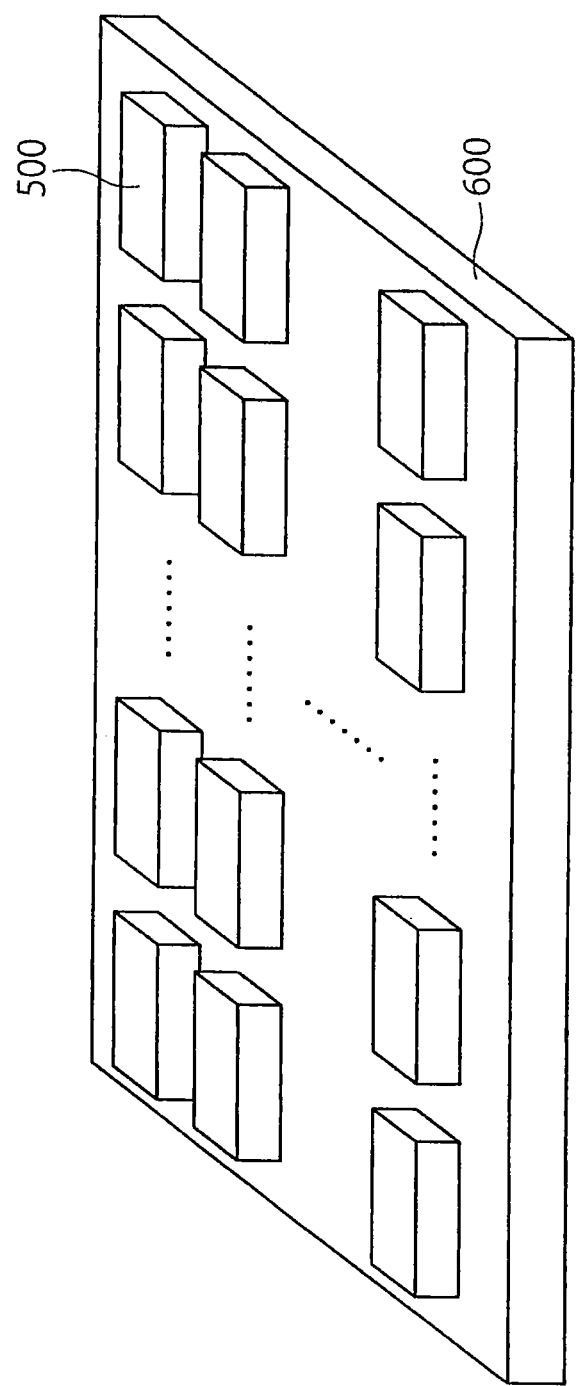
FIG. 35 is a perspective view of a magnetic memory according to a fifth embodiment.

FIG. 35 shows a magnetic memory according to a fifth embodiment. The magnetic memory of the fifth embodiment has a structure in which magnetic storage devices 500 of the fourth embodiment are arranged in a matrix fashion on a substrate 600. With this structure, a large-capacity magnetic memory can be realized.

In the fifth embodiment, magnetic storage elements of one of the first through third embodiments are used. Accordingly, a magnetic memory that is capable of moving the domain walls in a magnetic material in a stable manner can be provided.

The word lines WL, the information reading bit lines BL, the switching elements 320 of the memory track, and the drive circuits 410A, 410B, 420A, and 420B are merely examples, and the positions, the shapes, and the structures thereof may be modified as appropriate.

The embodiments of the present invention have been described so far with reference to specific examples. However, the present invention is not limited to those embodiments. For example, all modifications are contained in the scope of the invention as long as the present invention can be carried out by a person skilled in the art appropriately selecting a specific size relationship and materials of the respective components forming the magnetic storage elements, and shapes and materials of electrode, passivation, and insulating structures of the known arts. For example, the magnetic layers that form magnetic elements do not necessarily have the same shape and the same size, but may be designed to have different shapes and sizes from one another. Each of the components in a magnetic storage element, such as an antiferromagnetic layer, an intermediate layer, and an insulating layer, may be formed as a single layer, or may be formed with stacked layers. The modification described in one embodiment may be applied to the other embodiments, or modifications may be combined.

Throughout the specification, "being perpendicular" includes deviation from strict perpendicularity due to variations or the like caused during the manufacturing stage. Likewise, throughout the specification, "being parallel" and "being horizontal" do not mean strict parallelism or strictly horizontal characteristics.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetic storage element comprising:
a magnetic nanowire extending in a first direction, a cross-sectional area of the magnetic nanowire varying in the first direction, the cross-sectional area being perpendicular to the first direction, the magnetic nanowire having at least two positions where the cross-sectional area is minimal;
first and second electrode groups having the magnetic nanowire interposed in between, the first electrode group including a plurality of first electrodes arranged at intervals in the first direction, the second electrode group including a plurality of second electrodes arranged at intervals in the first direction, the magnetic nanowire including at least one of a first region where the first electrodes overlap the second electrodes with the magnetic nanowire interposed in between and a second region where neither the first electrodes nor the second electrodes exist with the magnetic nanowire interposed in between, the magnetic nanowire including at least one of a third region where the first electrodes exist and the second electrodes do not exist with the magnetic nanowire interposed in between and a fourth region where the first electrodes do not exist and the second electrodes exist with the magnetic nanowire interposed in between;
a first insulating film located between the first electrodes and the magnetic nanowire; and
a second insulating film located between the second electrodes and the magnetic nanowire.

2. The element according to claim 1, wherein
the magnetic nanowire includes the first region, and
the cross-sectional area is maximal in the first region.

3. The element according to claim 1, wherein
the magnetic nanowire includes the first region, and
the cross-sectional area is minimal in the first region.

4. The element according to claim 1, wherein
each of the first electrodes is connected to a first driving unit, the first driving unit generating a common first driving voltage, and
each of the second electrodes is connected to a second driving unit, the second driving unit generating a common second driving voltage.

5. The element according to claim 1, further comprising:
a read unit configured to read magnetization information from the magnetic nanowire; and
a write unit configured to write magnetization information into the magnetic nanowire.

6. The element according to claim 1, wherein
the magnetic nanowire includes a first portion extending in the first direction and a second portion connected to the first portion, the second portion extending in a second direction, the second direction being different from the first direction, and
the first and second electrode groups are located in the first and second portions, respectively.

7. The element according to claim 1, wherein
the magnetic nanowire includes a first portion extending in the first direction, a second portion having one end connected to the first portion, and a third portion connected to the other end of the second portion, the second portion extending in a second direction, the second direction being different from the first direction, the third portion extending in a third direction, the third direction being parallel to the first direction,
the first and second electrode groups are arranged in the first and third directions in the first and third portions, respectively, and
the second electrode group is a common second electrode group shared between the first portion and the third portion.

8. The element according to claim 7, wherein the first electrode group in the first portion is located in the same positions as the first electrode group in the third portion in the first direction.

9. The element according to claim 7, wherein the first electrode group in the first portion is arranged in different positions from the first electrode group in the third portion in the first direction.

10. The element according to claim 1, wherein
a cross-section of the magnetic nanowire has first and second visible outlines, the cross-section being taken along a plane determined by the first direction and a second direction perpendicular to the first direction,
the first visible outline includes a first minimal point where a distance from a virtual straight line parallel to the first direction in the magnetic nanowire is minimal, a second minimal point where the distance from the virtual straight line is minimal, and a first maximal point where the distance from the virtual straight line is maximal, the second minimal point being different from the first minimal point, the first maximal point being located between the first minimal point and the second minimal point, and
an angle between a first straight line and one of a second straight line and a third straight line is not smaller than four degrees and not larger than 30 degrees, the first straight line connecting the first minimal point and the second minimal point, the second straight line connecting the first minimal point and the first maximal point, the third straight line connecting the second minimal point and the first maximal point.

11. The element according to claim 1, wherein each of the first and second electrodes is 21 nm or smaller in size in the first direction.

12. A magnetic storage device comprising:
a plurality of magnetic storage elements of claim 1, the magnetic storage elements being arranged in a matrix fashion;
a plurality of switching transistors corresponding to the respective magnetic storage elements, each of the switching transistors having one of a source and a drain thereof connected to one end of a read unit in the corresponding magnetic storage element of a corresponding column;
a plurality of first wirings provided for respective rows, each of the first wirings being connected to a gate of the corresponding switching transistor of a corresponding row; and
a plurality of second wirings provided for respective columns, each of the second wirings being connected to the other end of the read unit in the corresponding magnetic storage element of the corresponding column.

13. A magnetic memory comprising
a plurality of magnetic storage devices of claim 12, the magnetic storage devices being arranged in a matrix arrangement.

14. A method of driving the magnetic storage element of claim 1, the method comprising:
applying a first driving voltage to the first electrode group; and
applying a second driving voltage to the second electrode group.

15. The method according to claim 14, wherein a time for applying the first driving voltage partially overlaps a time for applying the second driving voltage.

* * * * *